(12) United States Patent
Takaki et al.

(10) Patent No.: US 10,545,198 B2
(45) Date of Patent: Jan. 28, 2020

(54) MAGNETIC SENSOR, MANUFACTURING METHOD THEREOF, AND CURRENT DETECTOR USING THE SAME

(71) Applicant: HITACHI METALS, LTD., Tokyo (JP)

(72) Inventors: Yasunori Takaki, Mishima-gun (JP); Yasunori Abe, Mishima-gun (JP); Makoto Kawakami, Mishima-gun (JP)

(73) Assignee: HITACHI METALS, LTD., Tokyo (JP)

( * ) Notice: Subject to any disclaimer, the term of this patent is extended or adjusted under 35 U.S.C. 154(b) by 328 days.

(21) Appl. No.: 15/527,474

(22) PCT Filed: Nov. 18, 2015

(86) PCT No.: PCT/JP2015/082468
§ 371 (c)(1),
(2) Date: May 17, 2017

(87) PCT Pub. No.: WO2016/080470
PCT Pub. Date: May 26, 2016

(65) Prior Publication Data
US 2018/0335483 A1    Nov. 22, 2018

(30) Foreign Application Priority Data
Nov. 18, 2014  (JP) ................. 2014-233818

(51) Int. Cl.
*G01R 33/06*    (2006.01)

(52) U.S. Cl.
CPC .................... *G01R 33/06* (2013.01)

(58) Field of Classification Search
None
See application file for complete search history.

(56) References Cited

U.S. PATENT DOCUMENTS 8,326,222 B2 * 12/2012 Haratani ............. H04B 5/0081
                                                    250/551
2005/0185346 A1    8/2005 Shoji
(Continued)

FOREIGN PATENT DOCUMENTS

CN        103033666 A      4/2013
JP       2002-107384 A      4/2002
(Continued)

OTHER PUBLICATIONS

Communication dated Jan. 21, 2019 issued by the China National Intellectual Property Administration in counterpart application No. 201580062396.5.
(Continued)

*Primary Examiner* — Douglas X Rodriguez
(74) *Attorney, Agent, or Firm* — Sughrue Mion, PLLC

(57) ABSTRACT

A magnetic sensor including: a substrate with a main surface; at least two magnetoresistive effect elements formed on the main surface and connected to a power terminal of a bridge circuit; at least two magnetoresistive effect elements formed on the main surface and connected to a ground terminal of the bridge circuit; a first region in which one of the at least two magnetoresistive effect elements connected to the power terminal and one of the at least two magnetoresistive effect elements connected to the ground terminal are disposed; a second region in which another of the at least two magnetoresistive effect elements connected to the power terminal and another of the at least two magnetoresistive effect elements connected to the ground terminal are disposed; and a bias coil including a first bias application part for applying a bias magnetic field to the first region and a second bias application part for applying a bias magnetic field to the second region. Magnetosensitive directions of the two magnetoresistive effect elements connected to the power terminal are the same, magnetosensitive directions of
(Continued)

the two magnetoresistive effect elements connected to the ground terminal are the same, and a difference between a cross-sectional area of the first bias application part and a cross-sectional area of the second bias application part is 35.4% or less.

18 Claims, 33 Drawing Sheets

(56) References Cited

U.S. PATENT DOCUMENTS

| | | | | |
|---|---|---|---|---|
| 2011/0204889 | A1* | 8/2011 | Nomura | G01R 1/203 324/252 |
| 2011/0227560 | A1* | 9/2011 | Haratani | B82Y 25/00 324/117 R |
| 2013/0082698 | A1 | 4/2013 | Fukui | |
| 2016/0131687 | A1* | 5/2016 | Higashi | G01R 15/205 324/98 |
| 2016/0274196 | A1 | 9/2016 | Takaki et al. | |

FOREIGN PATENT DOCUMENTS

| | | |
|---|---|---|
| JP | 2005-236134 A | 9/2005 |
| JP | 2007-212306 A | 8/2007 |
| WO | 2012/117784 A1 | 9/2012 |
| WO | 2014/148437 A1 | 9/2014 |

OTHER PUBLICATIONS

International Preliminary Report on Patentability issued from the International Bureau in counterpart International Application No. PCT/JP2015/082468, dated Jun. 1, 2017.

International Search Report of PCT/JP2015/082468 dated Feb. 16, 2016.

* cited by examiner

Fig.19A

| | |
|---|---|
| PROTECTIVE FILM | (2μm) |
| SOFT MAGNETIC YOKE FILM | (0.4μm) |
| INSULATING FILM | (1.3μm) |
| BIAS COIL | (0.8μm) ~3 |
| INSULATING FILM | (1.3μm) |
| FEEDBACK COIL | (0.8μm) |
| INSULATING FILM | (1.3μm) |
| FEEDBACK COIL | (0.8μm) |
| INSULATING FILM | (1.3μm) |
| LEAD | |
| INSULATING FILM | (0.2μm) |
| MAGNETORESISTIVE EFFECT ELEMENT LAYER | ~10 |
| Si SUBSTRATE | ~2 |

| | |
|---|---|
| PROTECTIVE FILM | (2μm) |
| SOFT MAGNETIC YOKE FILM | (0.4μm) |
| INSULATING FILM | (1.3μm) |
| FEEDBACK COIL | (0.8μm) |
| INSULATING FILM | (1.3μm) |
| BIAS COIL | (0.8μm) ~3 |
| INSULATING FILM | (1.3μm) |
| BIAS COIL | (0.8μm) ~3 |
| INSULATING FILM | (1.3μm) |
| LEAD | |
| INSULATING FILM | (0.2μm) |
| MAGNETORESISTIVE EFFECT ELEMENT LAYER | ~10 |
| Si SUBSTRATE | ~2 |

| | |
|---|---|
| PROTECTIVE FILM | (2μm) |
| BIAS COIL | (0.8μm) ~3 |
| INSULATING FILM | (1.3μm) |
| BIAS COIL | (0.8μm) ~3 |
| INSULATING FILM | (1.3μm) |
| LEAD | |
| INSULATING FILM | (0.2μm) |
| MAGNETORESISTIVE EFFECT ELEMENT LAYER | ~10 |
| Si SUBSTRATE | ~2 |

Z ↑

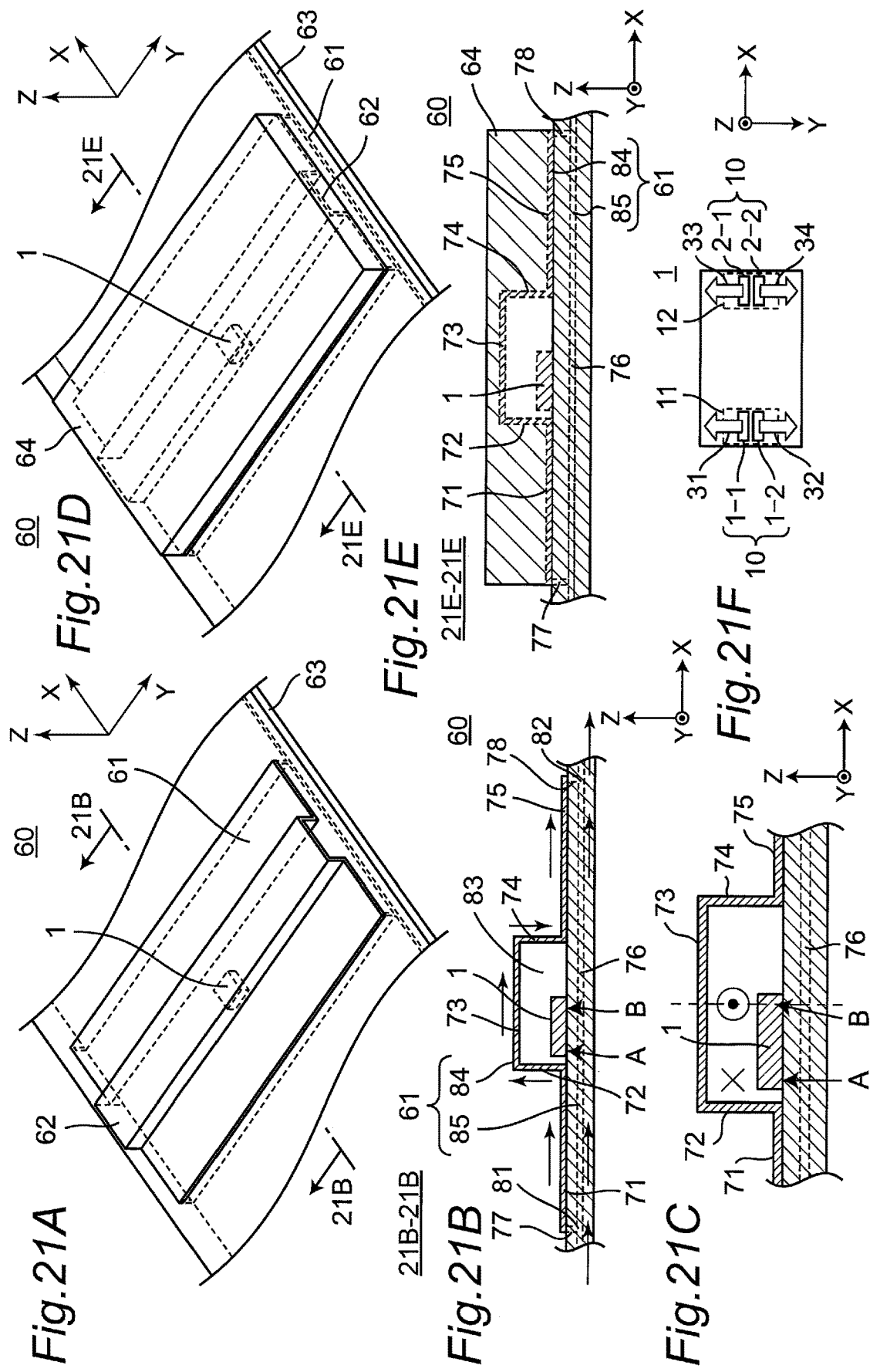

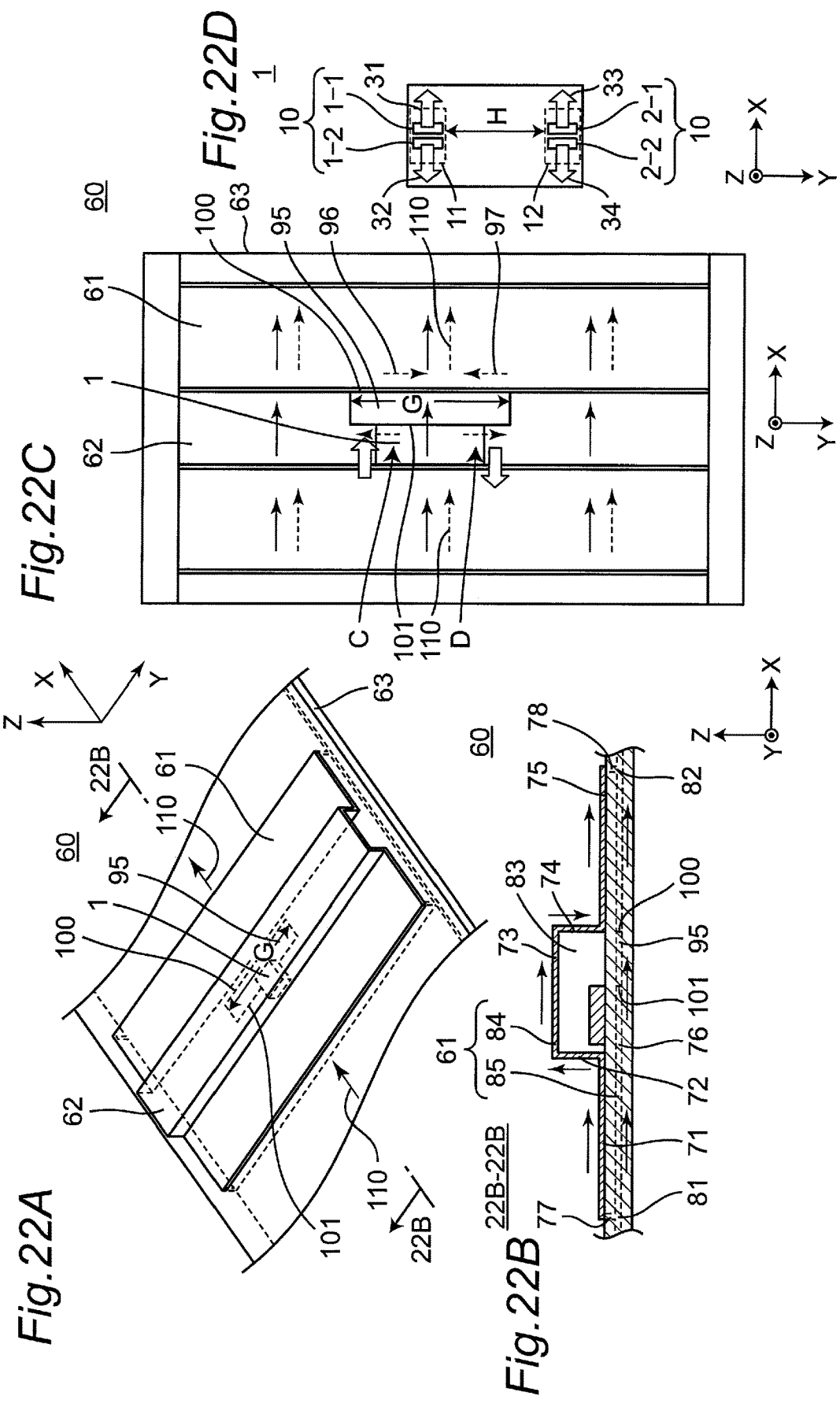

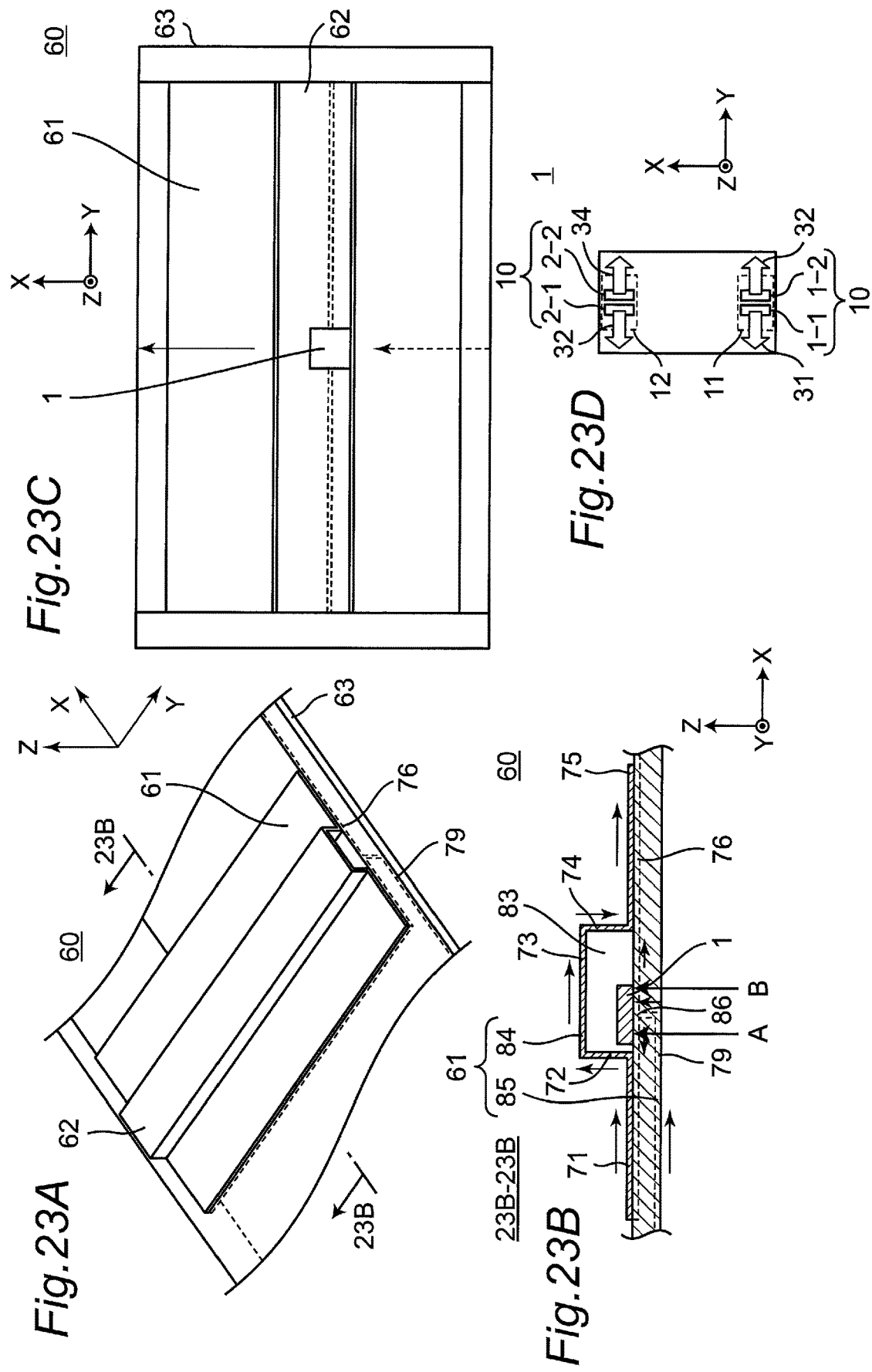

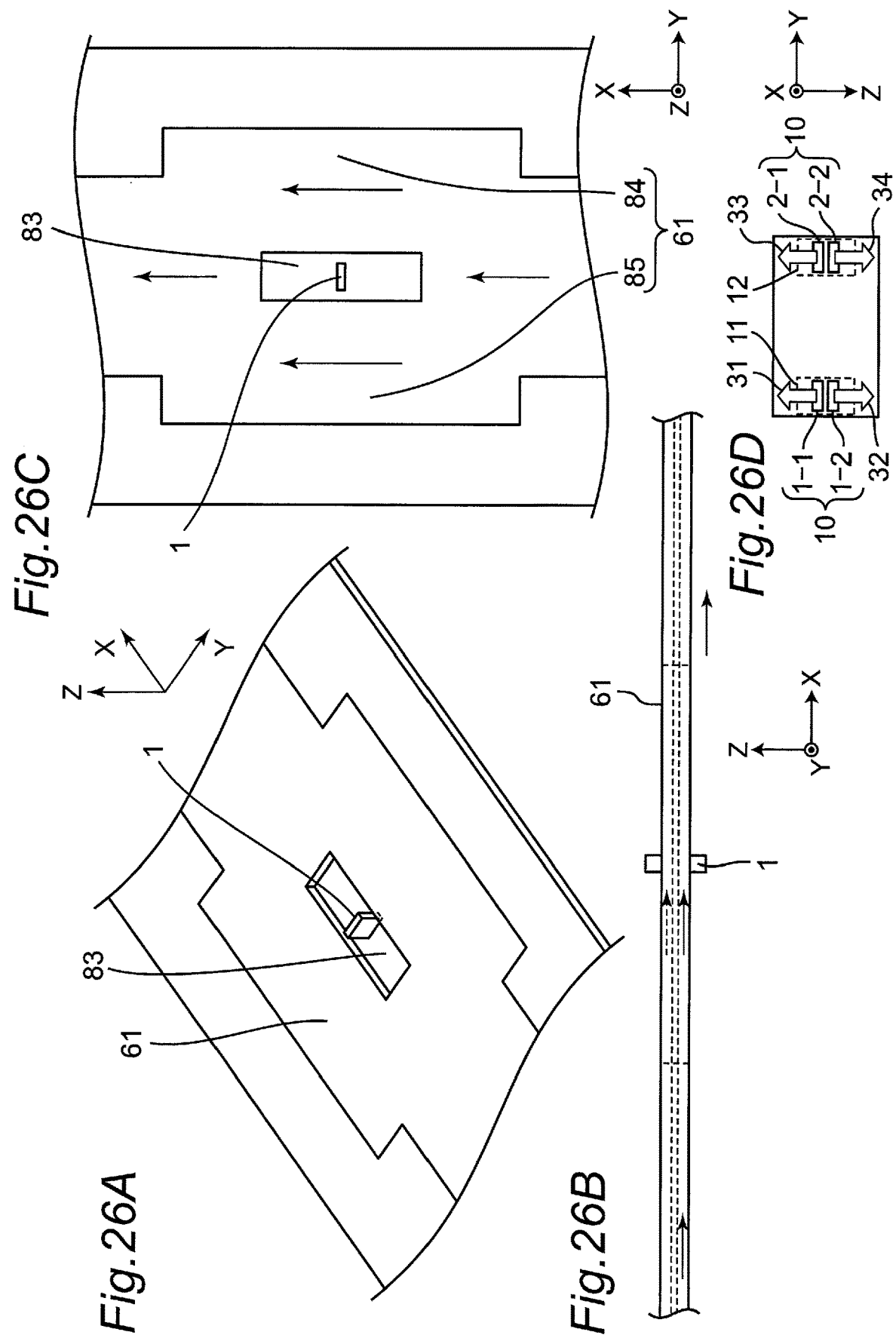

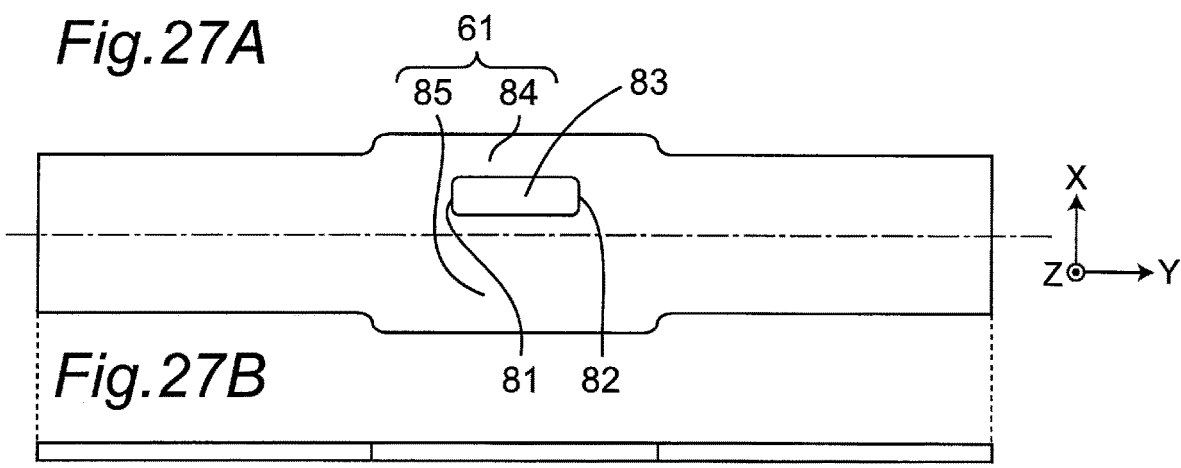
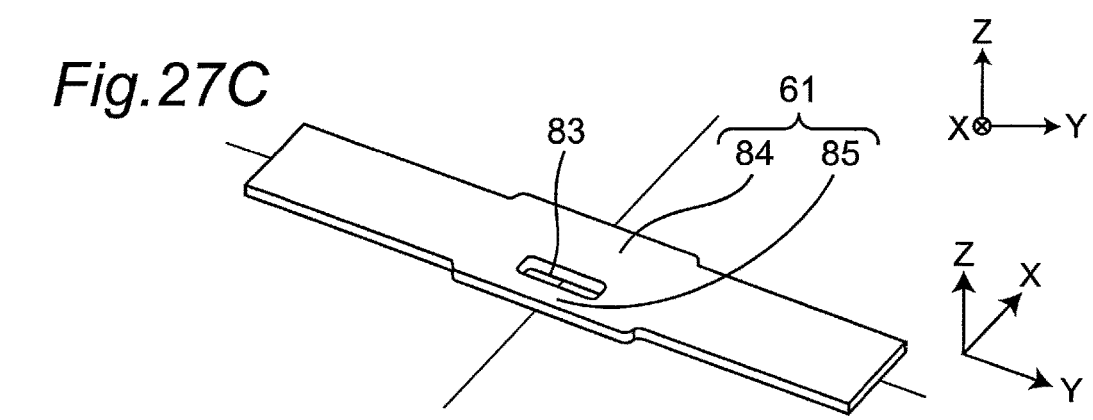
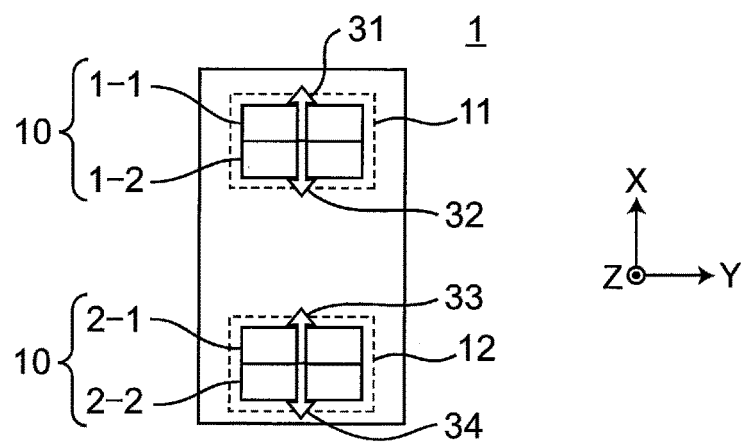
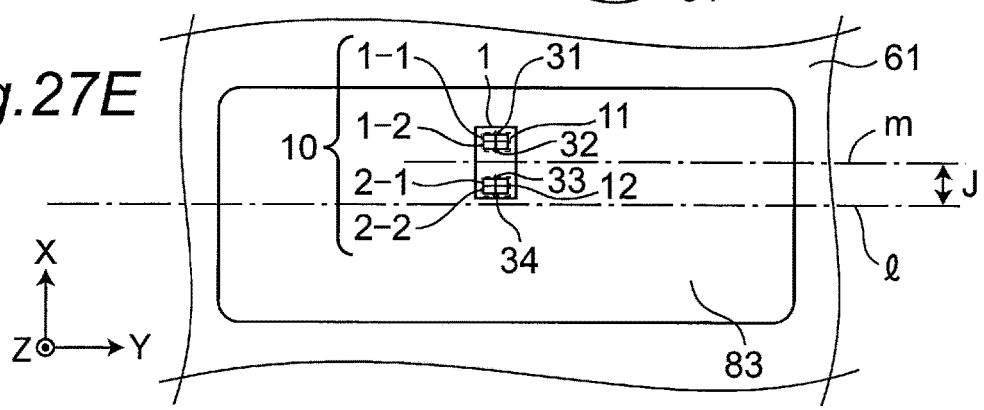

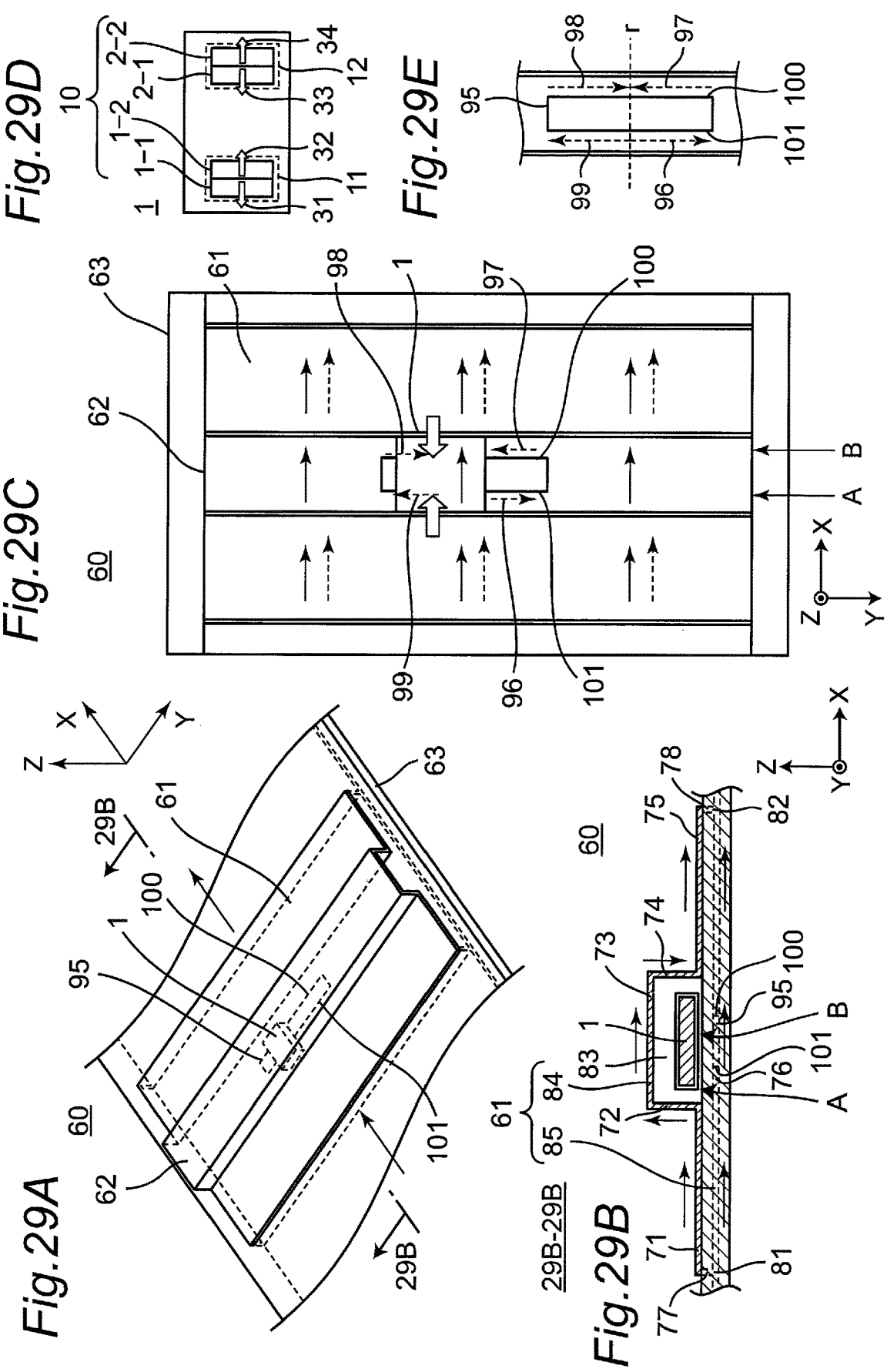

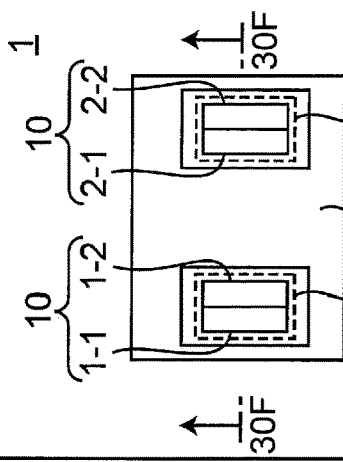
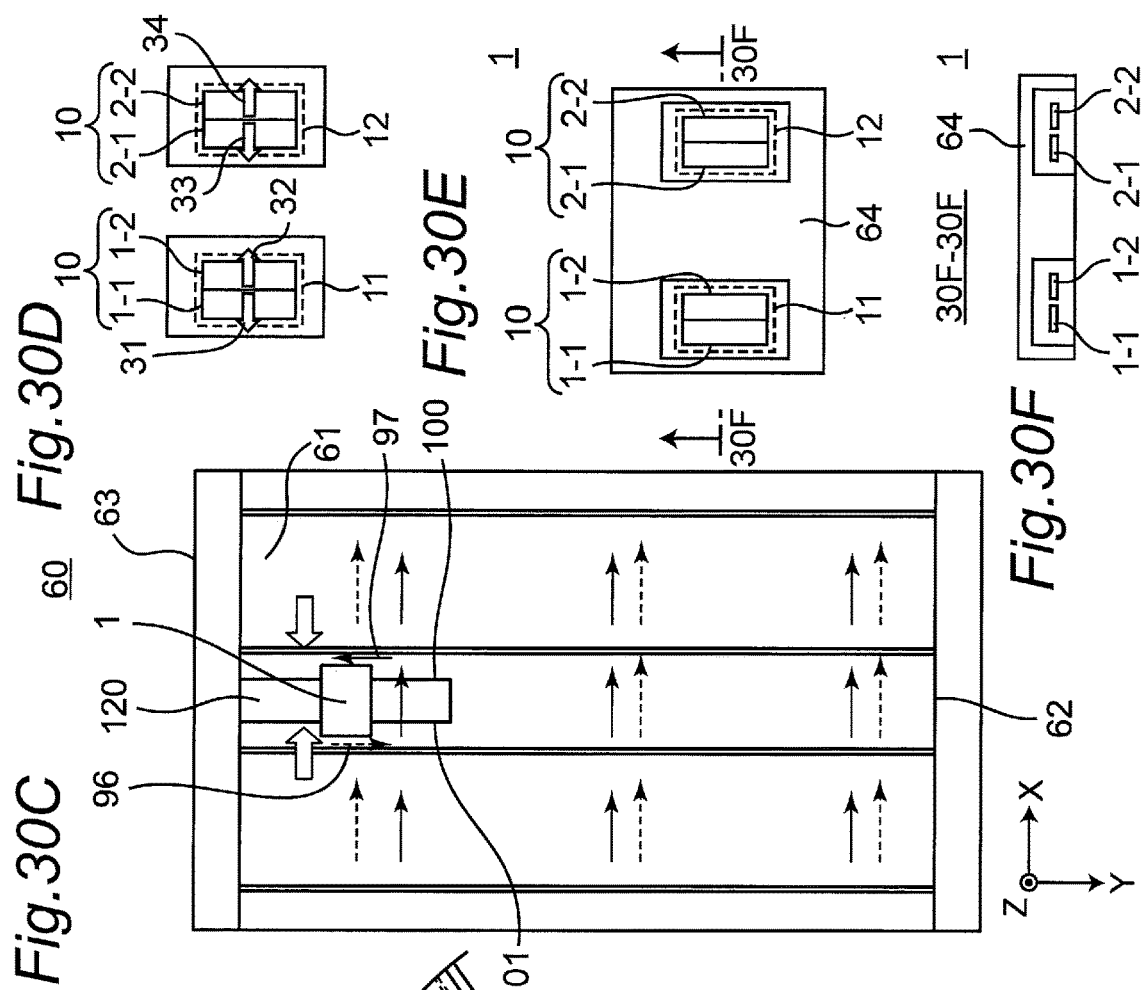
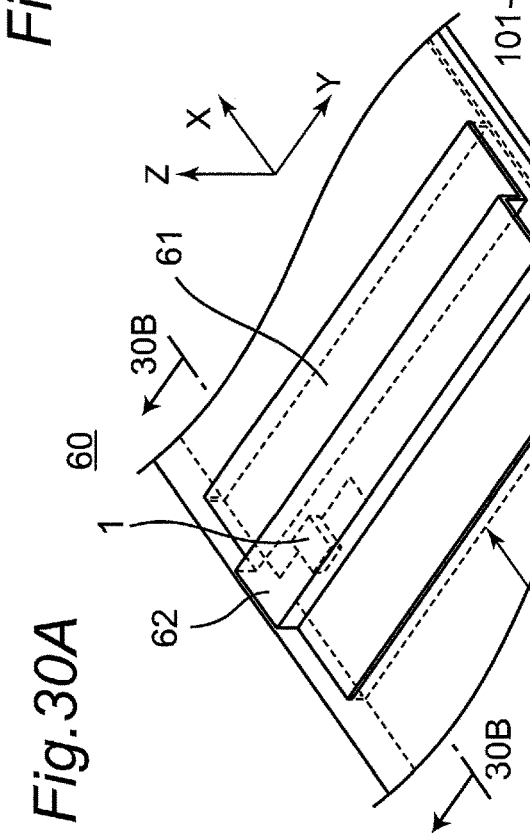
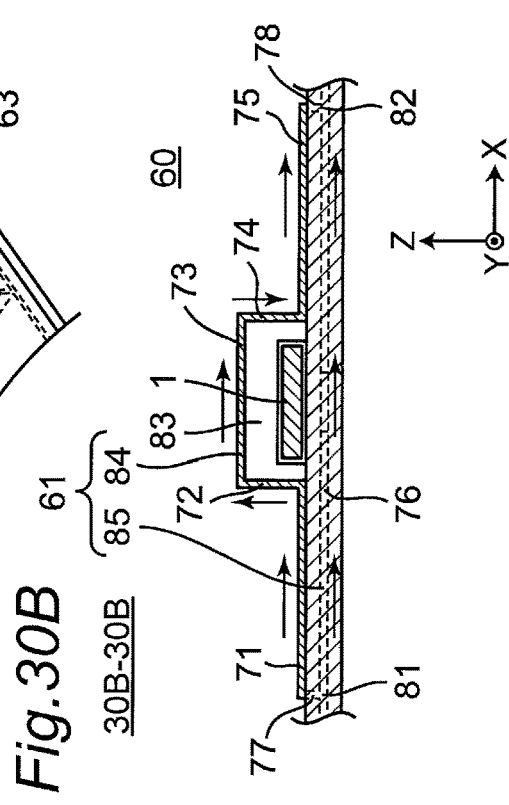
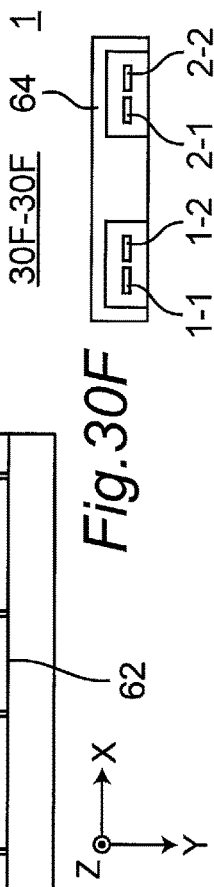

Fig.35
|  | ROOM TEMPERATURE | HIGH TEMPERATURE & LOW TEMPERATURE |
|---|---|---|
| OUTPUT AMPLITUDE | NECESSARY | UNNECESSARY |
| OUTPUT OFFSET | NECESSARY | UNNECESSARY |
Fig.36A
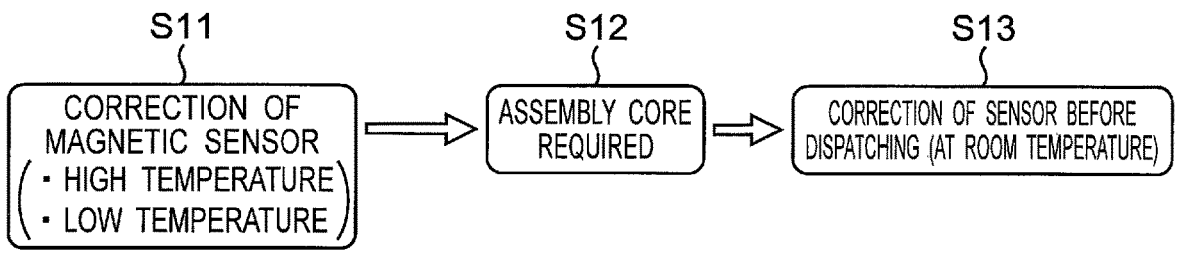
Fig.36B
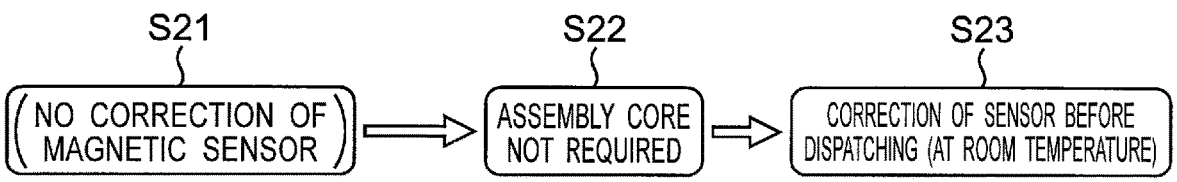

MAGNETIC SENSOR, MANUFACTURING METHOD THEREOF, AND CURRENT DETECTOR USING THE SAME

CROSS REFERENCE TO RELATED APPLICATIONS

This application is a National Stage of International Application No. PCT/JP2015/082468 filed Nov. 18, 2015 (claiming priority based on Japanese Patent Application No. 2014-233818 filed Nov. 18, 2014), the contents of which are incorporated herein by reference in their entirety.

TECHNICAL FIELD

The present invention relates to a magnetic sensor that senses a magnetic field and a current detector that detects an electric current amount by sensing the magnetic field generated by the current with the magnetic sensor.

BACKGROUND ART

There is a known current detector that measures a current flowing through a current line. The current detector is designed to detect a magnetic field generated by a current with a magnetic sensor and thereby to measure the current amount based on an output from a magnetic sensor (for example, Patent Document 1). Magnetic sensors suitable for use in such a current detector can employ magnetoresistive effect elements (MR elements), such as a giant magnetoresistive effect (GMR element) and a tunnel magnetoresistive effect element (TMR element). Two MR elements are connected in series with a voltage applied to both ends thereof, and then a potential (output potential) between the two MR elements is measured, so that the magnitude of a magnetic field, applied to the MR elements, can be detected.

A MR element, such as the GMR or TMR element, has extremely high sensibility, making it possible to measure a minute magnetic field, or a minute change in a magnetic field induced by the use of a minute current. Meanwhile, these MR elements are also susceptible to a disturbance magnetic field, such as a magnetic field generated by geomagnetism or electronic devices. Thus, to accurately measure the magnetic field using the magnetic sensor via the MR element, it is necessary to suppress the effect of any disturbance magnetic field. Specifically, for instance, a magnetic shield can be provided to cover the MR element, thereby suppressing the effect of a disturbance magnetic field on the MR element.

However, the provision of a magnetic shield leads to an increase in the number of parts of the magnetic sensor, and thereby an increase in the overall manufacturing cost of the magnetic sensor. Furthermore, the size of the magnetic sensor possibly increases after the magnetic shield is provided. In particular, if a measurement current is large when assembling the magnetic sensor in a current detector, a small-sized magnetic shield might be magnetic-saturated. This requires a large-sized magnetic shield. Consequently, the magnetic sensor will become much larger.

To reduce the cost and size of the magnetic sensor, it is desired to eliminate the magnetic shield. For this reason, methods for arranging MR elements have been studied that can suppress the effect of any disturbance magnetic field on the MR elements.

Patent Document 1 discloses a current detector that can suppress the effect of any disturbance magnetic field. A magnetic sensor includes four MR elements. Two of these MR elements are connected in series to configure a first half-bridge circuit. Likewise, the remaining two MR elements are also connected in series to configure a second half-bridge circuit. The first half-bridge circuit and the second half-bridge circuit are connected in parallel with each other to thereby configure a bridge circuit. The magnetosensitive direction (magnetization direction of a fixed layer) of each MR element in the first half-bridge circuit is aligned with the magnetosensitive direction of each MR element in the second half-bridge circuit, so that the effects of the disturbance magnetic field on the respective half-bridge circuits can be equalized. Thus, a difference (differential output) between an output potential in the first half-bridge circuit and an output potential in the second half-bridge circuit is taken out, and thereby the effect of the disturbance magnetic field on the respective half-bridge circuits can be offset.

As the MR element includes a free layer, a bias magnetic field can be applied to the MR element to improve the accuracy of the measurement. In the technique mentioned in Patent Document 1, to apply bias magnetic fields to the respective MR elements, a hard bias layer formed of a ferromagnetic material is disposed at both sides of each MR element.

PRIOR ART DOCUMENT

Patent Document

Patent Document 1: WO 2012/117784 A

DISCLOSURE OF THE INVENTION

Problems to be Solved by the Invention

In the technique of Patent Document 1, to completely offset the effect of the disturbance magnetic field, the first half-bridge circuit and the second half-bridge circuit need to have the same magnetic field measurement capabilities when measuring a magnetic field gradient. However, the hard bias layer of the ferromagnetic material significantly varies its magnetic-field strength depending upon the temperature. Once the bias magnetic field varies, a magnetic domain structure of the free layer within the MR element, which configures the half-bridge circuit, will change. The change in the magnetic domain structure of the free layer leads to a variance in the magnetic measurement capability of the MR element.

When the temperature of the magnetic sensor varies, the respective hard bias layers can have different temperatures. Consequently, the strengths of the bias magnetic fields, which are generated from the respective hard bias layers, become different. Thus, there occurs a difference in the magnetic measurement capacity between the respective MR elements, which might lead to errors of the measurement by the magnetic sensor.

Accordingly, it is an object of the present invention to provide a magnetic sensor that has small variations in measurement errors due to the temperature and a current detector using the same.

Means for Solving the Problems

According to a first aspect of the present invention, a magnetic sensor is provided which includes:

at least two magnetoresistive effect elements formed on the main surface and connected to a power terminal of a bridge circuit;

at least two magnetoresistive effect elements formed on the main surface and connected to a ground terminal of the bridge circuit;

a first region in which one of the at least two magnetoresistive effect elements connected to the power terminal and one of the at least two magnetoresistive effect elements connected to the ground terminal are disposed;

a second region in which another of the at least two magnetoresistive effect elements connected to the power terminal and another of the at least two magnetoresistive effect elements connected to the ground terminal are disposed; and a bias coil including a first bias application part for applying a bias magnetic field to the first region and a second bias application part for applying a bias magnetic field to the second region, wherein magnetosensitive directions of the two magnetoresistive effect elements connected to the power terminal are the same, magnetosensitive directions of the two magnetoresistive effect elements connected to the ground terminal are the same, and a difference between a cross-sectional area of the first bias application part and a cross-sectional area of the second bias application part is 35.4% or less.

In the magnetic sensor according to the first aspect of the present invention, the bias magnetic fields are applied by using the bias coil, so that current flowing through the bias coil is controlled to keep the bias magnetic field constant. This arrangement can suppress variations in the bias magnetic field due to the temperature.

The difference between the cross-sectional area of the first bias application part and the cross-sectional area of the second bias application part is set at 35.4% or less, whereby a difference in the magnetic field strength between the bias magnetic field from the first bias application part and the bias magnetic field from the second bias application part can be made small, thereby suppressing the measurement errors of the magnetic sensor.

In the magnetic sensor of a second aspect in the present invention according to the first aspect, a difference between a thickness of the first bias application part and a thickness of the second bias application part is 17.7% or less.

In the magnetic sensor of a third aspect in the present invention according to the first or second aspect, a difference between a distance from the magnetoresistive effect element in the first region to the first bias application part and a distance from the magnetoresistive effect element in the second region to the second bias application part is 5.78% or less.

In the magnetic sensor of a fourth aspect in the present invention according to any one of the first to third aspects, a difference in thickness between at least two magnetoresistive effect elements connected to the power terminal is 3.0% or less, and a difference in thickness between at least two magnetoresistive effect elements connected to the ground terminal is 3.0% or less.

In the magnetic sensor of a fifth aspect in the present invention according to the fourth aspect, a difference between a thickness of the at least two magnetoresistive effect elements connected to the power terminal and a thickness of the at least two magnetoresistive effect elements connected to the ground terminal is 3.0% or less.

In the magnetic sensor of a sixth aspect in the present invention according to any one of the first to fifth aspects, a difference between a thickness of the first bias application part and a thickness of the second bias application part is 3.0% or less.

In the magnetic sensor of a seventh aspect in the present invention according to any one of the first to sixth aspects, the two magnetoresistive effect elements disposed in the first region are connected in series, the two magnetoresistive effect elements disposed in the second region are connected in series, magnetosensitive directions of the two magnetoresistive effect elements formed in the first region are opposite to each other, and magnetosensitive directions of the two magnetoresistive effect elements formed in the second region are opposite to each other.

In the magnetic sensor of an eighth aspect in the present invention according to any one of the first to sixth aspects, the one magnetoresistive effect element disposed in the first region and connected to the power terminal and the another magnetoresistive effect element disposed in the second region and connected to the ground terminal are connected in series, the one magnetoresistive effect element disposed in the first region and connected to the ground terminal and the another magnetoresistive effect element disposed in the second region and connected to the power terminal are connected in series, magnetosensitive directions of the two magnetoresistive effect elements disposed in the first region are the same, and magnetosensitive directions of the two magnetoresistive effect elements disposed in the second region are the same.

In the magnetic sensor of a ninth aspect in the present invention according to any one of the first to eighth aspects, the bias coil further includes a bias coil bypass part, and a cross-sectional area of the bias coil bypass part is larger than each of cross-sectional areas of the first and second bias application parts.

In the magnetic sensor of a tenth aspect in the present invention according to any one of the first to ninth aspects, the magnetic sensor further includes a feedback circuit, and the feedback circuit is configured to generate a feedback magnetic field based on a magnetic field strength detected by the magnetoresistive effect element, the feedback magnetic field being adapted to offset the detected magnetic field strength.

According to an eleventh aspect of the present invention, a current detector is provided which includes: a current line including a void between a branch position and a merging position, and a first current path and a second current path separated from each other by the void; and the magnetic sensor according to any one of the first to tenth aspects, provided in the void.

In the current detector of a twelfth aspect in the present invention according to the eleventh aspect, the magnetic sensor is disposed within the void such that the magnetosensitive direction of a fixed layer of the magnetoresistive effect element in the magnetic sensor is perpendicular to current directions in the first current path and the second current path.

In the current detector of a thirteenth aspect in the present invention according to an eleventh or twelfth aspect, the current detector further includes a current line including a bypass part formed to bypass the magnetic sensor.

In the current detector of a fourteenth aspect in the present invention according to any one of the eleventh to thirteenth aspects, a substrate of the magnetic sensor includes a first substrate having a first region and a second substrate having a second region, wherein the first substrate is separated from the second substrate.

According to a fifteenth aspect of the present invention, a method for manufacturing a magnetic sensor includes the steps of:

preparing a substrate with a main surface;

forming a bridge circuit including, on the main surface, a power terminal, a ground terminal, at least two magnetoresistive effect elements connected to the power terminal, and at least two magnetoresistive effect elements connected to the ground terminal; and forming a bias coil including a first bias application part for applying a bias to a first region and a second bias application part for applying a bias magnetic field to a second region, the first region being provided with one of the at least two magnetoresistive effect elements connected to the power terminal and one of the at least two magnetoresistive effect elements connected to the ground terminal, the second region having been provided with another of the at least two magnetoresistive effect elements connected to the power terminal and another of the at least two magnetoresistive effect elements connected to the ground terminal, wherein the step of forming the bridge circuit includes:

simultaneously forming the at least two magnetoresistive effect elements connected to the power terminal; and simultaneously forming the at least two magnetoresistive effect elements connected to the ground terminal.

In the manufacturing method of a sixteenth aspect in the present invention according to the fifteenth aspect, the step of forming the bridge circuit includes:

simultaneously forming the at least two magnetoresistive effect elements connected to the power terminal and the at least two magnetoresistive effect elements connected to the ground terminal.

In the manufacturing method of a seventeenth aspect in the present invention according to the fifteenth or sixteenth aspect, the first bias application part and the second bias application part are simultaneously formed.

Effects of the Invention

The magnetic sensor according to the present invention can reduce variations in the measurement errors due to the temperature by using a bias coil. Furthermore, the difference in the cross-sectional area between the two bias application parts is controlled to be a predetermined rate or less, thereby making it possible to reduce the measurement errors of the magnetic sensor.

BRIEF DESCRIPTION OF THE DRAWINGS

FIG. 4A is a schematic perspective view of an element and the bias coil in a first region. FIG. 4B is a schematic side view of the element and the bias coil in the first region. FIG. 4C is a cross-sectional view of the element and the bias coil taken along the line 4C-4C of FIG. 4A. FIG. 4D is a cross-sectional view of the element and the bias coil in the first region and a second region.

FIGS. 13A and 13B are graphs obtained by measuring a change in the differential output relative to the disturbance magnetic field, in which FIG. 13A is related to the disturbance magnetic field in the X direction, and FIG. 13B is related to the disturbance magnetic field in the Y direction.

FIGS. 19A to 19C are layered views of the magnetic sensors in the first to seventh embodiments.

FIG. 21A is a schematic perspective view of a current detector according to a ninth embodiment; FIG. 21B is a cross-sectional view taken along the line 21B-21B of FIG. 21A; FIG. 21C is a partially enlarged cross-sectional view of FIG. 21B; FIG. 21D is a schematic perspective view of the current detector with a current line covered with a resin molded body; FIG. 21E is a cross-sectional view taken along the line 21E-21E of FIG. 21; and FIG. 21F is a schematic top view of the magnetic sensor used in the current detector shown in FIGS. 21A to 21E.

FIG. 22A is a schematic perspective view of a current detector according to a tenth embodiment; FIG. 22B is a cross-sectional view taken along the line 22B-22B shown in FIG. 22A; FIG. 22C is a schematic top view of the current detector in the tenth embodiment; and FIG. 22D is a schematic top view of a magnetic sensor used in the current detector shown in FIGS. 22A to 22C.

FIG. 23A is a schematic perspective view of a current detector according to an eleventh embodiment; FIG. 23B is a cross-sectional view taken along the line 23B-23B shown in FIG. 23A; FIG. 23C is a top view of the current detector in the eleventh embodiment; and FIG. 23D is a schematic top view of a magnetic sensor used in the current detector shown in FIGS. 23A to 23C.

FIG. 26A is a perspective view of a current detector 60 according to a fourteenth embodiment; FIG. 26B is a side view of the current detector 60 in the fourteenth embodiment; FIG. 26C is a top view of the current detector 60 in the fourteenth embodiment; and FIG. 26D is a schematic top view of a magnetic sensor used in the current detector shown in FIGS. 26A to 26C.

FIG. 27A is a top view of a current line used in a current detector according to a fifteenth embodiment; FIG. 27B is a side view of the current line; FIG. 27C is a perspective view of the current line; FIG. 27D is a schematic top view of the magnetic sensor used together with the current line shown in FIGS. 27A to 27C; and FIG. 27E is a partially enlarged view of a void of the current line on which the magnetic sensor is disposed in the current detector of the fifteenth embodiment.

FIG. 29A is a schematic perspective view of a current detector according to a sixteenth embodiment; FIG. 29B is a cross-sectional view taken along the line 29B-29B; FIG. 29C is a schematic top view of the current detector in the sixteenth embodiment; FIG. 29D is a schematic top view of a magnetic sensor used in the current detector shown in FIGS. 29A to 29C; and FIG. 29E is a partially enlarged top view of a part near a second void.

FIG. 30A is a schematic perspective view of a current detector according to a seventeenth embodiment; FIG. 30B is a cross-sectional view taken along the line 30B-30B shown in FIG. 30A; FIG. 30C is a schematic top view of the current detector 60 in the seventeenth embodiment; FIG. 30D is a schematic top view of a magnetic sensor 1 used in the current detector 60 shown in FIGS. 30A to 30C; FIG. 30E is a schematic top view of the magnetic sensor 1 mold-packaged with resin; and FIG. 30F is a schematic cross-sectional view taken along the line 30F-30F of FIG. 30E.

FIG. 35 is a table showing correction indexes of the magnetic sensor in Example.

FIG. 36A is a flow diagram for explaining output correction of a magnetic sensor in the comparative example; and FIG. 36B is a flow diagram for explaining output correction of the magnetic sensor in Example.

MODE FOR CARRYING OUT THE INVENTION

Figure 1:
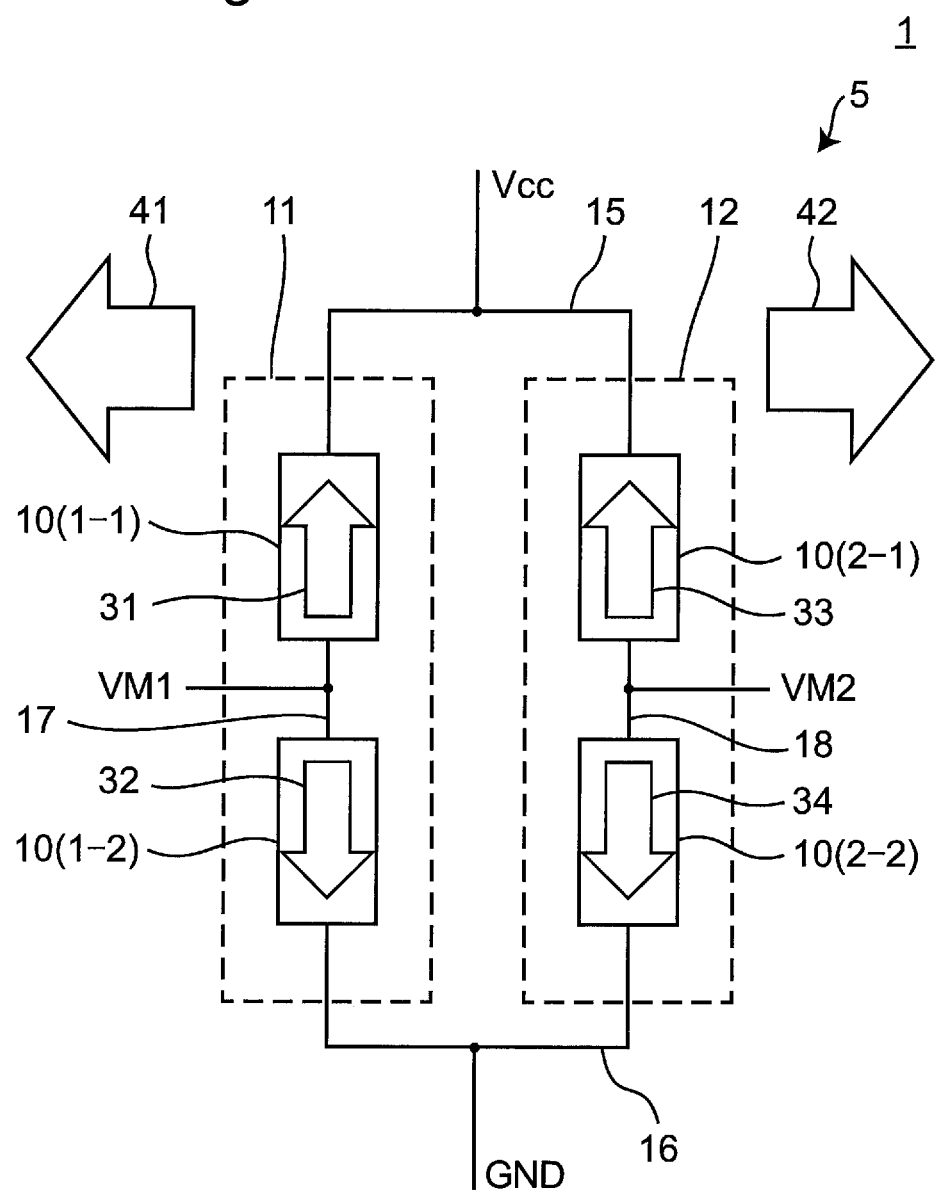
FIG. 1 is a schematic circuit diagram of a magnetic sensor according to a first embodiment of the present invention.

Embodiments of the present invention will be described in detail below with reference to the accompanying drawings. Although in the description below, terms indicative of specific directions and positions (e.g., "upper", "lower", "right", "left", "X direction", "Y direction", "Z direction", and other terms including these words) will be used as needed, they are used to make the present invention easy to understand with reference to the drawings and not intended to restrict the technical range of the present invention by their meanings. Here, the "X direction", "Y direction", and "Z direction" are not necessarily aligned with the magneto-sensitive direction, the bias magnetic field direction, or the like, and are defined for each embodiment. The same reference characters will be used throughout the drawings to refer to the same or like parts or members unless otherwise specified. The size and shape of each component shown in the figure are illustrative only, and these components can have different sizes and shapes.

First to seventh embodiments will describe variations of a magnetic sensor according to the present invention. Eighth to seventeenth embodiments will describe variations of a current detector using the magnetic sensor according to the present invention.

[Magnetic Sensor]

A magnetic sensor mainly including four magnetoresistive effect elements will be described herein. Note that in the present invention, the number of magnetoresistive effect elements is not limited to four. It is to be understood that other number of (for example, 6 or more) magnetoresistive effect elements may be used.

A bias coil may be an arbitrary one as long as it can apply a desired bias magnetic field to each corresponding element. The shape or the number of bias coils is not particularly limited.

First Embodiment

FIG. 1 is a schematic circuit diagram of a magnetic sensor 1 according to the first embodiment of the present invention. The magnetic sensor 1 has a bridge circuit 5 that includes four magnetoresistive effect elements (each being hereinafter referred to as a "MR element" or "element") 10. In details, a first element 1-1 connected to a power terminal Vcc and a second element 1-2 connected to a ground terminal GND are connected in series to configure a first half-bridge circuit. The first element 1-1 and the second element 1-2 are arranged in a first region 11. A first output terminal VM1 is connected between the first element 1-1 and the second element 1-2.

Likewise, a third element 2-1 connected to the power terminal Vcc and a fourth element 2-2 connected to the ground terminal GND are connected in series to configure a second half-bridge circuit. The third element 2-1 and the fourth element 2-2 are arranged in a second region 12. A second output terminal VM2 is connected between the third element 2-1 and the fourth element 2-2.

The magnetosensitive directions of the respective elements 10 are indicated by arrows 31, 32, 33 and 34 corresponding to the elements 10. Although each element 10 is shown in a rectangular shape, it indicates a conceptual resistor, and is not limited to a specific shape. For example, the element 10 may be one formed by arranging an elongated line in a meander shape (shape in which it meanders).

Figure 2A:
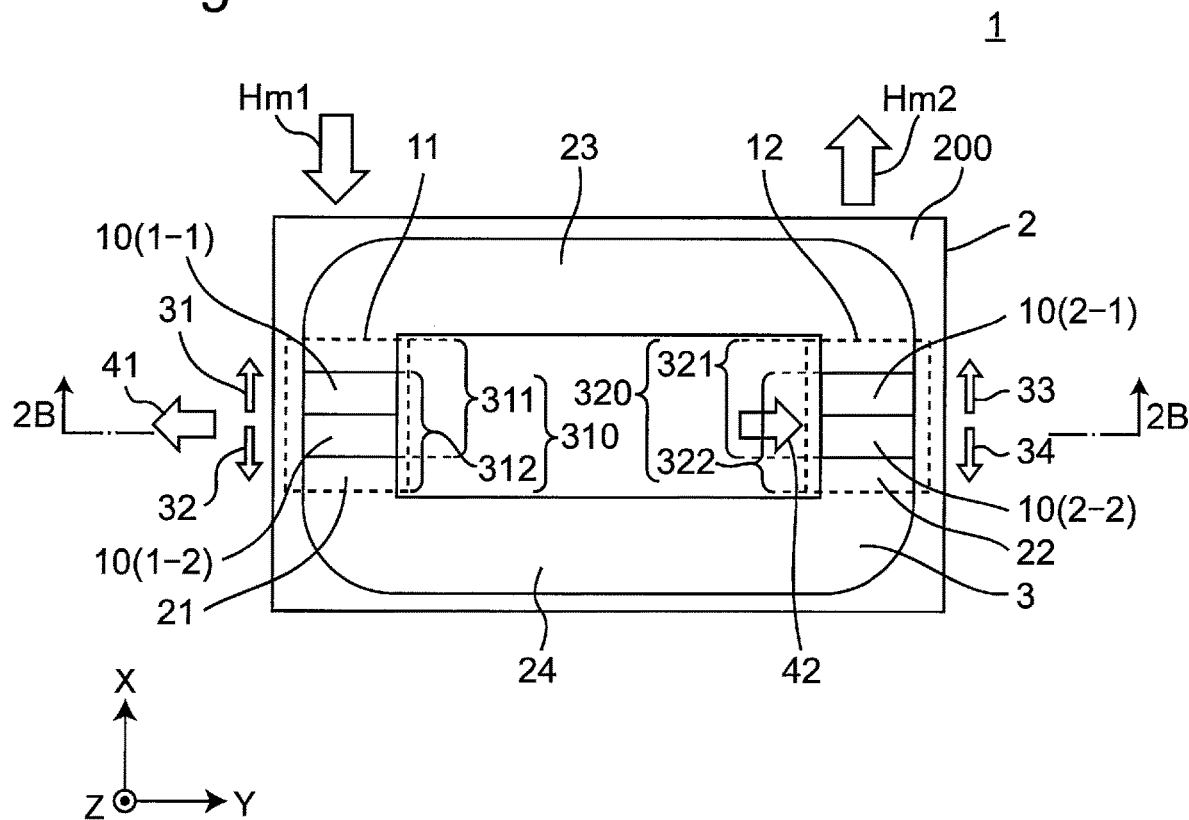
FIG. 2A is a top view of the magnetic sensor in the first embodiment of the present invention.
Figure 2B:
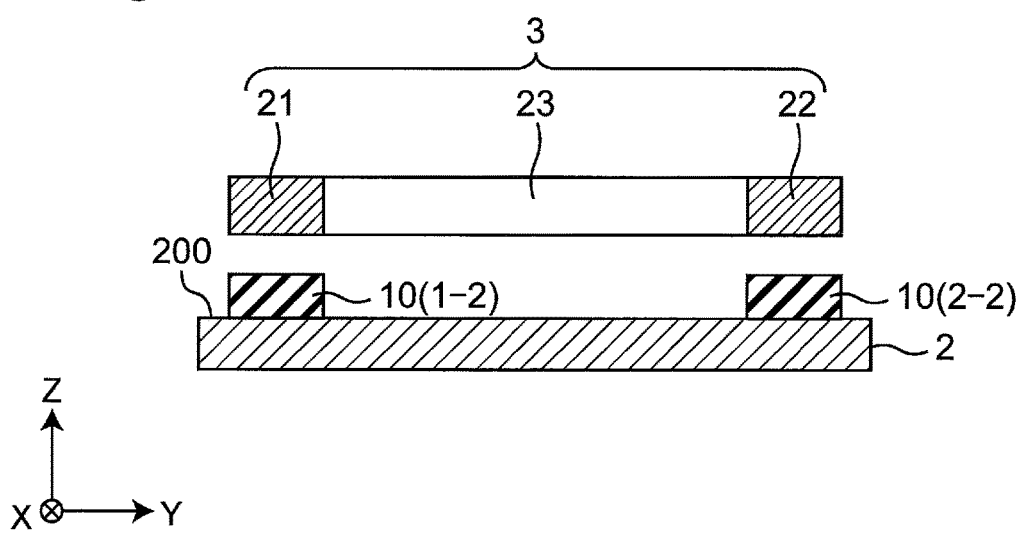
FIG. 2B is a cross-sectional view taken along the line 2B-2B in FIG. 2A.

FIG. 2A is a top view of the magnetic sensor 1, showing the arrangement of the elements 10 and a coil 3 within a magnetic sensor 1. FIG. 2B is a cross-sectional view of the magnetic sensor 1 taken along the line 2B-2B of FIG. 2A. The elements 10 and the bias coil 3 are placed on a main surface 200 of a substrate 2.

The term "bias coil" as used herein means a coil to apply a bias magnetic field to the element. For example, the bias coil shown in FIG. 2 is illustrated in a rectangular shape with rounded corners and having a rectangular hole located at its center. In practice, an elongated coil line is wound in a coil shape from the inner toward the outer side to enclose the rectangular hole at the center.

As shown in FIG. 2A, each element 10 is indicated by a solid line, but in fact, the element 10 is disposed under the coil and thus cannot be viewed from its top side. Referring to FIG. 2B, the element 10 and the bias coil 3 are spaced apart with a gap therebetween. In the gap, for example, an insulating film (generally, of approximately 1.3 µm in thickness) is disposed.

Note that in FIGS. 2A and 2B, the illustration of wires, electrodes, and the like is omitted to make the configuration of the magnetic sensor 1 easy to understand.

As shown in FIGS. 1, 2A, and 2B, the magnetic sensor 1 according to the first embodiment of the present invention includes:

the substrate 2 with the main surface 200;

the two elements 1-1 and 2-1 and the two elements 1-2 and 2-2, the two elements 1-1 and 2-1 being formed on the main surface 200 and connected to the power terminal (Vcc) in the bridge circuit 5, the two elements 1-2 and 2-2 being formed on the main surface 200 and connected to the ground terminal (GND) of the bridge circuit 5; and a bias coil 3 having bias application parts 310 and 320 that apply bias magnetic fields 41 and 42 to the first region 11 and the second region 12, respectively, the first region 11 being provided with one element 1-1 of the two elements connected to the power terminal (Vcc) and one element 1-2 of the two elements connected to the ground terminal (GND), the second region 12 being provided with the other element 2-1 of the two elements connected to the power terminal (Vcc) and the other element 2-2 of the two elements connected to the ground terminal (GND).

The two elements 1-1 and 2-1 connected to the power terminal (Vcc) of the bridge circuit 5 have the same magnetosensitive direction, while the two elements 1-2 and 2-2 connected to the ground terminal (GND) of the bridge circuit have the same magnetosensitive direction.

A difference between a cross-sectional area of the first bias application part 310 in the first region 11 and a cross-sectional area of the second bias application part 320 in the second region 12 is set at 35.4% or less.

The inventors have focused on the difference in the cross-sectional area between the bias application parts 310 and 320 of the bias coil 3 and examined an allowable range of the difference in the cross-sectional area between the bias application parts by using the tolerance of the output potential of the magnetic sensor 1 based on the simulation result of the magnetic sensor 1.

<Simulation 1>

The simulation of the magnetic sensor 1 is performed under the following conditions. The simulation of the electromagnetic field and heat is performed by an analysis software JMAG (manufactured by JSOL Corporation) taking into account physical phenomena of the magnetic sensor, including heat generation from current flowing through the bias coil, heat transfer to the substrate or element, and a change in resistance due to a change in the temperature of components.

Figure 3A:
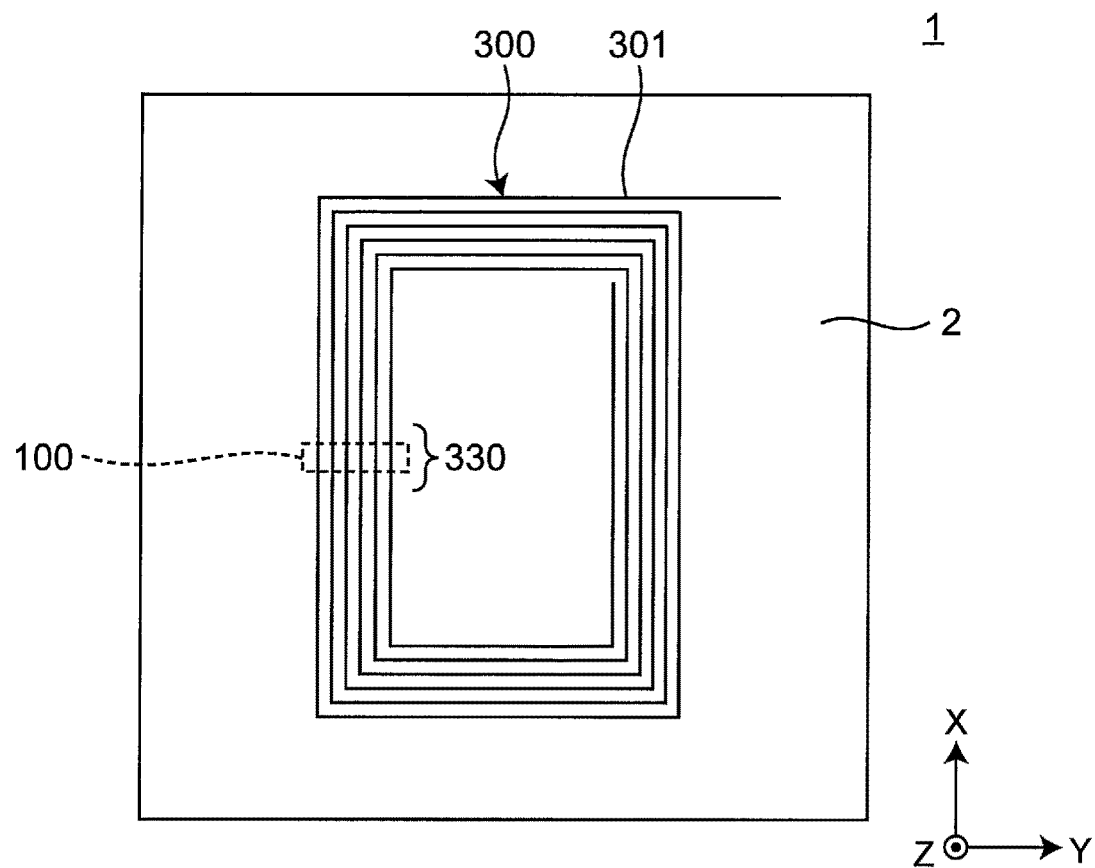
FIG. 3A is a schematic top view of a magnetic sensor used in simulation.

FIG. 3A is a schematic top view of the magnetic sensor 1 used in the simulation. The magnetic sensor 1 includes a silicon substrate 2 (with 1 mm in width×1 mm in length×0.3 mm in thickness), a GMR element 100 (5 µm in width×100 µm in length×2 nm in thickness) disposed on the silicon substrate 2, and a bias coil 300. The bias coil 300 is a coil formed by coiling a thin line (4 µm in width and 0.6 to 1.0 µm in thickness) made of an aluminum thin film within the X-Y plane. The bias coil 300 is wound from the inner toward the outer side to form a rectangular shape in the top view. The bias coil 300 has its part (bias application part 330) placed to pass over the GMR element 100. A gap distance between a lower surface of the bias application part 330 and an upper surface of the GMR element 100 is set at 1.3 µm.

During the simulation, the thickness of the bias application part 330 is changed within a range from 0.6 to 1.0 µm.

Figure 3B:
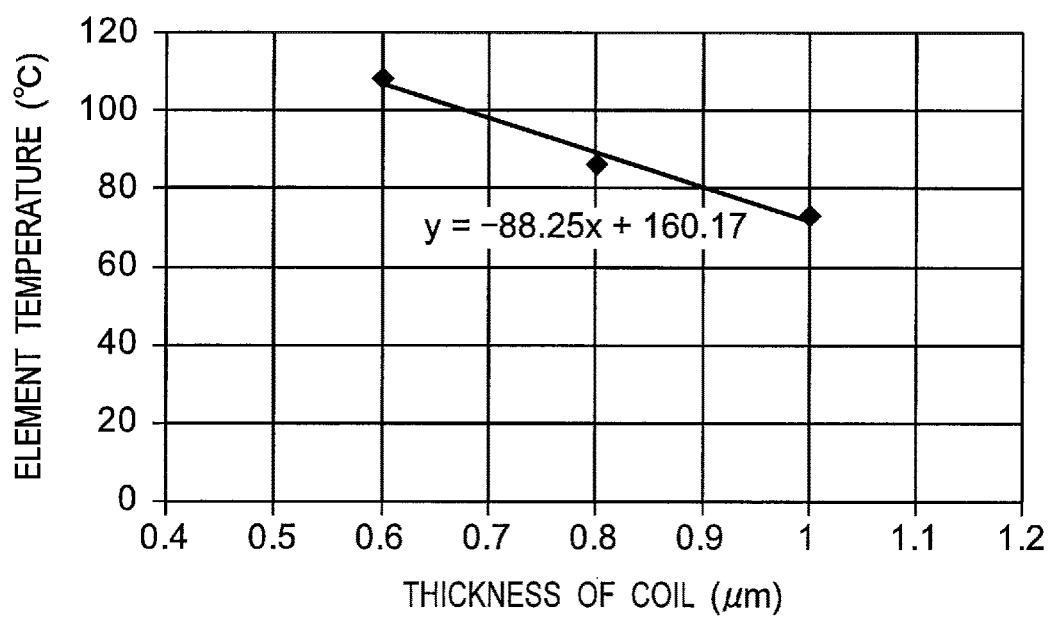
FIG. 3B is a graph showing an element temperature relative to the thickness of a bias coil that is made based on the simulation result.

When passing the current through the bias coil to apply the bias magnetic field to the MR element, the bias coil generates heat. The generated heat increases the temperature of the MR element positioned directly under the bias coil (hereinafter referred to as an "element temperature"). The element temperature when passing the current of 10 mA (the maximum current value expected in use of a current detector) through the bias coil is determined by the simulation. The result is shown in FIG. 3B. The relationship between the element temperature determined from FIG. 3B and the thickness of the bias application part 330 is represented by formula (1) below.

$$\text{Element Temperature (° C.)} = -88.25 \, (\mu m/° C.) \times \text{Coil Thickness} \, (\mu m) + 160.17 \quad (1)$$

For defining the performance of the magnetic sensor, an allowable difference in the thickness between the bias application parts is considered based on a normally allowable error range and a normally used voltage.

Here, based on the results of studies diligently conducted by the inventor, it has concluded that when a target full scale error of the magnetic sensor (an error of the maximum output within a measurable range) is 0.05% or less, no correction is needed, and the output is so large that only one amplification can meet the need of the magnetic sensor, thereby making it possible to reduce the costs for an IC, an amplifier, etc., that would otherwise be arranged. This results in the fact that the target full scale error of the magnetic sensor is desirably set at 0.05% or less. A general voltage applied to the power terminal of the magnetic sensor 1 is 5 V, while a full scale of an output potential from the magnetic sensor is generally 150 mV. From these values, a tolerance of the output potential can be determined to be 0.075 mV (150 mV×0.05%) or less.

When a magnetic sensor is designed by setting a management value at 1 mV or less in an element temperature range of −40° C. to 125° C. (i.e., a temperature range from the lower to upper limit of 165° C.), an allowable deviation of the output potential (offset drift) per degree (i.e., per ° C.) is 0.00606 mV (1 mV/165° C.) or less.

Therefore, when the tolerance (0.075 mV) of the output potential is divided by the allowable offset drift of the output potential per degree (0.00606 mV/° C.), the total deviation in the element temperature corresponding to the tolerance of the output potential is found to be 12.376° C. (0.075 (mV)/0.0606 (mV/° C.)).

By use of the formula (1), the deviation in the element temperature of 12.736° C. is converted into a deviation in the thickness of the bias application part 330. When x1 (μm) is a thickness of a bias application part 330 at a first temperature y1 (° C.), and x2 (μm) is a thickness of the bias application part 330 at a first temperature y2 (° C.), the x1 and x2 are substituted in the formula (1).

$$y1 = -88.25 \times x1 + 160.17 \quad (2)$$

$$y2 = -88.25 \times x2 + 160.17 \quad (3)$$

A difference between the first temperature y1 and the second temperature y2 (a deviation in the element temperature) and a difference between a first thickness and a second thickness (a deviation in the thickness) have the following relationship.

$$y1 - y2 = 88.25(x1 - x2)$$

Here, when substituting y1−y2=12.376° C. in the formula above, the x1−x2 will be determined as follows:

$$x1 - x2 = 0.14 \, (\mu m)$$

That is, to restrain the deviation in the element temperature to 12.736° C. or less, the difference in the thickness of the bias application part 330 needs to be 0.14 μm or less. In other words, the allowable difference in the thickness of the bias application part 330 is 0.14 μm or less.

Here, when executing the simulation, a ratio of the allowable difference (0.14 μm) in the thickness of the bias application part 330 to 0.8 μm ((0.6 μm+1.0 μm))/2), which is a mean value of a modified range of the thickness of the bias application part from 0.6 μm to 1.0 μm, is determined to be as follows:

$$0.14 \, \mu m / 0.8 \, \mu m = 0.175 (17.5\%).$$

Note that the mean value of the thickness ranging from 0.6 μm to 1.0 μm can also be regarded as an average of a thickness of 0.6 μm and a thickness of 1.0 μm.

Referring to FIG. 3 and the above-mentioned description, the following simulation result is obtained by using the specified thickness (specified to be 0.8 μm in thickness) of the bias application part of the bias coil and the element (hereinafter a GMR element being used as the element). A substrate set as one of the simulation conditions has a large dimension, compared with the element or the bias coil. Thus, the substrate has a large thermal potential and is less susceptible to heat, depending on the distance between the element and bias coil and their materials. Thus, the element temperature, i.e., the maximum temperature of a part of the bias coil as a heat generating source where the element is positioned, is used as the temperature of the magnetic sensor. The current passing through the bias coil is at 10 mA (expected maximum current value). The simulated result on the above-mentioned conditions can be approximated at a relational formula below.

$$(\text{Element Temperature}) = -70.6 \times (\text{Bias Coil Thickness}) + 160.17 \quad (1)'$$

The ratio of the offset temperature drift (temperature gradient of the output when a magnetic field to be measured is 0) to the maximum sensor output (output before amplification) from the magnetic sensor is determined to be 0.67% or less. This value is one that can be anticipated from the properties, composition, and size of material, a wafer size, and the like when fabricating a magnetoresistive effect element made up of a thin film. Furthermore, when dividing this value by a temperature range, which is set taking into account a higher environmental temperature of an inverter or the like than the room temperature, the following value is determined: 0.67/165=0.004%/° C. or less. Then, a difference in the temperature between elements required to obtain the full scale error of 0.05% or less as mentioned above is determined to be 0.05/0.004=12.5° C., or less. From the difference in the temperature between the elements as mentioned above, a thickness between two arbitrary points of the bias coil is considered. When y1 is an element temperature while x1 is the thickness of the bias coil, and y2 is an element temperature while x2 is the thickness of the bias coil, the following values are derived from the formula (1)'.

$$y1 = -70.6 \, x1 + 160.17 \quad (2)'$$

$$y2 = -70.6 \, x2 + 160.17 \quad (3)'$$

By subtracting the formula (3)' from the formula (2)', a difference Δy in the temperature between the elements is derived as follows.

$$\Delta y = y1 - y2 = -70.6(x1 - x2) \quad (4)'$$

From the above-mentioned temperature difference of 12.5° C. and the above-mentioned formula (4)', it is found that to restrain the offset drift caused by the heat generation of the bias coil at 0.05% or less, based on the formula of y1−y2=12.5=−70.6(x1−x2), Δx (=x2−x1), the ratio with respect to the thickness of the bias coil needs only to be 17.7% or less.

The power of the generated heat is proportional to the product of a resistance and the square of the current. When the current is constant, the resistance is proportional to the thickness and width. In the present invention, only the thickness of the bias coil is used as a parameter for the simulation with the width thereof set constant. The same applies to the width. The sum of these variations, i.e., twice as large as the variations in the thickness corresponds to variations in the cross-sectional area of the bias coil. That is, the total variations need only to be 35.4% or less in terms of the cross-sectional area. Therefore, the magnetic sensor 1 according to the present invention is characterized by that variations in the cross-sectional area between the bias application parts in the first and second regions is 35.4% or less.

A difference between the cross-sectional area of the first bias application part 310 in the first region 11 and the cross-sectional area of the second bias application part 320 in the second region 12 will be defined as follows.

Figure 4A:
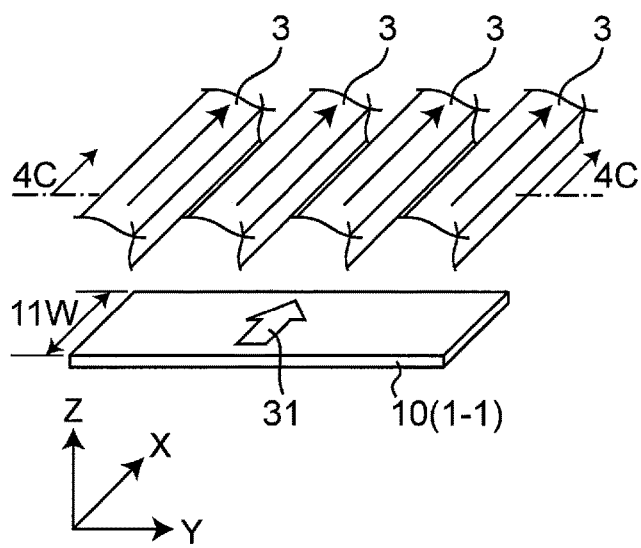
FIGS. 4A, 4B, 4C, and 4D are diagrams for explaining differences in the cross-sectional area and in the thickness between bias application parts of the bias coil.
Figure 4B:
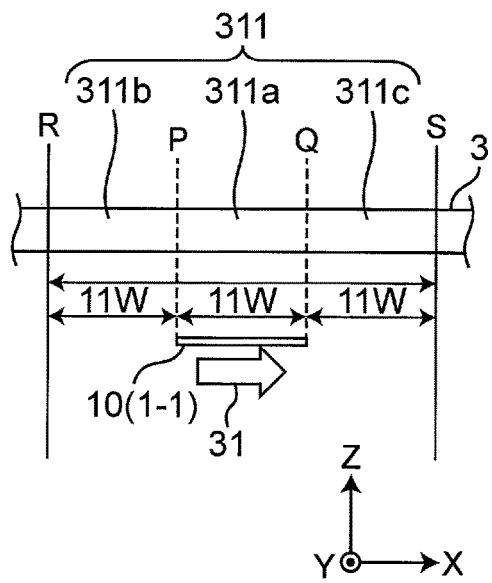
Figure 4C:
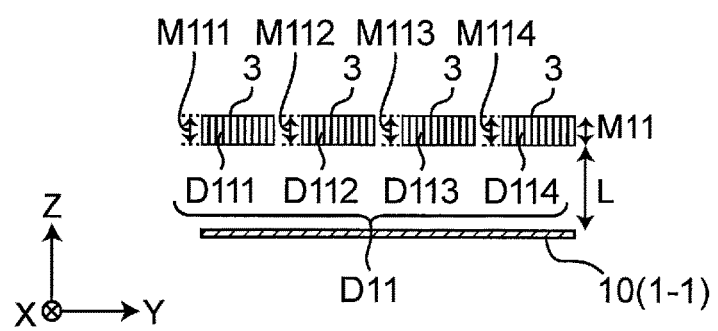
Figure 4D:
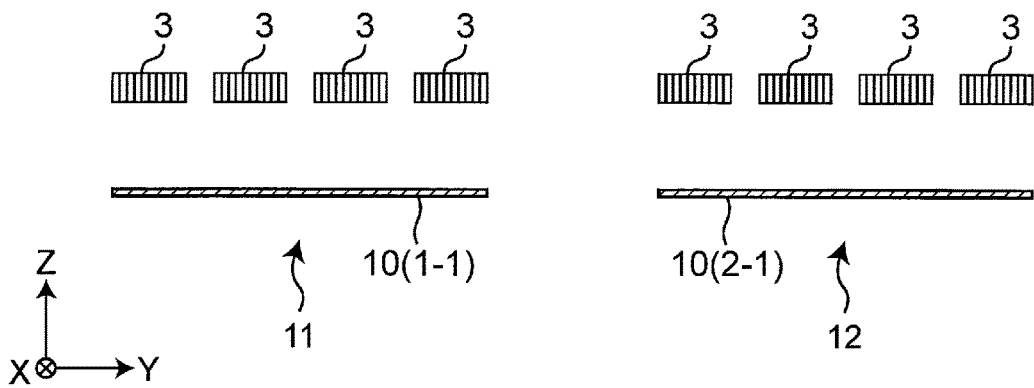

With reference to FIGS. 4A to 4D, the difference in the cross-sectional area between the bias application parts will be described below. FIG. 4A is a schematic perspective view of an element 10(1-1) and a bias coil 3 in the first region 11. FIG. 4B is a schematic side view of the element 10(1-1) and the bias coil 3 in the first region 11. FIG. 4C is a cross-sectional view of the element 10(1-1) and the bias coil 3 taken along the line 4C-4C of FIG. 4A. FIG. 4D is a cross-sectional view of the element 10(1-1) disposed in the first region 11, the element 10(2-1) disposed in the second region 12, and the bias coil 3 disposed in the first and second regions 11 and 12. FIGS. 4A to 4D illustrate four bias coils 3, but the number of bias coils 3 is not limited to four and needs only to be one or more.

With reference to FIGS. 4A to 4C, the bias application part 311 (part of the first bias application part 310 in the first region 11) that applies a bias magnetic field to the element 10(1-1) will be described by focusing on the element 10(1-1) disposed in the first region 11. Other bias application parts that apply bias magnetic fields to other elements 10(1-2, 2-1, 2-2) are substantially the same as the bias application part 331, and thus a detailed description thereof will be omitted.

The bias application part 311 of the bias coil 3 is a part that applies the bias magnetic field to the element 1-1. Specifically, as shown in FIG. 4B, the bias application part 311 includes a region positioned directly above the element 1-1 (region 311a between points P-Q), and regions positioned on both sides of the region 311a between the points P-Q (region 311b between points R-P and region 311c between points Q-S). The length (dimension along the longitudinal direction of the bias coil 3) of each of the regions 311a, 311b, and 311c is substantially equal to a width 11w of the element 1-1 (dimension in the X direction of the element 1-1, see FIG. 4A).

Here, the points P and Q indicate the positions at both ends of the element 1-1 in the side view (FIG. 4B) viewed from the direction perpendicular to the magnetosensitive direction 31 of the element 1-1 (in other words, the magnetization direction of a fixed layer of the element 1-1). The distance between the points P and Q are set at the dimension P-Q (that is identical to the width 11w of the element 1-1).

The point R is spaced apart from the point P only by the dimension P-Q in the direction opposite to the magnetosensitive direction 31. The point S is spaced apart from the point Q only by the dimension P-Q in the magnetosensitive direction 31. As viewed from the top, the points R and S are positioned outside the element 1-1.

As shown in FIG. 4C, the cross-sectional area D11 of the bias application part 311 means the total cross-sectional area of the bias application part 311 at the cross section (i.e., the cross section taken along the line 4C-4C of FIG. 4A) perpendicular to the longitudinal direction (direction in which the current flows through the bias coil 3, the X direction) of the bias coil 3. As shown in FIG. 4C, when four bias coils 3 are included, the total of the respective cross-sectional area D111, D112, D113, and D114 of the respective bias coils 3 is hereinafter referred to as a "cross-sectional area D1 of the bias application part 311".

In the region ranging from the point R to point S shown in FIG. 4B, the cross-sectional area D11 of the bias application part 311 is measured in at least four sites, and the measurement values are averaged. This average is hereinafter referred to as an "average cross-sectional area D11a of the bias application part 311".

An average cross-sectional area D12a of the bias application part 312 (see FIG. 2A) that applies the bias magnetic field to the element 1-2 is also determined in the same way.

Then, a "cross-sectional area D1 of the first bias application part 310 of the bias coil 3 in the first region 11" is defined as an average of the average cross-sectional area D11a of the bias application part 311 and the average cross-sectional area D12a of the bias application part 312.

Also, regarding a bias application part 321 (see FIG. 2A) that applies a bias magnetic field to the element 2-1 disposed in the second region 12, an average cross-sectional area D21a of the bias application part 321 (see FIG. 2A) is determined in the same procedure.

Furthermore, regarding a bias application part 322 (see FIG. 2A) that applies a bias magnetic field to the element 2-2 disposed in the second region 12, an average cross-sectional area D22a of the bias application part 322 (see FIG. 2A) is determined in the same way.

Then, a "cross-sectional area D2 of the second bias application part 320 of the bias coil 3 in the second region 12" is defined as an average of the average cross-sectional area D21a of the bias application part 321 and the average cross-sectional area D22a of the bias application part 322.

A difference between the cross-sectional area D1 of the first bias application part 310 of the bias coil 3 in the first region 11 and the cross-sectional area D2 of the second bias application part 320 of the bias coil 3 in the second region 12 can be determined by formula (5) below. That is, the difference in the cross-sectional area is defined as a value obtained by dividing the difference (D1−D2) between the cross-sectional areas D1 and D2 by an average ((D1+D2)/2) of the cross-sectional areas D1 and D2.

$$\text{Difference in Cross-Sectional Area} = (D1-D2)/((D1+D2)/2) \quad (5)$$

In the above-mentioned way, the cross-sectional area D1 of the first region 11 and the cross-sectional area D2 of the second region 12 are substituted in the above-mentioned formula (5), so that the difference in the cross-sectional area between the bias application parts of the bias coil 3 in the first and second regions 11 and 12 can be determined.

Figure 5:
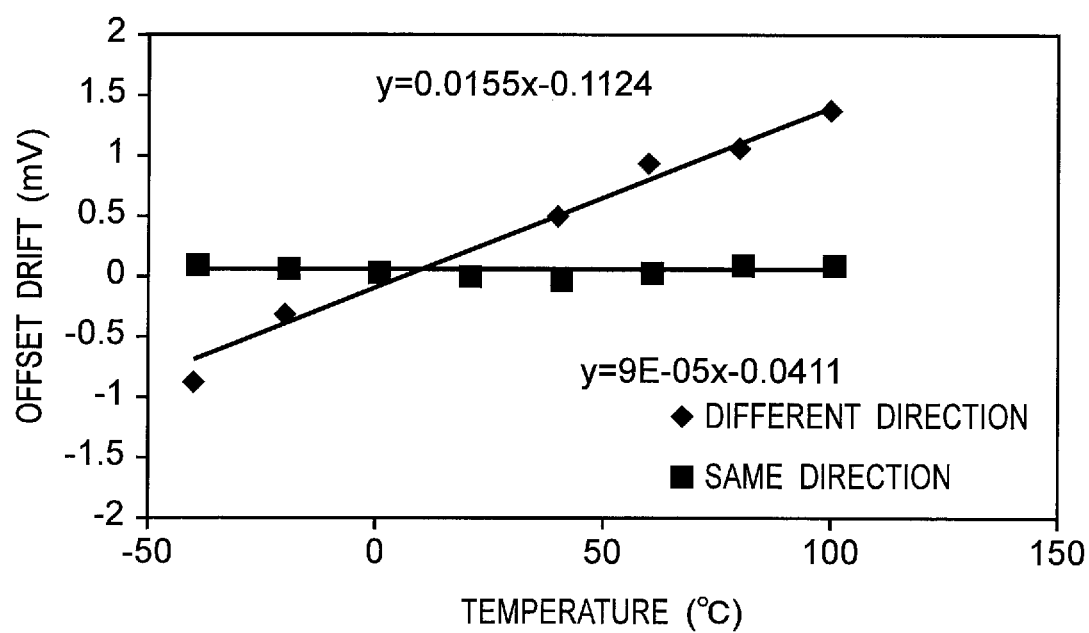
FIG. 5 is a graph showing the measurement results of changes in offset (offset drift) of the differential output relative to an environmental temperature.

FIG. 5 is a graph showing the relationship between an environmental temperature and an offset change (off set drift) of the differential output from the magnetic sensor 1. The horizontal axis of the graph indicates the environmental temperature (° C.), while the vertical axis indicates the offset drift (mV) of the differential output. Note that the offset drift is defined as a difference between a reference value Vr and an offset value Vm (i.e., offset value Vm−reference value Vr) where Vr is an offset value of a differential output at room temperature (25° C.) and Vm is an offset value at another environmental temperature.

FIG. 5 shows two graphs. The graph indicated by black diamond symbols "♦" show the measurement results in the bridge circuit 5 in a different direction state. The graph indicated by black square symbols "■" show the measurement results in the bridge circuit 5 in the same direction state.

Figure 6A:
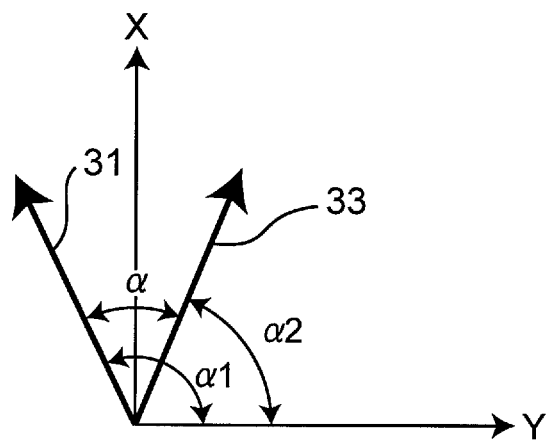
FIGS. 6A and 6B are conceptual diagrams for explaining angles formed by magnetosensitive directions of two magnetoresistive effect elements.
Figure 6B:
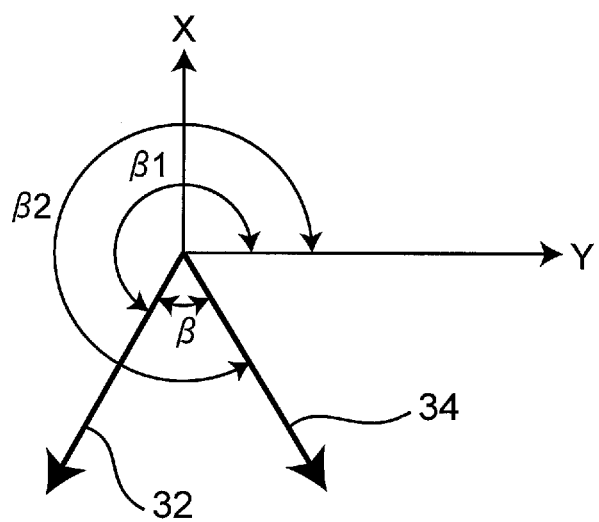

The "different direction" as used herein means that in the bridge circuit 5 shown in FIG. 1, the respective magnetosensitive directions 31 and 33 of the two elements 1-1 and 2-1 connected to the power terminal (Vcc) are not aligned with each other, while the respective magnetosensitive directions 32 and 34 of the two elements 1-2 and 2-2 connected to the ground terminal (GND) of the bridge circuit 5 are not aligned with each other. In the "different-direction bridge circuit 5" used for measurement, an angle formed by the magnetosensitive direction 31 of the element 1-1 and the magnetosensitive direction 33 of the element 2-1 is 180° (angle $\alpha$=180° as shown in FIG. 6A), and an angle formed by the magnetosensitive direction 32 of the element 1-2 and the magnetosensitive direction 34 of the element 2-2 is 180° (angle $\beta$=180° as shown in FIG. 6B).

The "same direction" as used herein means that the respective magnetosensitive directions 31 and 33 of the two elements 1-1 and 2-1 connected to the power terminal (Vcc) in the bridge circuit 5 are aligned with each other, while the respective magnetosensitive directions 32 and 34 of the two elements 1-2 and 2-2 connected to the ground terminal (GND) of the bridge circuit 5 are aligned with each other.

The bridge circuit 5 shown in FIG. 1 is used to measure the offset drift. Each element 10 in use is one having a dimension in the transverse direction, i.e., a width (dimension in the X direction shown in FIG. 2) of 10 μm, and a dimension in the longitudinal direction, i.e., a length (dimension in the Y direction shown in FIG. 2) of 100 μm. The two elements are connected in series to configure each of two sets of half-bridges (first half-bridge configured of the elements 1-1 and 1-2 and second half-bridge configured of the elements 2-1 and 2-2). These two sets of half-bridges are connected in parallel to configure the bridge circuit 5.

As shown in FIG. 5, in the bridge circuit 5 in the different-direction state, the offset drift significantly deviates from 0 mV (initial value: an offset value at the room temperature) at environmental temperature in a low temperature range (−40° C. to 0° C.) and a high temperature range (60° C. to 100° C.). For example, when the environmental temperature is −40° C., the offset drift is −0.87 mV. When the environmental temperature is 100° C., the offset drift is 1.37 mV. In either environmental temperature range, the offset drift extremely deviates from 0 mV.

On the other hand, in the bridge circuit 5 in the same-direction state, the offset drift is in a range of 0 mV to 0.15 mV at an environmental temperature from a low temperature (−40° C.) to a high temperature (100° C.) and does not deviate significantly from 0 mV.

Suppose that the magnetosensitive directions 31 and 33 of the two elements 1-1 and 2-1 connected to the power terminal (Vcc) of the bridge circuit 5, as well as the magnetosensitive directions 32 and 34 of the two elements 1-2 and 2-2 connected to the ground terminal (GND) of the bridge circuit are all the same. In this case, the offset drift does not drastically deviate from 0 mV, like the graph of the "same direction" shown in FIG. 5.

The inventors have found that the offset drift due to the environmental temperature can be suppressed by setting the respective magnetosensitive directions 31 and 33 of the two elements 1-1 and 2-1 connected to the power terminal (Vcc) of the bridge circuit 5 at the same direction and by setting the respective magnetosensitive directions 32 and 34 of the two elements 1-2 and 2-2 connected to the ground terminal (GND) of the bridge circuit 5 at the same direction. Based on these findings, the present invention has been made.

For example, when an element can be formed by a predetermined deposition method, at least two elements 1-1 and 2-1 to be connected to the power terminal (Vcc) are simultaneously formed on an upper surface 200 of the substrate 2, which can make the magnetosensitive directions 31 and 33 of the two elements 1-1 and 2-1 the same. The expression "the magnetosensitive directions of the two elements 1-1 and 2-1 are the same" as used herein means that the magnetosensitive direction 31 of the element 1-1 is not necessarily the same as the magnetosensitive direction 33 of the element 2-1 completely in a strict sense, but these magnetosensitive directions 31 and 33 need only to be substantially the same. Furthermore, the expression "the magnetosensitive directions are substantially the same" as used herein means the magnetosensitive directions are aligned with each other to an extent that the offset drift due to a change in the environmental temperature can be sufficiently reduced (for example, the offset drift can be set within a range of 05 mV to +0.5 mV in an environmental temperature range of −40° C. to 100° C.) For example, as shown in FIG. 6A, suppose that $\alpha$ is an angle formed by the magnetosensitive direction 31 of one element 1-1 and the magnetosensitive direction 33 of the other element 2-1. If $\alpha$ is equal to or more than 0° and less than 45° ($0° \leq \alpha < 45°$), the magnetosensitive directions 31 and 33 become substantially the same. Note that for $\alpha$=0°, the two magnetosensitive directions 31 and 33 are completely the same.

The X direction and Y direction shown in FIG. 6A correspond to the X direction and Y direction shown in FIG. 2A. As shown in FIG. 6A, the angle $\alpha$ formed by the two magnetosensitive directions 31 and 33 is a difference between an angle $\alpha 1$ formed by the magnetosensitive direction 31 of one element 1-1 and the Y direction and an angle $\alpha 2$ formed by the magnetosensitive direction 33 of the other element 2-1 and the Y direction.

Likewise, at least two elements 1-2 and 2-2 to be connected to the ground terminal (GND) are simultaneously formed on the upper surface 200 of the substrate 2, so that the magnetosensitive directions 32 and 34 of the two elements 1-2 and 2-2 can be made the same. The expression "the respective magnetosensitive directions of the two elements 1-2 and 2-2 are the same" as used herein means that the magnetosensitive direction 32 of one element 1-2 is not necessarily the same as the magnetosensitive direction 34 of the other element 2-2 completely in a strict sense, but these magnetosensitive directions 32 and 34 need only to be substantially the same. The expression "magnetosensitive directions are substantially the same" as used herein means the same as mentioned above. For example, as shown in FIG. 6B, suppose that $\beta$ is an angle formed by the magnetosensitive direction 32 of one element 1-2 and the magnetosensitive direction 34 of the other element 2-2. If $\beta$ is equal to or more than 0° and less than 45° ($0° \leq \beta < 45°$), the magnetosensitive directions 32 and 34 become substantially the same. Note that for $\beta$=0°, the two magnetosensitive directions 32 and 34 are completely the same.

The X direction and Y direction shown in FIG. 6B correspond to the X direction and Y direction shown in FIG. 2A. As shown in FIG. 6B, the angle $\beta$ formed by the two magnetosensitive directions 32 and 34 is a difference between an angle $\beta 1$ formed by the magnetosensitive direction 32 of one element 1-2 and the Y direction and an angle $\alpha 2$ formed by the magnetosensitive direction 34 of the other element 2-2 and the Y direction.

In the magnetic sensor 1 according to the first embodiment of the present invention, a difference in the thickness of the bias coil 3 is desirably 17.7% or less.

The difference between the thickness of the first bias application part 310 of the bias coil 3 in the first region 11 and the thickness of the second bias application part 320 thereof in the second region 12 will be defined as follows.

Returning to FIGS. 4A to 4D, the difference in the thickness between the bias application parts will be described below.

As shown in FIG. 4C, a thickness M11 of the bias application part 311 of the bias coil 3 means the thickness of the bias application part 311 at the cross section (i.e., the cross section taken along the line 4C-4C of FIG. 4A) perpendicular to the longitudinal direction (direction in which the current flows through the bias coil 3, or the X direction) of the bias coil 3. As illustrated in FIG. 4C, when four bias coils 3 are included, an average of the thicknesses M111, M112, M113, and M114 of the respective bias coils 3 is hereinafter referred to as a "cross-sectional area M11 of the bias application part 311".

In the region ranging from the point R to point S shown in FIG. 4B, the thickness M11 of the bias application part 311 is measured in at least four sites, and the measurement values are averaged. This average is hereinafter referred to as an "average thickness M11a of the bias application part 311".

Likewise, an average thickness M12a of the bias application part 312 (see FIG. 2A) that applies the bias magnetic field to the element 1-2 is also determined.

Then, a "thickness M1 of the first bias application part 310 of the bias coil 3 in the first region 11" is defined as an average of the average film thickness M11a of the bias application part 311 and the average film thickness M12a of the bias application part 312.

Also, regarding a bias application part 321 (see FIG. 2A) that applies a bias magnetic field to the element 2-1 disposed in the second region 12, an average thickness M21a of the bias application part 321 is determined in the same procedure.

Furthermore, regarding a bias application part 322 (see FIG. 2A) that applies a bias magnetic field to the element 2-2 disposed in the second region 12, an average thickness M22a of the bias application part 322 is determined in the same procedure.

Then, a "thickness M2 of the second bias application part 320 of the bias coil 3 in the second region 12" is defined as an average of the average film thickness M21a of the bias application part 321 and the average film thickness M22a of the bias application part 322.

A difference between the thickness M1 of the first bias application part 310 of the bias coil 3 in the first region 11 and the thickness M2 of the second bias application part 320 of the bias coil 3 in the second region 12 can be determined by formula (6) below. That is, the difference in the thickness M is defined as a value obtained by dividing the difference (M1−M2) between the thicknesses M1 and M2 by an average ((M1+M2)/2) of the thicknesses M1 and M2.

$$\text{Difference in Thickness} = (M1-M2)/((M1+M2)/2) \quad (6)$$

In the above-mentioned way, the thickness M1 of the first region 11 and the thickness M2 of the second region 12 are calculated and substituted in the above-mentioned formula (6), so that the difference in the thickness between the bias application parts of the bias coil 3 in the first and second regions 11 and 12 can be determined.

Furthermore, the inventors have focused on the gap distance between the element 10 and the bias coil 3 and examined an allowable range of the difference in the gap distance between the element 10 and the bias coil 3 by using the tolerance of the output potential of the magnetic sensor 1 based on the simulation result of the magnetic sensor 1.
<Simulation 2>

The simulation of the magnetic sensor 1 is performed using a magnetic sensor that is obtained by modifying parts of the magnetic sensor 1 (FIG. 3A) used in the above-mentioned simulation 1. Only the modified parts will be described below.

The thickness of the bias coil 300 (thickness of the bias application part 300) is set at 0.8 μm.

In the simulation, a gap distance between the lower surface of the bias application part 330 and the upper surface of the GMR element 100 (hereinafter referred to as a "coil-GMR distance") is changed within a range from 0 μm to 2 μm.

Figure 7:
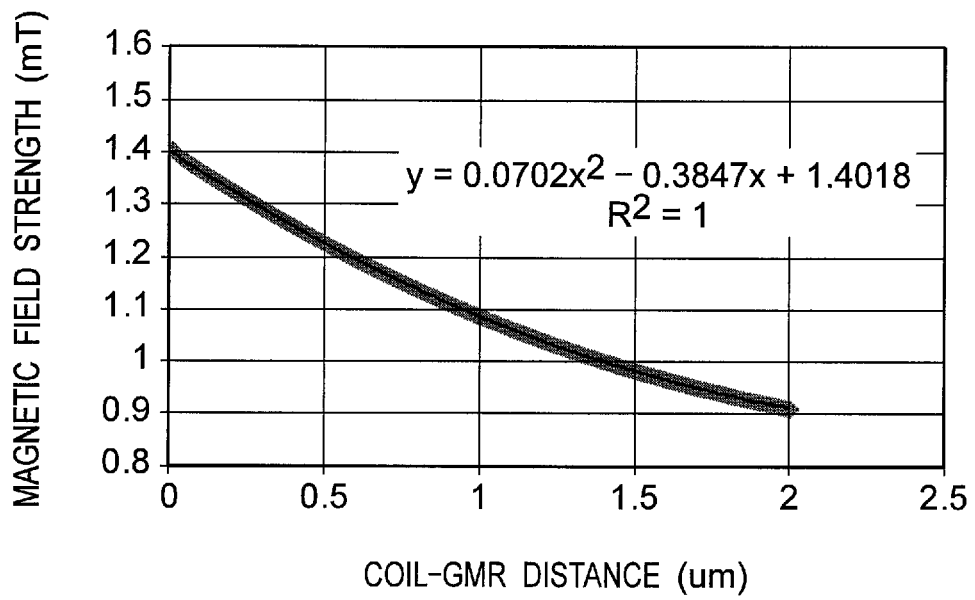
FIG. 7 shows the relationship between a distance (μm) from the magnetoresistive effect element to the bias coil and a magnetic field strength (mT).
Figure 8:
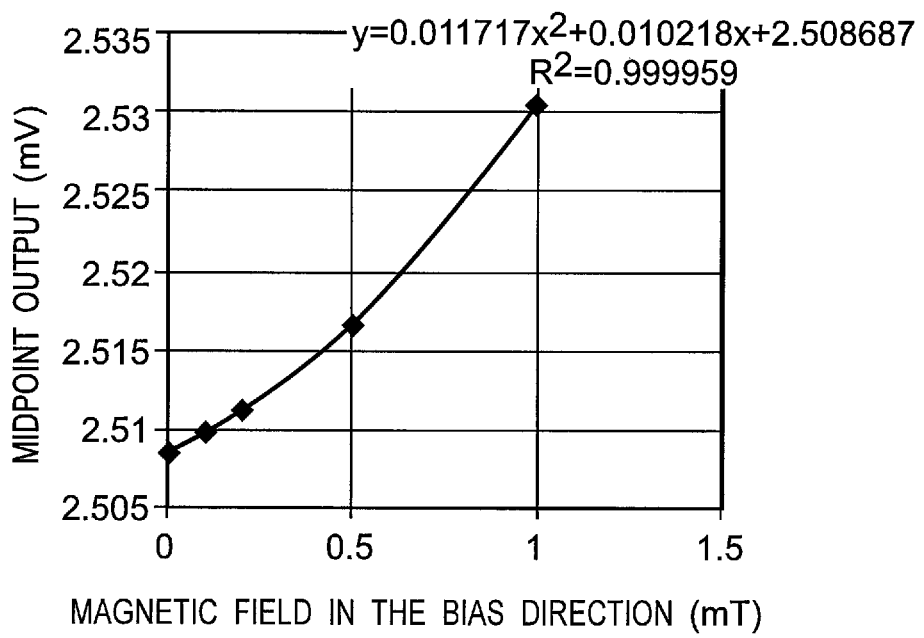
FIG. 8 is a graph showing the relationship between a magnetic field (mT) in a bias direction and a midpoint output (mV).

FIG. 7 is a graph showing the relationship between a distance between the bias coil and the element (GMR element) and a magnetic field strength. FIG. 8 is a graph showing the relationship between a magnetic field in the bias direction and a midpoint output.

The relational formula between the coil-GMR distance and the magnetic field strength received by the GMR element 100 from the bias application part 330 is represented by formula (7).

$$\text{Magnetic Field Strength (mT)} = -0.0192 \times (\text{Coil-GMR Distance (μm)}) + 0.7803 \quad (7)$$

Based on the results of studies diligently conducted by the inventors, it is found that the magnetic sensor possibly achieves the sensor variations of 0.5% or less in total while taking into account variations in the temperature and other variation factors (i.e., error factors other than the characteristics of the magnetic sensor, including an error of an amplifier and an installing error) if variations in external magnetic field of a magnetic sensor is 0.1% or less. (Note that the external magnetic field means a magnetic field other than the magnetic field of an object to be measured and the bias magnetic field, specifically, when a feedback coil is included, a magnetic field other than the magnetic field of the object to be measured, the bias magnetic field, and the feedback magnetic field.) In conclusion, it is desirable that the sensor variations of the magnetic sensor due to disturbance magnetic field is set at 0.1% or less.

A general voltage applied to the power terminal of the magnetic sensor 1 is 5 V, while a full scale of an output potential from the magnetic sensor is generally 150 mV. When the minimum detection magnetic field is set at 0.1% of the full scale, the minimum detection magnetic field is 0.15 mV (150 mV×0.1%).

When an allowable variation in the output potential of the magnetic sensor 1 due to the disturbance magnetic field is set at 0.1% or less of the minimum detection magnetic field, the allowable variation in the output potential is determined to be 0.00015 mV (0.15 mV×0.1%) or less.

As can be seen from the graph of FIG. 8, the relational formula to achieve an error of the output potential of 0.00015 mV or less is formula (8) below.

$$0.0015 = 0.011717 \times (\text{Magnetic Field Strength})^2 + 0010218 \times (\text{Magnetic Field Strength}) \quad (8)$$

After solving the formula (8), it has been found that to achieve the variation of the output potential of 0.00015 mV or less, it is necessary to restrain a difference in the magnetic field strength to 0.0144 mT or less.

From this bias magnetic field difference and the formula (7), a necessary coil-GMR distance difference is determined by the formula below:

$$0.00144=0.0702\times(\text{Distance})^2-0.3847\times\text{Distance} \quad (9)$$

By solving the formula (3), it has been found that a necessary coil-GMR distance difference needs only to be 0.0377 μm or less. The ratio of this distance difference to the thickness of the coil is determined to be 0.0377/1.3=2.9%, or less.

By solving this formula, x5−x6 is 0.0377 μm (i.e., x5−x6=0.0377 μm).

That is, to restrain variations in the magnetic field strength to 0.00144 mV or less, the coil-GMR distance difference needs to be 0.0377 μm or less.

Here, when the magnetic field strength is 1 mT, the ratio of the allowable coil-GMR distance difference (0.0377 μm) to the coil-GMR distance (the coil-GMR distance being 1.3 μm in FIG. 7) is determined to be as follows.

$$0.0377/1.3=0.029(2.9\%).$$

In this way, to restrain an allowable variation of the output potential of the magnetic sensor 1 due to the disturbance magnetic field at 0.1% or less of the detection limit (resolution), a coil-GMR distance is set at 2.9% or less relative to the coil-GMR distance measured when the magnetic field strength is 1 mT.

The consideration is made regarding the relationship between a standardized (normalized) distance (standardized as a distance of 1.3 μm) from the bias coil to the element (hereinafter a GMR element being used as the element) and the magnetic field strength as shown in FIG. 7 and the above description, as well as on the relationship between the magnetic field in the bias direction and the midpoint output as shown in FIG. 8 and the above description. These considerations leads to the following.

Simulation conditions, like the above-mentioned conditions, are set as follows: a silicon substrate is used as the substrate, and a bias coil current is set at 10 mA (assumed maximum current value). In this case, the relationship below can be obtained through approximation based on the result of simulating the magnetic field strength from the bias coil-element distance.

$$(\text{Magnetic Field Strength})=-0.0249\times(\text{Standardized Bias Coil-Element Distance})+0.7803 \quad (7)'$$

From the above-mentioned bias magnetic field difference and the formula (7)', a necessary bias coil-element distance difference is determined in the following way:

$$0.00144=-0.0249\times\text{Standardized Distance} \quad (9)'$$

By solving the formula (9)', it is found that a necessary bias coil-element distance difference needs only to be 5.78% or less.

As mentioned above, the magnetic sensor 1 should have the following relationship regarding one distance between the bias coil 3 and at least two elements 1-1 and 2-1 connected to the power terminal Vcc of the bridge circuit 5, and the other distance between the bias coil 3 and at least two elements 1-2 and 2-2 connected to the ground terminal GND of the bridge circuit 5. Specifically, a difference between these distances is preferably 5.78% or less, more preferably 2.9% or less, and even more preferably 1.9% or less.

The difference between one distance from each of the elements 1-1 and 1-2 to the bias application part of the bias coil 3 in the first region 11 and the other distance from each of the elements 2-1 and 2-2 to the bias application part of the bias coil 3 in the second region 12 will be defined as follows.

Figure 9:
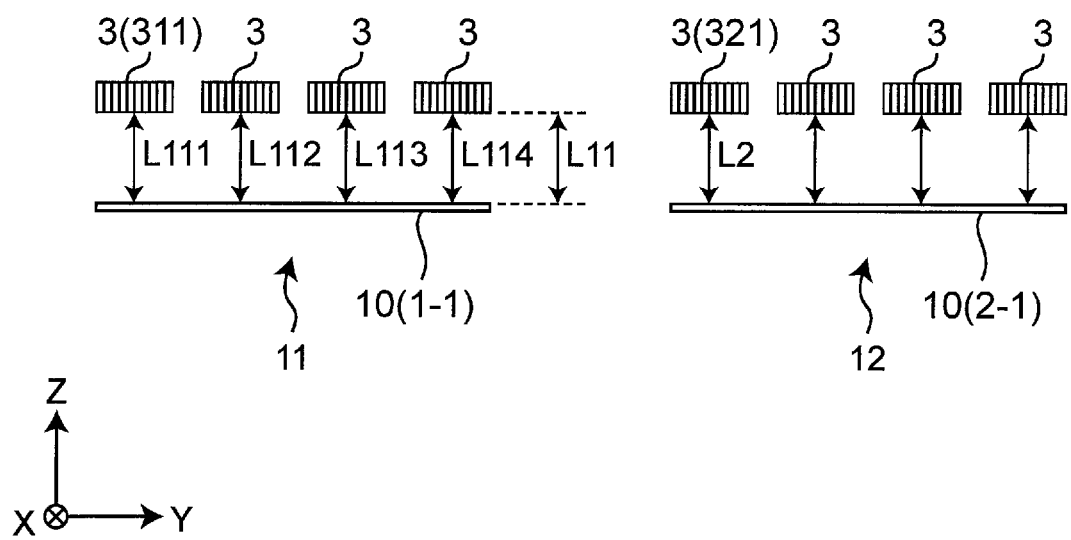
FIG. 9 is a diagram for explaining a difference in the distance from the magnetoresistive effect element to the bias application part of the bias coil.

Referring to FIGS. 4A to 4C and FIG. 9, the difference in the distance from the element to the bias application part will be described below. Note that FIG. 9 is substantially the same as FIG. 4D. As shown in FIG. 4C, the distance between the element 1-1 and the bias application part 311 of the bias coil 3 means a distance L between the upper surface of the element 1-1 and the lower surface of the bias coil 3. As illustrated in FIG. 4C, when the four bias coils 3 are included, an average of the distances L between the element 1-1 and each of the bias coils 3 (L111, L112, L113, and L114 as shown in FIG. 9) is hereinafter referred to as a "distance L11 between the element 1-1 and the bias coil 3".

In the region ranging from the point R to point S shown in FIG. 4B, the distance L11 between the element 1-1 and the bias application part 311 was measured in at least four sites, and the measurement values are averaged. This average is defined as an average distance L11a between the element 1-1 and the bias application part 311.

Furthermore, an average distance L12a regarding the distance between the element 1-2 and the bias application part 312 (see FIG. 2A) that applies the bias magnetic field to the element 1-2 is also determined in the same procedure.

Then, a "distance L1 between each of the elements 1-1 and 1-2 and the first bias application part 310 of the bias coil 3 in the first region 11" is defined as an average of the average distance L11a between the element 1-1 and the bias application part 311 and the average distance L12a between the element 1-2 and the bias application part 312.

Regarding a distance between the element 2-1 disposed in the second region 12 and the bias application part 321 (see FIG. 2A) that applies a bias magnetic field to the element 2-1, an average distance L21a between the element 2-1 and the bias application part 321 is determined in the same procedure.

Also, regarding a distance between the element 2-2 disposed in the second region 12 and the bias application part 322 (see FIG. 2A) that applies a bias magnetic field to the element 2-2, an average distance L22a between the element 2-2 and the bias application part 322 is determined in the same procedure.

Then, a "distance L2 between each of the elements 2-1 and 2-2 and the second bias application part 320 of the bias coil 3 in the second region 12" is defined as an average of the average distance L21a between the element 2-1 and the bias application part 321 and the average distance L22a between the element 2-2 and the bias application part 322.

A difference between the distance L1 from each of the elements 1-1 and 1-2 in the first region 11 to the first bias application part 310 of the bias coil 3 and the distance L2 from each of the elements 2-1 and 2-2 in the second region 12 to the second bias application part 320 of the bias coil 3 can be determined by formula (10) below. That is, the difference in the distance L is defined as a value obtained by dividing the difference (L1−L2) between the distances L1 and L2 by an average ((L1+L2)/2) of the distances L1 and L2.

$$\text{Difference in Distance}=(L1-L2)/((L1+L2)/2) \quad (10)$$

In the above-mentioned procedure, the distance L1 in the first region 11 and the distance L2 in the second region 12 are calculated and substituted in the above-mentioned formula (10), so that the difference in the distance from each of the elements 1-1, 1-2, 2-1, and 2-2 to the corresponding bias application part of the bias coil 3 between the first region 11 and the second region 12 can be determined.

The magnetic sensor 1 according to the first embodiment of the present invention can include a fixed layer and a free layer. When manufacturing the magnetic sensor 1, the respective layers (for example, the fixed layer, the free layer, and the like) of at least two elements 1-1 and 2-1 that are connected to the power terminal (Vcc) are preferably deposited simultaneously. That is, the two elements 1-1 and 2-1 are preferably formed simultaneously. In this way, the two elements 1-1 and 2-1 connected to the power terminal (Vcc) can have respective layers with identical thickness, material, magnetic properties, and the like. Furthermore, the thicknesses of the two elements 1-1 and 2-1 can be set identical to each other.

The term "thickness of the element" as used herein means an average thickness of the element.

Likewise, the respective layers (for example, the fixed layer, the free layer, and the like) of at least two elements 1-2 and 2-2 that are connected to the ground terminal (GND) are preferably formed simultaneously. In this way, the two elements 1-2 and 2-2 connected to the ground terminal (GND) can have respective layers with identical thickness, material, magnetic properties, and the like.

Consequently, the half-bridge circuit formed by the elements 1-1 and 1-2 and the half-bridge circuit formed by the elements 2-1 and 2-2 can have substantially the same magnetic-field detection characteristics.

As mentioned above, when the magnetosensitive directions of at least two elements 1-1 and 2-1 connected to the power terminal (Vcc) are the same, and/or when the magnetosensitive directions of at least two elements 1-2 and 2-2 connected to the ground terminal (GND) are the same, the offset drift of the magnetic sensor 1 due to the environmental temperature can be suppressed. For this reason, the simultaneous formation of a plurality of elements can enhance the accuracy of the magnetic sensor 1. Therefore, when using the magnetic sensor as a part of the current detector, the amount of current passing through the current line can be measured with extremely high accuracy.

In the magnetic sensor 1 according to the first embodiment of the present invention, the respective layers of all the four elements 1-1, 1-2, 2-1, and 2-2 configuring the bridge circuit 5 (namely, at least two elements 1-1 and 2-1 connected to the power terminal (Vcc) and at least two elements 1-2 and 2-2 connected to the ground terminal (GND)) may be deposited simultaneously. That is, the four elements 1-1, 1-2, 2-1, and 2-2 may be formed simultaneously.

In this way, the four elements 1-1, 1-2, 2-1, and 2-2 may be formed simultaneously, which can reduce the number of manufacturing steps, compared with when separately forming two pairs of elements pair by pair (one pair of elements 1-1 and 1-2 and the other pair of elements 2-1 and 2-2). The magnetosensitive directions of all the elements can be made the same, thereby making it possible to suppress the offset drift of the magnetic sensor 1 due to the environmental temperature. Therefore, when using the magnetic sensor as a part of the current detector, the amount of current passing through the current line can be measured with extremely high accuracy.

The expression "deposited simultaneously" as used herein means that the layers (for example, fixed layer and/or free layer) included in a plurality of elements can be deposited in the same deposition process. When depositing a plurality of layers (for example, fixed layer and free layer) simultaneously, the deposition process needs to be performed a plurality of times. Specifically, to simultaneously deposit two layers included in each element, namely, the fixed layer and the free layer, the fixed layer is formed in a first deposition process, and the free layer is formed in a second deposition process.

The simultaneous deposition of the respective layers of two or more elements can be confirmed by the material, magnetic properties, and thickness of the layers. In particular, with regard to the thickness, the layers in the plurality of elements formed on the same substrate are formed simultaneously, whereby the difference in the thickness between these layers can be decreased significantly.

In general, when using a silicon wafer of 150 mm in diameter as the substrate 2, a paramagnetic layer for forming a free layer, and a ferromagnetic layer for forming a fixed layer are deposited across the entire silicon wafer and over the silicon wafer. When forming a layer over the entire silicon wafer only in one process (one batch) by using a general deposition method (for example, sputtering), an error range of the thickness of the layer in each position of the silicon wafer relative to an average thickness is approximately 3%. Then, these layers are partially etched to isolate a plurality of elements and further to divide the silicon wafers therefrom, thereby producing the magnetic sensor 1. At this time, when the size of the magnetic sensor 1 is, for example, 2 mm×2 mm, the error of each layer is 3% or less, normally 1% or less, preferably 0.5% or less, and more preferably 0.4% or less.

In contrast, when depositing a layer of the same material on each of the surfaces of a plurality of silicon wafers by use of the same deposition device, an average thickness of the layer formed on one silicon wafer and an average thickness of the layer formed on another silicon wafer normally leads to an error of 15%. That is, the error rate of the thickness of an obtained layer in the simultaneous deposition differs by an order of magnitude from that in the deposition in another step.

Thus, in the simultaneous deposition, a difference in the thickness of the layer between the elements is extremely small, which makes it possible to easily determine whether the simultaneous deposition is performed or not.

The difference in the thickness between the elements 1-1 and 2-1 is preferably 3.0% or less, so that two elements with an extremely small difference in the thickness therebetween can be obtained. The difference in the thickness between the elements 1-1 and 2-1 is more preferably 1.0% or less, even more preferably 0.5% or less, and most preferably 0.4% or less.

The term "difference in the thickness between the elements 1-1 and 2-1" as used herein means a difference between an average thickness of the element 1-1 and an average thickness of the element 2-1.

Likewise, the difference in the thickness between the elements 1-2 and 2-2 is preferably 3.0% or less, so that two elements with an extremely small difference in the thickness therebetween can be obtained. The difference in the thickness between the elements 1-2 and 2-2 is more preferably 1.0% or less, even more preferably 0.5% or less, and most preferably 0.4% or less.

Furthermore, the difference in the thickness among the elements 1-1, 1-2, 2-1, and 2-1 and 2-2 is preferably 3.0% or less. The difference in the thickness among them is more preferably 1.0% or less, even more preferably 0.5% or less, and most preferably 0.4% or less. The term "difference in the thickness among the elements 1-1, 1-2, 2-1, and 2-2" as used herein means a difference between the maximum and minimum values among the average thicknesses of the respective elements 1-1, 1-2, 2-1, and 2-2.

In the magnetic sensor 1 according to the first embodiment of the present invention, the bias coil 3 is preferably deposited uniformly. By uniformly depositing the bias coil 3, the substantially same bias magnetic field can be applied to the elements 1-1, 1-2, 2-1, and 2-2. Because of this, the difference in the temperature characteristics of the offset can be reduced significantly in the same manner as mentioned above, thereby producing the magnetic sensor with extremely high performance. Therefore, when using the magnetic sensor as a part of the current detector, the amount of current passing through the current line can be measured with extremely high accuracy.

In the bias coil 3, a difference in the thickness between the first bias application part 310 and the second bias application part 320 is preferably 3.0% or less. The difference in the thickness therebetween is preferably 1.0% or less, and more preferably 0.5% or less.

The term "difference in the thickness of the layer" as used herein means a difference between the average thickness of the first bias application part 310 and the average thickness of the second bias application part 320.

To deposit the first bias application part 310 and the second bias application part 320 in such a manner that a difference in the thickness therebetween becomes extremely small, the first bias application part 310 and the second bias application part 320 should be deposited simultaneously.

FIG. 1 is a schematic circuit diagram of the bridge circuit 5 formed in the magnetic sensor 1 according to a first embodiment of the present invention. As shown in FIG. 2, the first region 11 and the second region 12 are formed to be adjacent to each other but spaced apart physically. As shown in FIG. 1, two elements connected in series are disposed in each of the first and second regions 11 and 12. The two elements are connected such that the magnetization directions of the fixed layers included in the respective elements are in antiparallel with each other to thereby form the half-bridge in the corresponding region.

Further, the element 1-1 illustrated on the upper side of the first region 11 and the element 2-1 illustrated on the upper side of the second region 12 are electrically connected via a first wiring 15, which is connected to the power terminal (Vcc).

The element 1-2 illustrated on the lower side of the first region 11 and the element 2-2 illustrated on the lower side of the second region 12 are electrically connected via a second wiring 16, which is connected to the ground terminal (GND).

Furthermore, in the first region 11, the element 1-1 and the element 1-2 are electrically connected via a third wiring 17, which is connected to a first output terminal (VM1). Likewise, in the second region 12, the element 2-1 and the element 2-2 are electrically connected via a fourth wiring 18, which is connected to a second terminal (VM2).

In this way, the four elements are connected to form the bridge circuit 5.

As shown in FIG. 1, the expression "at least two elements connected to the power terminal of the bridge circuit" as used herein means the elements 1-1 and 2-1 connected to the power terminal (Vcc) among the four elements 1-1, 1-2, 2-1, and 2-2 configuring the bridge circuit 5. The expression "at least two elements connected to the ground terminal of the bridge circuit" as used herein means the elements 1-2 and 2-2 connected to the ground terminal (GND) among the four elements 1-1, 1-2, 2-1, and 2-2 configuring the bridge circuit 5.

It is preferred that "at least two elements are connected to the power terminal of the bridge circuit", in other words, that the magnetosensitive direction of element 1-1 on the power terminal (Vcc) side in the first region 11 is made the same as that of the element 2-1 on the power terminal (Vcc) side in the second region 12. Likewise, it is preferred that "at least two elements are connected to the ground terminal of the bridge circuit", in other words, that the magnetosensitive direction of element 1-2 on the ground terminal (GND) side in the first region 11 is made of the elements as that of the element 2-2 on the ground terminal (GND) side in the second region 12. Here, when the elements 1-1, 1-2, 2-1, and 2-2 are a GMR or TMR with a fixed layer, the magnetization direction of the fixed layer becomes the magnetosensitive direction. With this arrangement, the same kind of elements, namely, the element 1-1 and the element 2-1, or the element 1-2 and the element 2-2 can be deposited one time, so that the circuit configurations in the respective half bridges can be the same, thereby significantly reducing a difference in the temperature characteristics of the offset therebetween.

In each of the first and second regions 11 and 12, the two elements are configured to form the half bridge with the magnetization directions of the respective fixed layers of these elements being in antiparallel with each other. Further, a difference between a midpoint output obtained between the elements 1-1 and 1-2 (an output from the first output terminal VM1) and a midpoint output obtained between the elements 2-1 and 2-2 (an output from the second output terminal VM2) is taken, thereby producing a larger output depending on the magnitude of the disturbance magnetic field. Thus, the measurement of a current value can be easily obtained when measuring the amount of current.

As shown in FIGS. 2, 4, and 9, in the magnetic sensor 1 according to the first embodiment of the present invention, the bias coil 3 is used as means for applying bias magnetic fields 41 and 42. If a permanent magnet or the like is employed as the means for applying a bias magnetic field, a magnetic force of the permanent magnet might be reduced, or its original magnetic force does not be recovered when the magnetic sensor 1 in use is under a high temperature. Consequently, the magnetic sensor 1 might not exhibit its own function. However, the use of the bias coil 3 as the means for applying the bias magnetic field does not reduce the magnetic force of the bias coil 3 even when the magnetic sensor 1 is used under a high temperature, and thus the magnetic sensor 1 acts appropriately.

As shown in FIG. 2, in the magnetic sensor 1 according to the first embodiment, one bias coil 3 is formed in a ring shape over the main surface of the substrate 2. As illustrated in FIG. 2, in parts of the bias coil 3, there are a first linear part 21 (a part of the first linear part 21 being overlapped with the element in the top view and corresponding to the bias application part in the present invention), and a second linear part 22 (likewise, a part of the second linear part 22 being overlapped with the element in the top view and corresponding to the bias application part in the present invention). The first linear part 21 and the second linear part 22 are connected by a third linear part 23, a fourth linear part 24, a curved part, and the like. In the present invention, if the first linear part 21 and the second liner part 22 in the bias coil 3 are formed in a straight-line shape, other parts, i.e., the third linear part 23 and the fourth linear part 24 are not necessarily formed in a straight-line shape.

Referring to FIG. 2, the bias coil 3 is formed of one ring-shaped line. Alternatively, as shown in FIGS. 4A to 4C, the bias coils 3 may be configured of a plurality of lines. In this case, the plurality of lines is formed and disposed at equal intervals while each line forms a closed state. The bias coils 3 are configured such that the same amount of current flows in the same direction through the plurality of closed lines.

Alternatively, the bias coil 3 may be formed in a substantially rectangular spiral shape by repeatedly bending a line extended in one direction. The bias coil 3 with the substantially rectangular spiral shape formed in this way forms the first linear part 21 and the second linear part 22 with their bias magnetic fields that are substantially parallel to each other.

The first linear part 21 applies the bias magnetic field to the elements 1-1 and 1-2 provided in the first region 11. The second linear part 22 applies the bias magnetic field to the elements 2-1 and 2-2 provided in the second region 12. The direction of the bias magnetic field 41 applied by the first linear part 21 is perpendicular to the magnetization direction of the fixed layer in each of the elements 1-1 and 1-2, and is oriented leftward when viewing the substrate 2 from its top. The direction of the bias magnetic field 42 applied by the second linear part 22 is perpendicular to the magnetization direction of the fixed layer in each of the elements 2-1 and 2-2, and is oriented rightward when viewing the substrate 2 from its top. Thus, in the magnetic sensor 1 according to the first embodiment, the bias magnetic field applied to the first region 11 is oriented in an opposite direction to the bias magnetic field applied to the second region 12.

The shape of the bias coil 3 is not limited to one shown in FIG. 2, but may be any ring shape as long as the first linear part 21 and the second linear part 22 are opposed in parallel with each other and the bias coil 3 can apply the bias magnetic field to the first and second regions 11 and 12 to cause the applied bias magnetic fields for the first and second linear parts 21 and 22 to be oriented opposite.

In the magnetic sensor 1 according to the first embodiment of the present invention, each of the first and second regions 11 and 12 is provided with at least two elements, each element including at least a fixed layer and a free magnetic layer that has its magnetization direction varying in accordance with the disturbance magnetic field with respect to the magnetization direction of the fixed layer. The elements suitable for use can include a GMR element or a TMR element. Here, it is apparent that the element may include a layer other than the fixed layer and the free magnetic layer.

In the magnetic sensor 1 according to the first embodiment of the present invention, a difference between the magnetic field in the first region 11 and the magnetic field in the second region 12 may be output, and the output difference may change in proportion to the magnetic field. In this way, the difference between the magnetic fields in the first and second regions 11 and 12 is output, and the output difference changes in proportion to the magnetic field, so that the magnitude of the current value and the direction of the current can be identified when used as, for example, a magnetic field detecting element for a current sensor. When used as the magnetic sensor, the position, direction, and the like can be identified.

In the magnetic sensor 1 according to the first embodiment of the present invention, the bias coil is preferably disposed such that the bias magnetic field generated by the bias coil is applied to the element on the main plane in a direction perpendicular to the magnetosensitive direction of the element.

Figure 10:
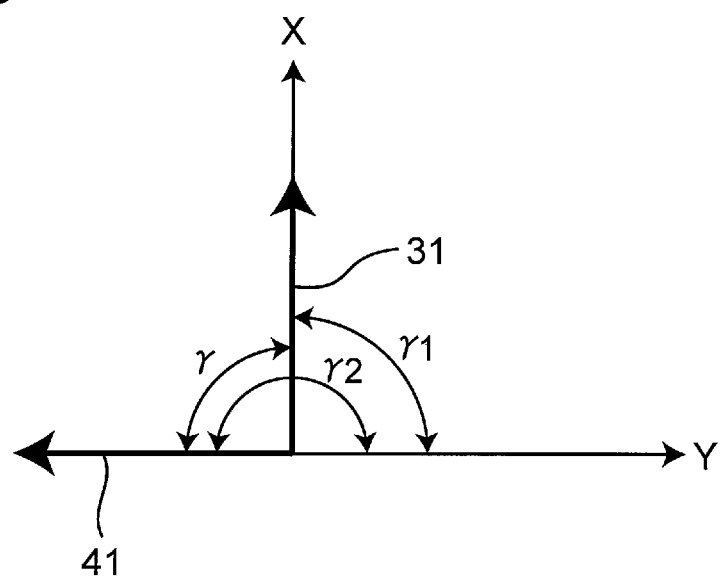
FIG. 10 is a diagram for explaining an angle formed by a bias magnetic field direction of the bias coil and a magnetosensitive direction of the magnetoresistive effect element.

However, the bias magnetic field is not limited to one that is applied to the element in the direction perpendicular to the magnetosensitive direction of the element. As shown in FIG. 10, the bias magnetic field 41 generated by the bias coil 3 (bias applied part 311) may be inclined with respect to the magnetosensitive direction 31 of the element 1-1 such that an angle γ formed by the bias magnetic field direction 41 of the bias coil 3 and the magnetosensitive direction 31 of the element 1-1 is more than 0° and less than 180° (0°<γ<180°). The same goes for other elements. Each of an angle formed by the bias magnetic field direction 42 and the magnetosensitive direction 32 of the element 1-2, an angle formed by the bias magnetic field direction 43 and the magnetosensitive direction 33 of the element 2-1, and an angle formed by the bias magnetic field direction 44 and the magnetosensitive direction 32 of the element 2-2 may be more than 0° and less than 180°. Note that in FIG. 10, the bias magnetic field direction is −Y direction, and the magnetosensitive direction is the X direction.

In the magnetic sensor 1 according to the first embodiment of the present invention, the element is, particularly, a giant magnetoresistive element with a fixed layer. The magnetization direction of the fixed layer corresponds to the magnetosensitive direction. With this arrangement, the output can be enhanced, and the polarity of the magnetic field can be determined without using a bias application method for discriminating the polarity, such as a barber pole structure.

A method for manufacturing method a magnetic sensor 1 shown in FIGS. 2A and 2B will be described below.

<1. Preparation of Substrate>

The substrate 2 with the main surface 200 is prepared. A silicon wafer can be used as the substrate. When using the silicon wafer, the elements 10 and the like are formed over the silicon wafer, followed by dicing the silicon wafer for singulation. Note that the silicon wafer may be previously singulated and then used as the substrate.

<2. Formation of Bridge Circuit 5>

The power terminal Vcc, the ground terminal GND, and four elements 10 are formed on the main surface 200 of the substrate 2, and then the elements are appropriately connected to the terminal Vcc or GND by wiring, thereby forming the bridge circuit 5.

The power terminal Vcc, the ground terminal GND, and the wiring are formed of metal films, and can be formed by a known deposition method (plating, CVD, PVD, and the like).

The fixed layer and the free layer included in the element 10 can be formed by the known deposition methods, but are preferably formed, particularly, by sputtering. The sputtering can form an extremely uniform film with small errors, and thus can decrease a difference in the thickness among the elements formed on the same substrate.

In the elements 1-1 and 2-1 connected to the power terminal Vcc, the fixed layers or free layers (preferably, the fixed layers and free layers) are deposited simultaneously. In this way, the difference in the thickness between the layers included in the elements 1-1 and 2-1 can be extremely set small (for example, the difference in the thickness being 1.0% or less).

Likewise, in the elements 1-2 and 2-2 connected to the ground terminal GND, the fixed layers or free layers (preferably, the fixed layers and free layers) are deposited simultaneously. In this way, the difference in the thickness between the layers included in the elements 1-2 and 2-2 can be extremely set small (for example, the difference in the thickness being 1.0% or less).

In all the elements 1-1, 1-2, 2-1 and 2-2, the fixed layers or free layers (preferably, the fixed layers and free layers) may be deposited simultaneously.

<3. Formation of Bias Coil 3>

The bias coil 3 is formed over the elements 10. The first bias application part 310 and the second bias application part 320 included in the bias coil 3 are preferably deposited simultaneously. In this way, the difference in the thickness between the first bias application part 310 and the second bias application part 320 can be extremely set small (for example, the difference in the thickness being 1.0% or less).

The bias coil is formed of a metal film, and can be formed by a known deposition method (plating, CVD, PVD, and the like). In particular, the sputtering or a combined process of the sputtering and plating may be preferably used for the deposition. The sputtering or the combined process of the sputtering and the plating can form a uniform film with an extremely small error. Thus, the magnetic field strength of the bias magnetic field applied to the first region 11 (where the elements 1-1 and 1-2 are disposed) positioned under the first bias application part 310 can be set equal to that of the bias magnetic field applied to the second region 12 (where the elements 2-1 and 2-2 are disposed) positioned under the second bias application part 320.

<Singulation of Magnetic Sensor 1>

The silicon wafer is singulated to produce the magnetic sensors 1, each including the silicon substrate 2.

Note that the silicon wafer may be singulated, for example, before forming the bias coil. When dividing the silicon wafer, a part (first substrate) including the first region 11 where the elements 1-1 and 1-2 are disposed and a part (second substrate) including the second region 12 where the elements 2-1 and 2-2 are disposed may be singulated independently. In this case, the first substrate and the second substrate are fabricated from an arbitrary position on the same wafer, so that the elements can be formed simultaneously on these substrates, thereby decreasing a difference in the thickness between the elements.

As mentioned above, the magnetic sensor 1 according to the first embodiment is less susceptible to variation factors depending on a change in the temperature and the disturbance magnetic field, and can achieve downsizing and reduction in its weight as the whole, thereby making it possible to detect a large current with high accuracy.

Second Embodiment

A magnetic sensor 1 according to a second embodiment will be described in detail below. Parts different from those in the first embodiment will be described below, and a description of the same parts as those in the first embodiment will be omitted below.

In the first embodiment, the bias magnetic field direction 42 in the second region 12 is opposite to the bias magnetic field direction 41 in the first region 11, whereas in the second embodiment, the bias magnetic field direction in the second region 12 is the same as that of the bias magnetic field direction in the first region 11. The second embodiment differs from the first embodiment in this point.

Figure 11:
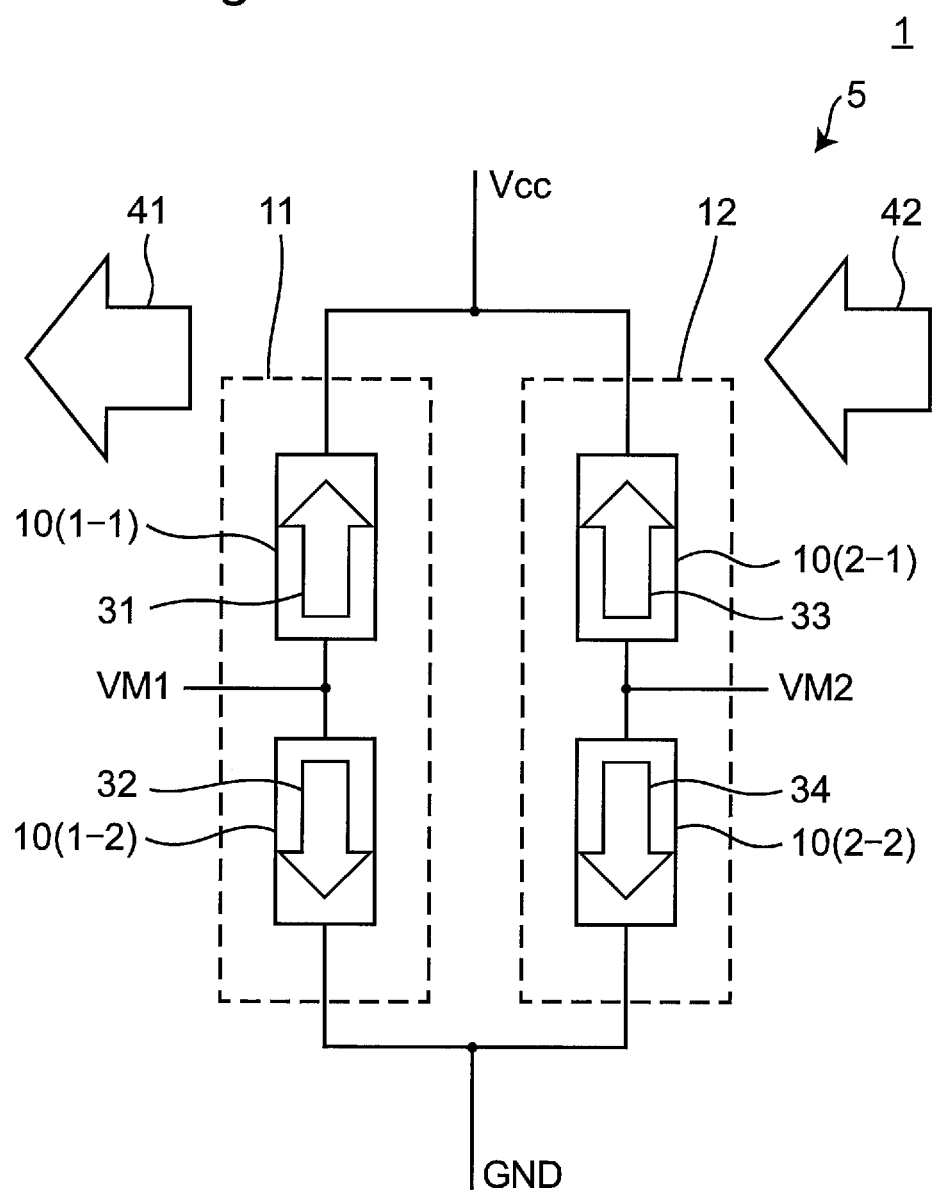
FIG. 11 is a schematic circuit diagram of a magnetic sensor according to a second embodiment.
Figure 12:
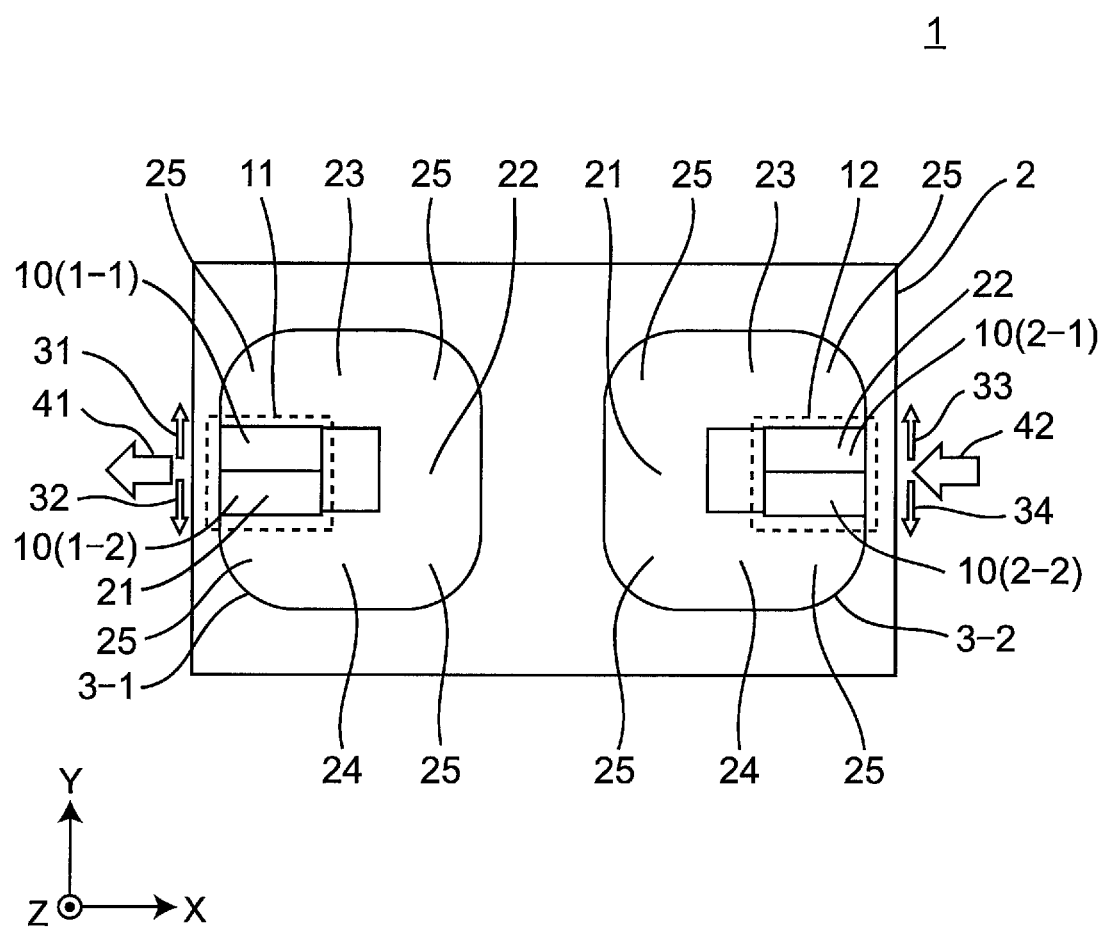
FIG. 12 is an element arrangement diagram of the magnetic sensor according to the second embodiment.

FIG. 11 is a schematic circuit diagram of a magnetic sensor 1 according to the second embodiment; and FIG. 12 is a diagram showing an element arrangement of the magnetic sensor 1 in the second embodiment. As shown in FIG. 12, the bias magnetic field direction is the Y direction, while the magnetosensitive direction is the X direction or –X direction.

FIG. 11 schematically shows the bridge circuit 5 including the elements 1-1 and 1-2 in the first region 11 and the elements 2-1 and 2-2 in the second region 12 and the bias magnetic field directions 41 and 42 only. In contrast, FIG. 12 further shows the bias coil 3 disposed to generate the bias magnetic field shown in FIG. 11, in addition to the elements 1-1, 1-2, 2-1, and 2-2. Here, as shown in FIG. 12, the bias coil 3 is formed to be vertically spaced apart from the two elements 1-1 and 1-2 and the two elements 2-1 and 2-2 but arranged to be overlapped with the two elements 1-1 and 1-2 and the two elements 2-1 and 2-2 in the top view. The bias coil 3 applies the bias magnetic fields to the elements 1-1, 1-2, 2-1, and 2-2.

As shown in FIG. 11, the bias magnetic field directions 41 and 42 are perpendicular to the magnetosensitive directions 31, 32, 33, and 34 of the elements 1-1, 1-2, 2-1, and 2-2 (when the element has the fixed layer, the magnetization direction of the fixed layer is the magnetosensitive direction; the same goes for the present specification.) Furthermore, the direction 41 of the bias magnetic field applied to the first region 11 is the same as the direction 42 of the bias magnetic field applied to the second region 12. In FIG. 11, both the direction 41 of the bias magnetic field applied to the first region 11 and the direction 42 of the bias magnetic field applied to the second region 12 are oriented leftward, but these directions 41 and 42 are not limited thereto and may be oriented rightward.

In this way, the magnetic field direction of the bias magnetic field applied to the first region 11 is set to be the same as that of the bias magnetic field applied to the second region 12, thereby significantly reducing a change in the output due to the disturbance magnetic field in the direction perpendicular to a magnetic sensitive axis.

To apply the bias magnetic fields 41 and 42 as shown in FIG. 11, for example, two bias coils, namely, a first bias coil 3-1 and a second bias coil 3-2 can be used in the magnetic sensor 1 of the second embodiment, as illustrated in FIG. 12, to cause the current to pass in the respective appropriate directions, thereby applying the bias magnetic fields. Referring to FIG. 12, each of the first bias coil 3-1 and the second bias coil 3-2 is formed in a ring shape over the main surface of the substrate 2. As shown in FIG. 12, a first linear part 21 (corresponding to the bias application part of the present invention) is formed in a part of the first bias coil 3-1. In the application part of the first bias coil 3-1, current needs only to flow to apply the bias magnetic field 41, but a bypass part of the bias coil is not limited to one shown in FIG. 12. Furthermore, as shown in FIG. 12, the second bias coil 3-2 is configured to cause current to flow to apply the bias magnetic field 42, like the first bias coil 3-1. A second linear part 22 of the second bias coil 3-2 corresponds to the bias application part of the present invention.

The first linear part 21 of the first bias coil 3-1 applies the bias magnetic field to the elements 1-1 and 1-2 provided in the first region 11. The second linear part 22 of the second bias coil 3-2 applies the bias magnetic field to the elements 2-1 and 2-2 provided in the second region 12. The direction of the bias magnetic field 41 applied by the first linear part 21 of the first bias coil 3-1 is perpendicular to the magnetization directions 31 and 32 of the fixed layers in the elements 1-1 and 1-2, and is oriented leftward when viewing the substrate 2 from its top. The direction of the bias magnetic field 42 applied by the second linear part 22 of the second bias coil 3-2 is perpendicular to the magnetization directions 33 and 34 of the fixed layers in the elements 2-1 and 2-2, and is oriented leftward when viewing the substrate 2 from its top. Thus, in the magnetic sensor 1 according to the second embodiment, the bias magnetic field applied to the first region 11 is oriented in the same direction as the bias magnetic field applied to the second region 12.

In the above description, two bias coils are used to set the bias magnetic field applied to the first region 11 and the bias magnetic field applied to the second region 12 in the same direction. Alternatively, a bias coil may be formed laterally in an 8 shape. An upper linear part of the 8 shape (which corresponds to the left-side linear part when the 8 shape is laid on the left side) is configured to apply the bias magnetic field to the first region 11. A lower linear part of the 8 shape (which corresponds to the right-side linear part when the 8 shape is laid on the left side) is configured to apply the bias magnetic field to the second region 12. In this way, even when using only one bias coil, the bias magnetic field applied to the first region 11 can be set in the same direction as the bias magnetic field applied to the second region 12. The use of the two bias coils will be described below.

As mentioned above, in the magnetic sensor 1 according to the second embodiment of the present invention, the bias magnetic fields are applied such that the bias magnetic fields applied to the elements 1-1, 1-2, 2-1, and 2-2 are perpendicular to the magnetization direction of the fixed layer. To achieve such application, the first linear part 21 of the first bias coil 3-1 is disposed on the first region 11, while the second linear part 22 of the second bias coil 3-2 is disposed on the second region 12. As mentioned above, by applying the bias magnetic fields to the elements 1-1, 1-2, 2-1, and 2-2 in the direction perpendicular to the respective magnetization directions of the fixed layers, a hysteresis error due to a soft magnetic part of the element is reduced, and concurrently an operating range of the element for a measurement magnetic field can be spread most widely, thus maintaining the symmetry of the output with respect to positive and negative magnetic fields.

The use of the bias coil 3 to apply the bias magnetic field can eliminate the need for an external magnet for application of a bias magnetic field, thereby maintaining the performance of the magnetic sensor under a high-temperature environment. The two half bridges and the bias coil 3 are fabricated over the same substrate 2, which can decrease the number of parts.

The magnetic sensor 1 according to the second embodiment is less susceptible to variation factors depending on a change in the temperature and the disturbance magnetic field, and can achieve downsizing and reduction in its weight as the whole, thereby making it possible to detect current in a wide range, including a large current, with high accuracy.

Figure 13A:
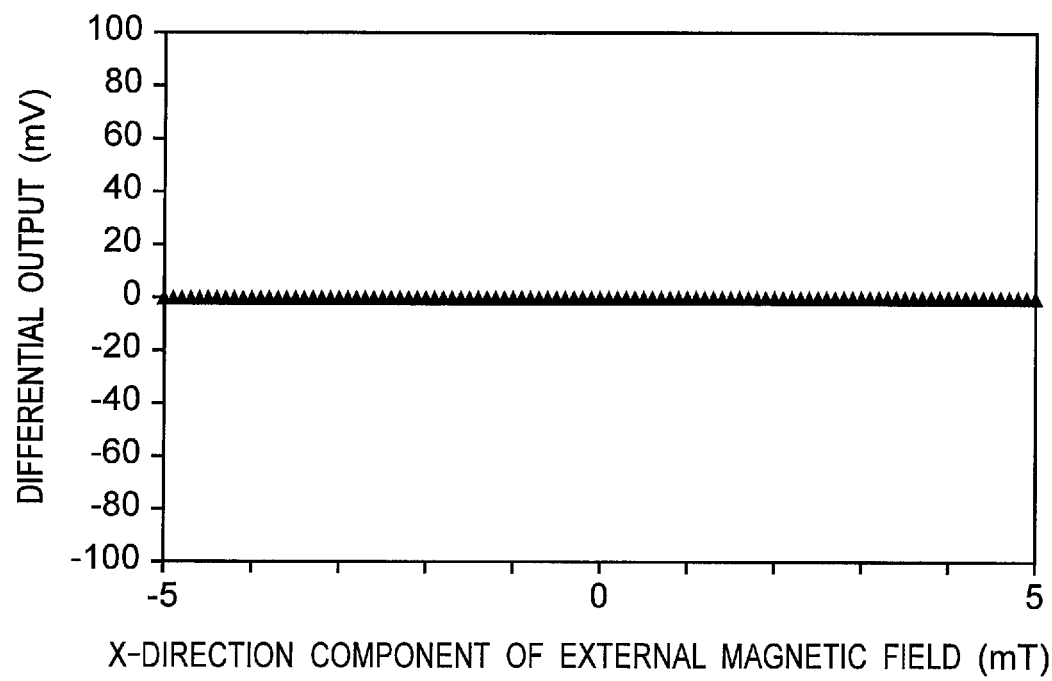
Figure 13B:
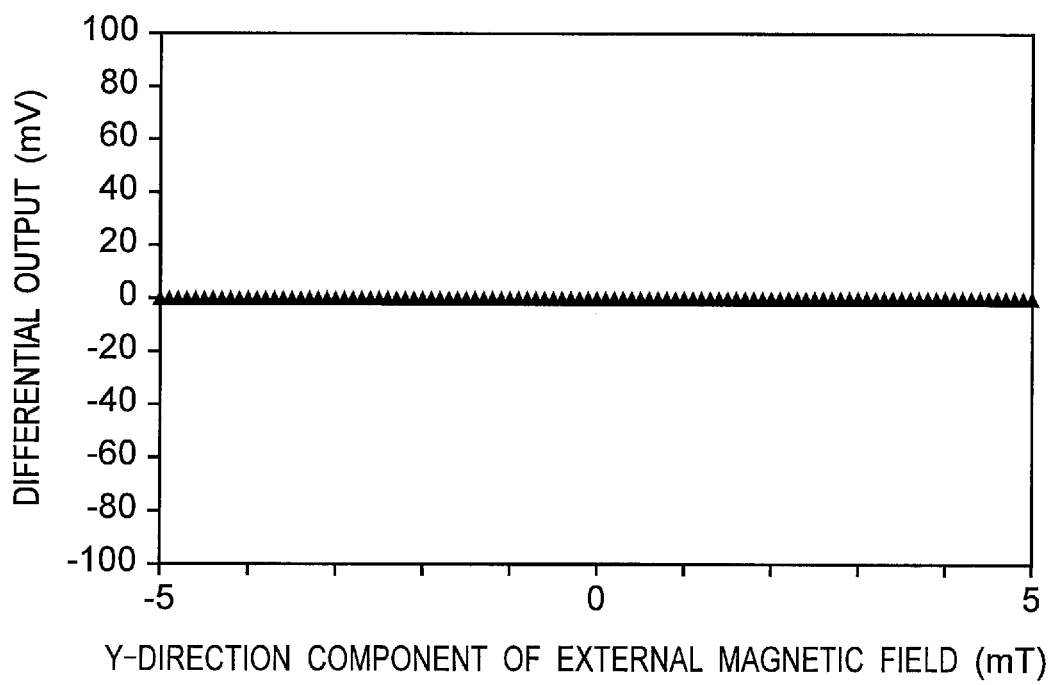

FIGS. 13A and 13B are graphs obtained by measuring changes in the differential output when a disturbance magnetic field changes in the magnetic sensor 1 according to the second embodiment of the present invention, in which FIG. 13A indicates a component in parallel with the magneto-sensitive direction as the X direction component, while FIG. 13B indicates a component in parallel with the direction of the bias magnetic fields as the Y direction component. Here, in FIGS. 13A and 13B, the fixed layers included in the two elements 1-1 and 2-1 in use connected to the power terminal (Vcc) are simultaneously formed, and the free layers included in these elements 1-1 and 2-1 in use are simultaneously formed. Furthermore, the fixed layers included in the two elements 1-2 and 2-2 in use connected to the ground terminal (GND) are simultaneously formed, and the free layers included in these elements 1-2 and 2-2 in use are simultaneously formed. As shown in FIG. 13A, measured values do not change even when the disturbance magnetic field from the X direction (the magnetic sensitive axis) varies, which can achieve the high-accuracy measurement. As shown in FIG. 13B, the output is not affected by the disturbance magnetic field in the Y direction.

As mentioned above, in the magnetic sensor 1 according to the second embodiment, as shown in FIG. 12, the direction 41 of the bias magnetic field applied to the first region 11 is set to be the same as the direction 42 of the bias magnetic field applied to the second region 12, thereby significantly reducing a change in the output due to the disturbance magnetic field in the direction (Y direction) perpendicular to the magnetic sensitive axis.

Third Embodiment

The magnetic sensor 1 according to a third embodiment will be described in detail below. Likewise, parts different from those in the first and second embodiments will be described below, and a description of the same parts as those in the first and second embodiments will be omitted below.

The second embodiment does not include a feedback coil 57, whereas the third embodiment includes the feedback coil 57. The third embodiment differs from the second embodiment in this point.

Figure 14:
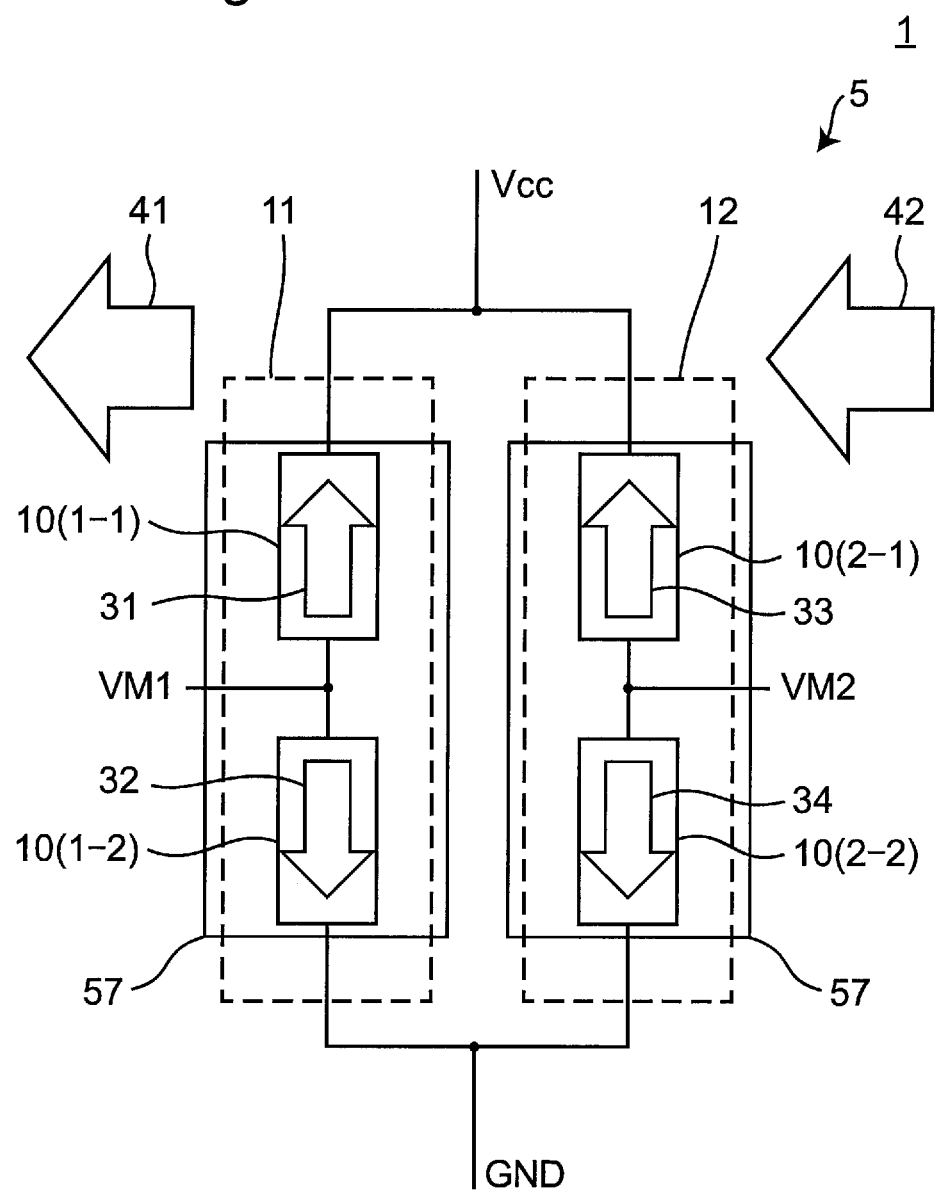
FIG. 14 is a schematic circuit diagram of a magnetic sensor according to a third embodiment.

FIG. 14 is a schematic circuit diagram of a magnetic sensor 1 according to the third embodiment. As shown in FIG. 14, the magnetic sensor 1 according to the third embodiment further includes feedback coils 57 that hold the balance between the differential outputs of the two half bridges with respect to the two half bridges to which the bias magnetic field is applied. Here, in the third embodiment, one feedback coil 57 is provided in the first region 11, and another feedback coil 57 is provided in the second region 12. In more detail, as shown in FIG. 18, in the first region 11, the feedback coil 57 is spaced vertically apart from the bias coil 3-1 and positioned on the opposite side of the elements 1-1 and 1-2 with respect to the bias coil 3-1. The feedback coil 57 are arranged to be overlapped with the two elements 1-1 and 1-2 and the bias coil 3-1 in the top view. Likewise, in the second region 12, the feedback coil 57 is spaced vertically apart from the bias coil 3-2 and positioned on the opposite side of the elements 2-1 and 2-2 with respect to the bias coil 3-2. The feedback coil 57 are arranged to be overlapped with the two elements 2-1 and 2-2 and the bias coil 3-2 in the top view. In this way, the feedback coils 57 are provided in the first region 11 and the second region 12, thereby making it possible to enhance the linearity of the output from the bridge circuit 5, enabling the high-accuracy measurement.

Thus, the magnetic sensor 1 according to the third embodiment can execute the measurement with high accuracy because of the high linearity of the output, and thereby can perform the control and management of the current and a device with a driving part with high accuracy.

As mentioned above, the third embodiment can provide the magnetic sensor that can easily measure the current amount while exhibiting the high linearity of the output from the bridge circuit.

Fourth Embodiment

A magnetic sensor 1 according to a fourth embodiment will be described in detail below. Likewise, parts different from those in the first to third embodiments will be described below, and a description of the same parts as those in the first to third embodiments will be omitted below.

In the first to third embodiments, the magnetization directions 31 and 32 of the fixed layers in the two elements 1-1 and 1-2 formed in the first and second regions 11 and 12 are opposite to each other. Furthermore, the directions 41 and 42 of the bias magnetic fields applied to the elements 1-1 and 2-1 are the same as the directions 41 and 42 of the bias magnetic fields applied to the elements 1-2 and 2-2. On the other hand, in the fourth embodiment, the magnetization directions 31, 32, 33, and 34 of the fixed layers in the two elements 1-1 and 1-2 of the first region 11 and in the two elements 2-1 and 2-2 of the second region 12 are the same. Furthermore, the directions 41 and 42 of the bias magnetic fields applied to the elements 1-1 and 2-1 are opposite to the directions 43 and 44 of the bias magnetic fields applied to the elements 1-2 and 2-2. In these points, the fourth embodiment differs from the first to third embodiments.

Figure 15:
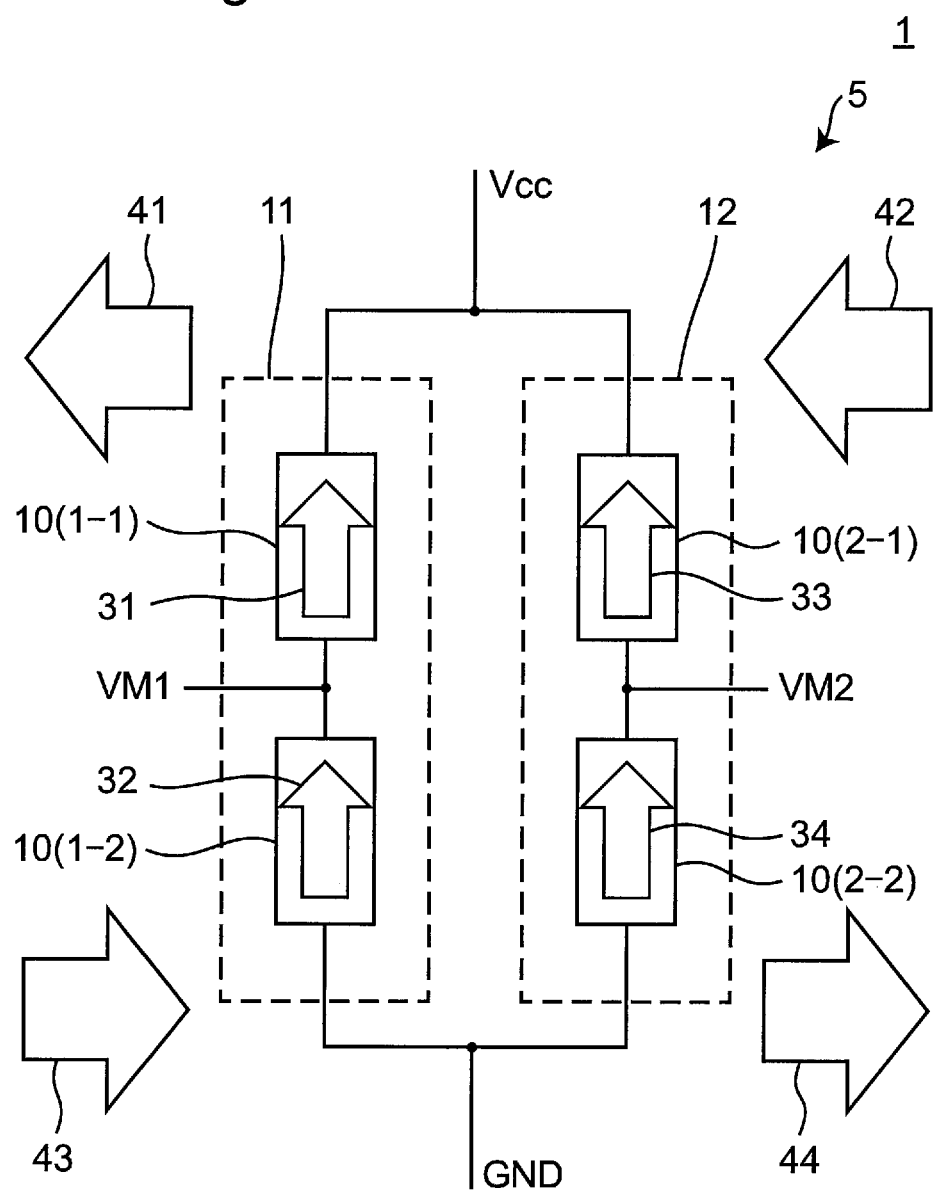
FIG. 15 is a schematic circuit diagram of a magnetic sensor according to a fourth embodiment.

FIG. 15 is a schematic circuit diagram of a magnetic sensor 1 according to a fourth embodiment. As illustrated in FIG. 15, two elements 1-1 and 1-2 and two elements 2-1 and 2-2 are provided in the first region 11 and the second region 12, respectively. Each of the first region 11 and the second region 12 needs only to contain at least one element. One element disposed in the first region 11 and another element disposed in the second region 12 can function as the magnetic sensor. When each of the regions includes one element, the element 1-1 and the element 2-1 are, for example, connected in parallel with the power terminal (Vcc) and the ground terminal (GND).

Now, a description will be given on the two elements 1-1 and 1-2 and two elements 2-1 and 2-2 that are included in the first region 11 and the second region 12, respectively.

As shown in FIG. 15, in the magnetic sensor 1 according to the fourth embodiment, the two elements in each of the first and second regions 11 and 12 are connected in series to form the half bridge. In the first region 11, the magnetization directions 31 and 32 of the fixed layers in the two elements 1-1 and 1-2 are the same, while in the second region 12, the magnetization directions 33 and 34 of the fixed layers in the two elements 2-1 and 2-2 are the same. Furthermore, the directions 41 and 42 of the bias magnetic fields, which are applied to the elements 1-1 and 2-1 connected to the power terminal (Vcc) in the first and second regions 11 and 12, respectively, are opposite to the directions 43 and 44 of the bias magnetic fields, which are applied to the elements 1-2 and 2-2 connected to the ground terminal (GND) in the first and second regions 11 and 12, respectively. Thus, the formation of the half bridges in two regions in the same manner can further obtain a large output depending on the magnitude of the disturbance magnetic field.

In this way, since all the magnetization directions 31, 32, 33, and 34 of the fixed layers in the elements 1-1, 1-2, 2-1, and 2-2 configuring the bridge circuit 5 are the same, the elements 1-1, 1-2, 2-1, and 2-2 can be deposited simultaneously. Since the respective circuit configurations in the half bridges are also the same, the difference in the temperature characteristics of the offset in the magnetic sensor can be significantly reduced. With this arrangement, the two elements 1-1 and 2-1 connected to the power terminal (Vcc) have the same specifications, and the two elements 1-2 and 2-2 connected to the ground terminal (GND) have the same specifications. Thus, the change in the performance of the magnetic sensor due to the disturbance magnetic field from the magnetic sensitive axis direction can be significantly reduced.

In the magnetic sensor 1 according to the fourth embodiment, although the element arrangement is not illustrated, bias coils are provided such that the bias magnetic fields applied to the elements 1-1, 1-2, 2-1, and 2-2 are perpendicular to the magnetization directions of the fixed layers of the elements 1-1, 1-2, 2-1, and 2-2. That is, a first bias coil, a second bias coil, a third bias coil, and a fourth bias coil are used. A first linear part of the first bias coil applies the bias magnetic field to the element 1-1 provided in the first region 11. A second linear part of the second bias coil applies the bias magnetic field to the element 2-1 provided in the second region 12. Further, a first linear part of the third bias coil applies the bias magnetic field to the element 1-2 provided in the first region 11. A second linear part of the fourth bias coil applies the bias magnetic field to the element 2-2 provided in the second region 12.

By applying the bias magnetic fields to the elements 1-1, 1-2, 2-1, and 2-2 in the direction perpendicular to the respective magnetization directions of the fixed layers, a hysteresis error due to a soft magnetic part of the element is reduced, and concurrently an operating range of the element for a measurement magnetic field can be spread most widely, thus maintaining the symmetry of the output with respect to positive and negative magnetic fields. The use of the bias coil to apply the bias magnetic field can eliminate the need for an external magnet for application of a bias magnetic field. Furthermore, the two half bridges and the bias coil 3 are fabricated over the same substrate 2, which can decrease the number of parts.

Fifth Embodiment

A magnetic sensor 1 according to a fifth embodiment will be described in detail below. Likewise, only parts different from those in the first to fourth embodiments will be described below, and a description of the same parts as those in the first to fourth embodiments will be omitted below.

In the fourth embodiment, the elements are connected in a forward direction, while in the fifth embodiment, the elements are connected in a cross-coupled manner. The fifth embodiment differs from the fourth embodiment in this point.

Figure 16:
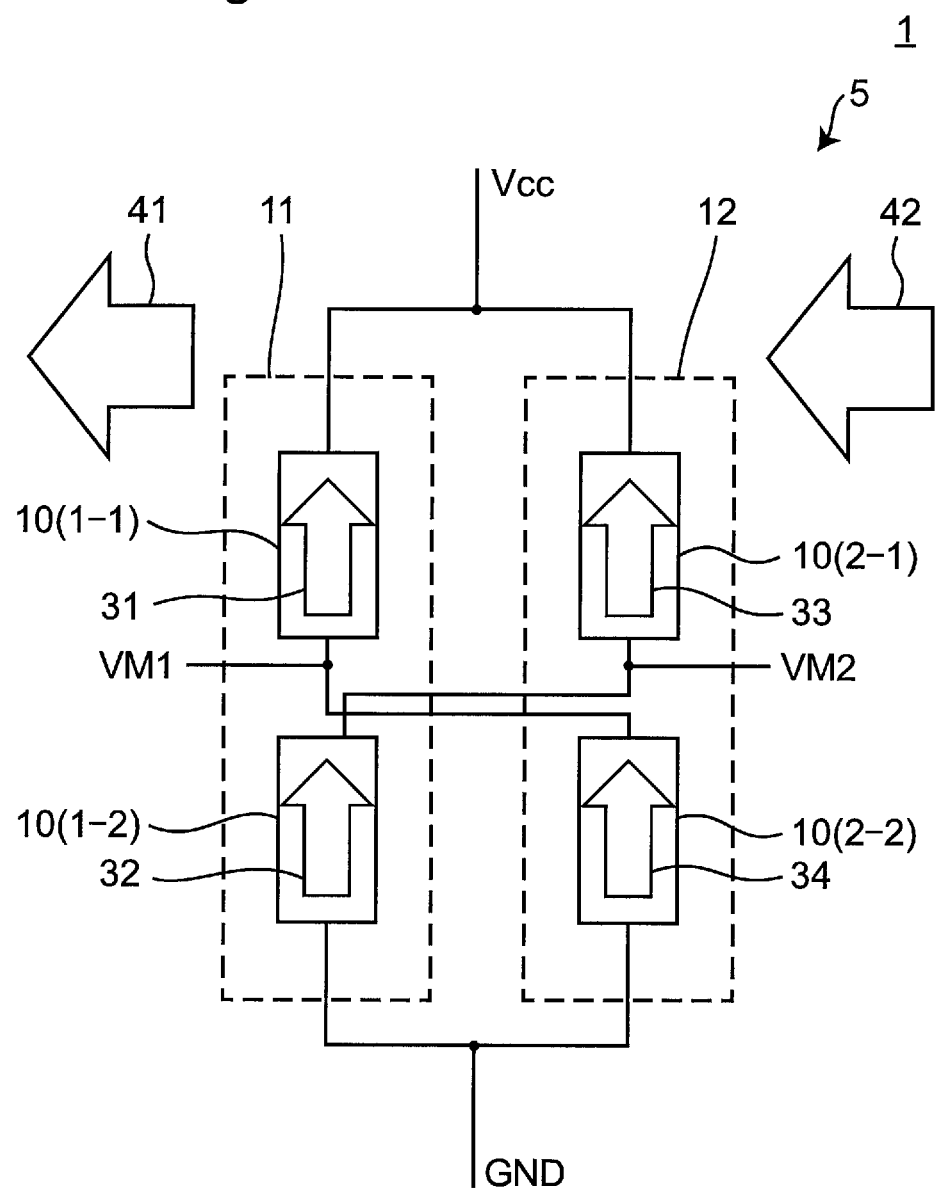
FIG. 16 is a schematic circuit diagram of a magnetic sensor according to a fifth embodiment.

FIG. 16 is a schematic circuit diagram of a magnetic sensor 1 according to a fifth embodiment. As shown in FIG. 16, in the fifth embodiment, the element 1-1 connected to the power terminal (Vcc) in the first region 11 is connected to the element 2-2 connected to the ground terminal (GND) in the second region 12. The element 2-1 connected to the power terminal (Vcc) in the second region 12 is connected to the element 1-2 connected to the ground terminal (GND) in the first region 11. Such connection is hereinafter referred to as "connected in a cross-coupled manner".

Furthermore, in the magnetic sensor 1 according to the fifth embodiment, the directions 41 and 42 of the bias magnetic fields applied to the elements 1-1 and 2-1 are the same as the directions 41 and 42 of the bias magnetic fields applied to the elements 2-2 and 1-2.

In the fifth embodiment, all the magnetization directions of the fixed layers in the four elements 1-1, 1-2, 2-1, and 2-2 can be made the same. As all magnetization directions of the fixed layers in the four elements are made the same, the four elements 1-1, 1-2, 2-1, and 2 can be deposited one time, thereby minimizing differences in the properties and the thickness among the elements. Thus, the change of the offset depending on the temperature and the effect of the disturbance magnetic field in the magnetic sensitive axis direction can be reduced.

The directions of the bias magnetic fields applied to the element 1-1 and the element 2-1 are made the same as the directions of the bias magnetic fields applied to the element 2-2 and the element 1-2, thereby significantly reducing a change in the performance due to the disturbance magnetic field in the direction perpendicular to a magnetic sensitive axis.

In the fifth embodiment, the bias magnetic fields are applied such that the bias magnetic fields applied to the elements are perpendicular to the respective magnetization directions of the fixed layers. The bias magnetic fields are applied in the same way as in the second embodiment. By applying the bias magnetic fields to the elements in the direction perpendicular to the respective magnetization directions of the fixed layers, a hysteresis error due to a soft magnetic part of the element is reduced, and concurrently an operating range of the element for a measurement magnetic field can be spread most widely, thus maintaining the symmetry of the output with respect to positive and negative magnetic fields.

The use of the bias coil to apply the bias magnetic field can eliminate the need for an external magnet for application of a bias magnetic field.

Furthermore, the two half bridges and the bias coil are fabricated over the same substrate, which can decrease the number of parts.

Sixth Embodiment

A magnetic sensor 1 according to a sixth embodiment will be described in detail below. Likewise, only parts different from those in the first to fifth embodiments will be described below, and a description of the same parts as those in the first to fifth embodiments will be omitted below.

In the first to fifth embodiments, the bias coil 3 has the linear part for applying the bias magnetic field and other parts each having the same line width. On the other hand, in the sixth embodiment, the bias coil 3 has a linear part (bias application part 20) for applying the bias magnetic field and another part (bias coil bypass part 21) with a different line width. The sixth embodiment differs from the first to fifth embodiments in this point.

Figure 17A:
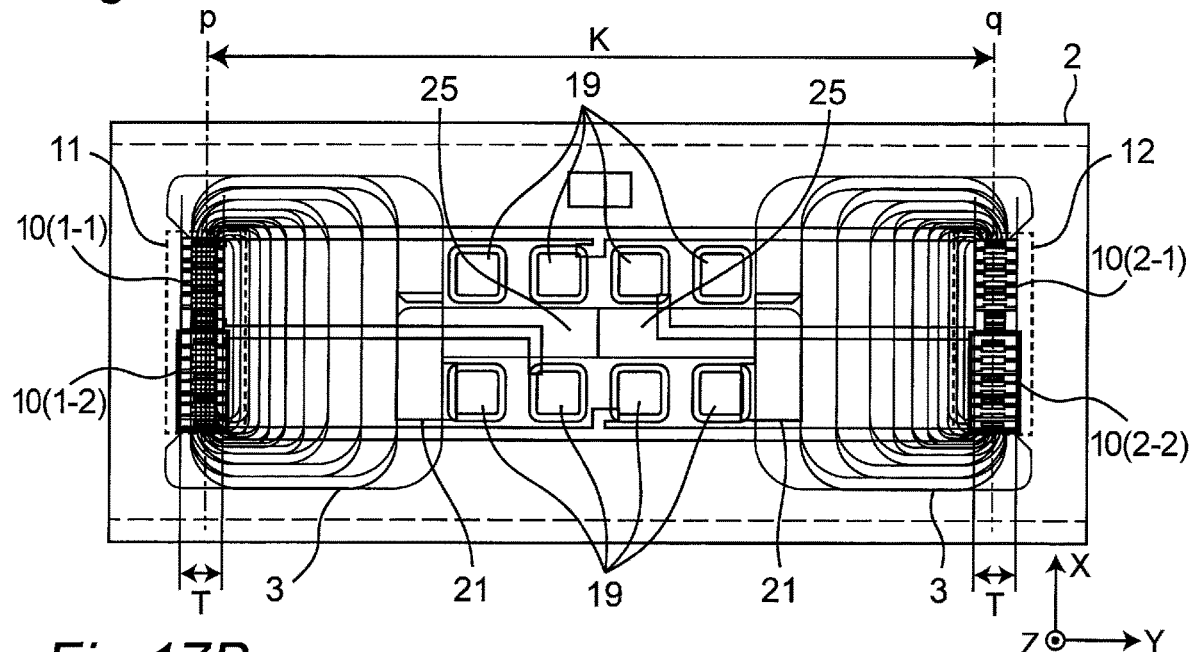
FIG. 17A is a schematic top view of a magnetic sensor according to a sixth embodiment.
Figure 17B:
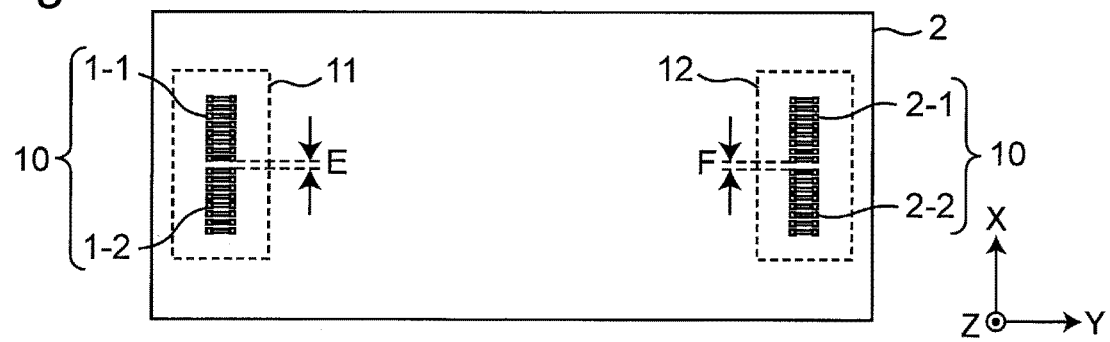
FIGS. 17B and 17C are schematic top views showing only the structures of parts of the magnetic sensor.
Figure 17C:
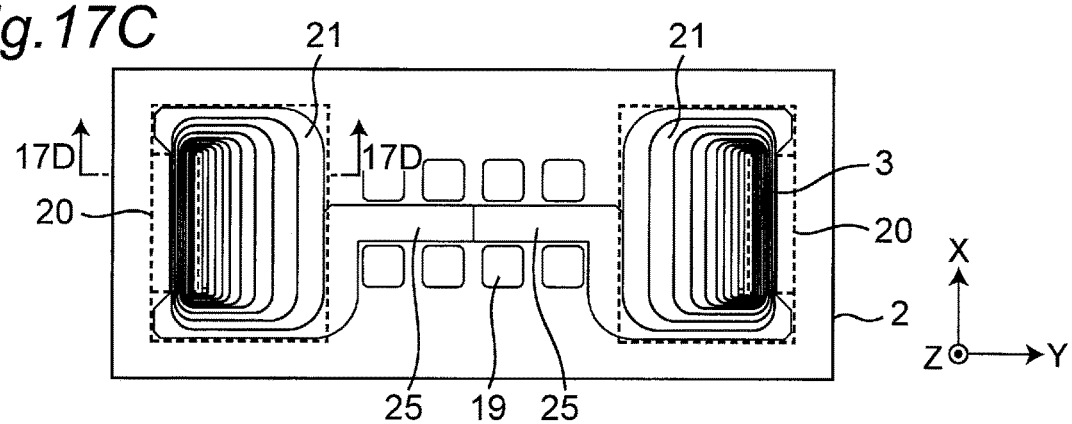
Figure 17D:
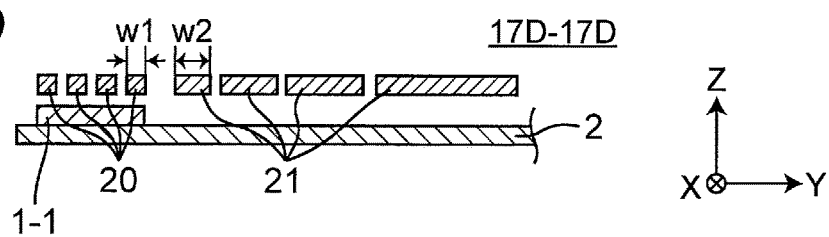
FIG. 17D is a schematic cross-sectional view taken along the line 17D-17D of FIG. 17C.

FIG. 17A is a schematic top view of the magnetic sensor 1 according to the sixth embodiment, showing the arrangement of components of the magnetic sensor 1, including elements 1-1, 1-2, 2-1, and 2-2, two pairs of bias coils 3, leads 25, and pads 19. FIG. 17B is a schematic top view showing only the substrate 2 and the elements 1-1, 1-2, 2-1, and 2-2 included in the magnetic sensor 1, and FIG. 17C is a schematic top view showing only the substrate 2 and a pair of bias coils 3. FIG. 17D is a cross-sectional view taken along the line 17D-17D of FIG. 17C, showing the substrate 2, the elements 1-1, 1-2, 2-1, and 2-2, and the bias coil 3. In the sixth embodiment shown in FIG. 17D, in addition to the configuration of the second embodiment described with reference to FIGS. 11 and 12, the bias coil 3 is formed such that a line width w2 of the bias coil 3 in the bias coil bypass part 21 is larger than a line width w1 of the bias coil 3 in the bias application part 20. As shown in FIG. 17C, the bias coil 3 includes the bias application part 20 and the bias coil bypass part 21 connected to the bias application part 20. The bias coil 3 has a substantially rectangular spiral shape that is formed by repeatedly bending a line extended in one direction. A region where the line width of each line path is constant corresponds to the bias application part 20, while a region other than the bias application part 20 where each line width is gradually increased corresponds to the bias coil bypass part 21. That is, as shown in FIG. 17D, the line widths of parts of the bias coil 3 in the bias application part 20 are all the same, namely, w1, On the other hand, in the bias coil bypass part 21, the line width of the bias coil 3 is gradually increased as it is farther from the elements 1-1 and 1-2 or the elements 2-1 and 2-2. With this arrangement, a heat generated by passing current through the bias coil 3 can be suppressed, while suppressing variations in the output, enabling the reduction in the size of a chip.

As shown in FIG. 17B, the first region 11 is formed near one end of the substrate 2, and the elements 1-1 and 1-2 are formed in the first region 11. The second region 12 is formed near the other end of the substrate 2, and the elements 2-1 and 2-2 are formed in the second region 12. As shown in FIG. 17D, the elements 1-1, 1-2, 2-1, and 2-2 are formed on the substrate 2, and the bias coils 3 are formed over the elements 1-1, 1-2, 2-1, and 2-2 while being spaced apart from the elements 1-1, 1-2, 2-1, and 2-2. Each of a distance E between the elements 1-1 and 1-2 in the first region 11 and a distance F between the elements 2-1 and 2-2 in the second region 12 is 0.1 mm to 10 mm, preferably, 1 mm to 5 mm, and more preferably approximately 1.2 mm. Here, reference positions of the respective regions (first region 11 and second region 12) are center lines p and q of the arranged regions (first region 11 and second region 12), and a distance K between the two regions is a distance between the center lines p and q. Each of the elements 1-1, 1-2, 2-1, and 2-2 has a structure (i.e., meander structure) obtained by folding back a line a plurality of time in a meander shape. A length T in the longitudinal direction of a part of each element 1-1, 1-2, 2-1, or 2-2 folded back one time is 10 μm to 1000 μm, preferably 50 μm to 200 μm, and more preferably approximately 100 μm. In this way, the length T in the longitudinal direction of each of the elements 1-1, 1-2, 2-1, and 2-2 is set, which eliminates a difference in the magnetic field gradient within each region of the first and second regions 11 and 12. Consequently, uniform magnetic field can be applied to the elements 1-1, 1-2, 2-1, and 2-2, thereby improving the measurement accuracy. The bias coil 3 applies the bias magnetic fields in the direction perpendicular to the magnetization directions of the fixed layers in the elements 1-1 and 1-2 and the elements 2-1 and 2-2 in two regions (first region 11 and second region 12) such that the bias magnetic fields in the respective first and second regions 11 and 12 are in parallel with each other. The two bias coils 3 are disposed and connected via the leads 25 to apply the bias magnetic fields in this way. As mentioned above, parts of the bias coils 3 located above the elements 1-1, 1-2, 2-1, and 2-2, i.e., the bias application parts 20 are made narrower to increase the generation efficiency of the bias magnetic fields, while other parts of the bias coils 3 (bias coil bypass parts 21) are made wider to reduce the resistance of the magnetic sensor as a whole. The bias coil bypass part 21 is extended inward in the lateral direction, compared with the elements 1-1 and 1-2 and the elements 2-1 and 2-2, so that the chip size in the longitudinal direction can be reduced. Also, the pads 19 are disposed inside the elements 1-1 and 1-2 and the elements 2-1 and 2-2, whereby the chip size can be reduced in the same way.

Seventh Embodiment

A magnetic sensor 1 according to a seventh embodiment will be described in detail. Likewise, only parts different from those in the first to sixth embodiments will be described below, and a description of the same parts as those in the first to sixth embodiments will be omitted.

Figure 18A:
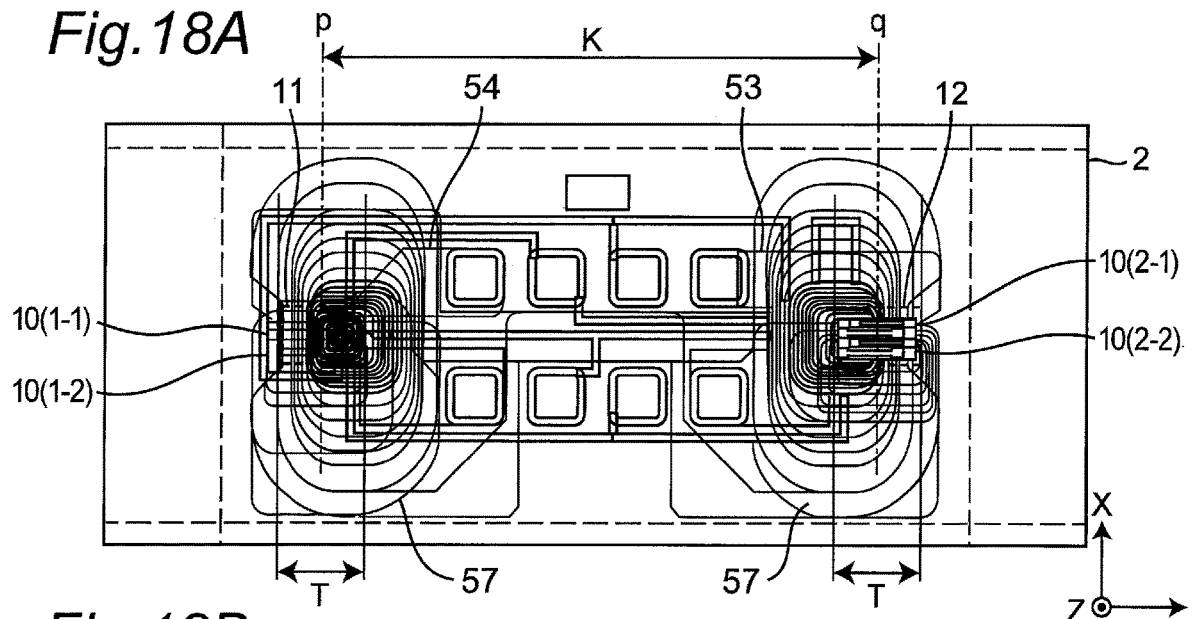
FIG. 18A is a schematic top view of a magnetic sensor according to a seventh embodiment.
Figure 18B:
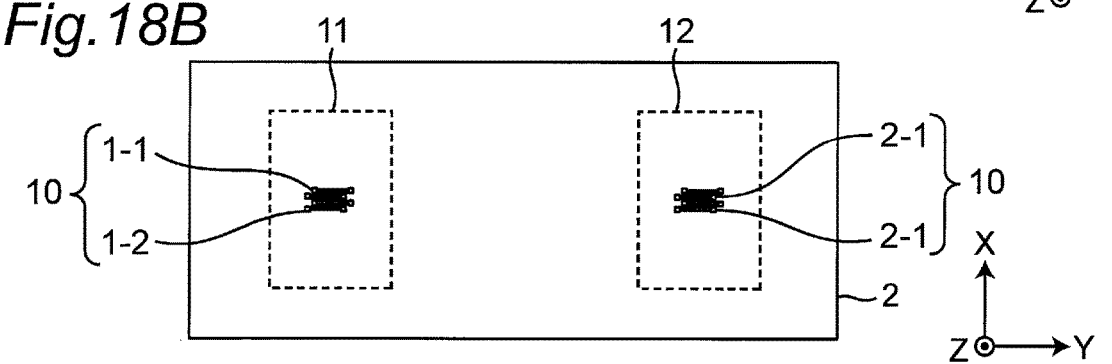
FIGS. 18B to 18D are schematic top views showing only the structures of parts of the magnetic sensor.
Figure 18C:
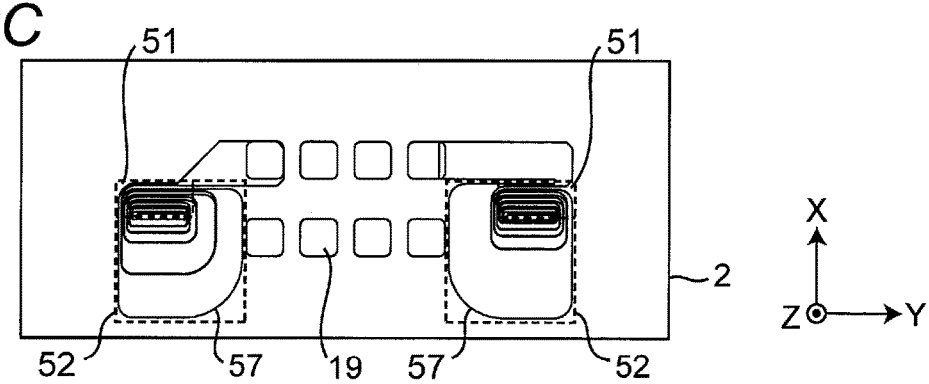
Figure 18D:
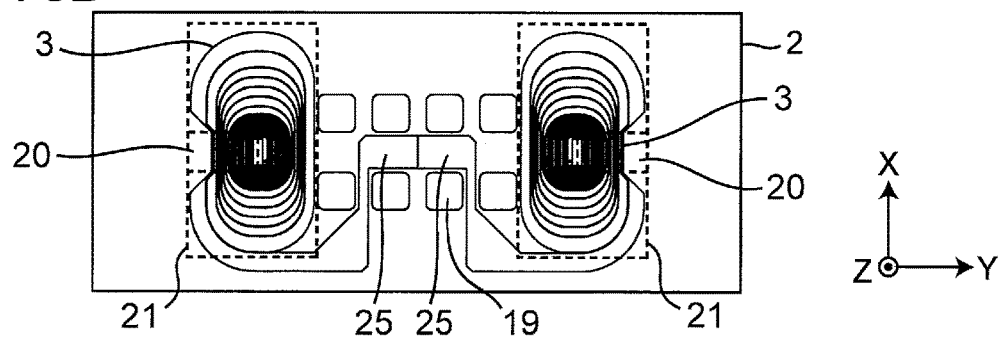

FIG. 18A is a schematic top view of the magnetic sensor 1 according to the seventh embodiment, showing the arrangement of components of the magnetic sensor 1, including elements 1-1, 1-2, 2-1, and 2-2, feedback coils 57, bias coils 3, leads 25, and pads 19. FIG. 18B is a schematic top view showing only the substrate 2 and the elements 1-1, 1-2, 2-1, and 2-2 included in the magnetic sensor 1, FIG. 18C is a schematic top view showing only the substrate 2 and feedback coils 57, and FIG. 18D is a schematic top view showing only the substrate 2 and the bias coils 3. The six embodiment does not include the feedback coil 57, whereas the seventh embodiment includes the feedback coil 57. The seventh embodiment differs from the sixth embodiment in this point.

As shown in FIG. 18D, the bias coil 3 includes the bias application part 20 and the bias coil bypass part 21. A cross-sectional area of a wiring 26 that connects the bias coil bypass parts 21 is larger than that of the bypass application part 20. The cross-sectional area of the wiring 26 that connects the bias coil bypass parts 21 is preferably more than one time larger than that of the bypass application part 20. The larger the cross-sectional area of the wiring 26, the better the state of the bias coil becomes. However, the cross-sectional area of the wiring 26 is limited by the size of the magnetic sensor 1*i*. Such setting reduces the heat generation in the bias coils 3 that would otherwise affect the elements 1-1, 1-2, 2-1, and 2-2, leading to the improvement of the measurement accuracy.

FIG. 18B shows two regions (first region 11 and second region 12). A region-to-region distance K and a length T in the longitudinal direction of the element are set in the same manner as in FIG. 17, which eliminates a difference in the magnetic field gradient within each region of the first and second regions 11 and 12. Consequently, the uniform magnetic field is applied to the elements 1-1, 1-2, 2-1, and 2-2, thereby enabling the improvement of the measurement accuracy.

In the magnetic sensor 1 according to the seventh embodiment, the bias coils 3 apply the bias magnetic fields in the direction perpendicular to the magnetization directions of the fixed layers in the elements 1-1 and 1-2 and the elements 2-1 and 2-2 in two regions (first region 11 and second region 12) such that the bias magnetic fields in the two regions are in parallel with each other. The two bias coils 3 are respectively disposed and connected via the leads to apply the bias magnetic fields in this way. In parts of the bias coil 3 located above the elements 1-1, 1-2, 2-1, and 2-2, i.e., the bias application parts 20, the line width is made narrow to increase the generation efficiency of the bias magnetic fields, while in other parts of the bias coils 3 (for example, bias coil bypass parts 21), the line width is made wide to reduce the resistance of the magnetic sensor as a whole. As shown in FIG. 18, the bias coil bypass parts 21 are not positioned inside the elements 1-1, 1-2, 2-1, and 2-2. Alternatively, as shown in FIG. 17, the bias coil bypass parts 21 are positioned within the elements 1-1, 1-2, 2-1, and 2-2, which can decrease the chip size.

In the seventh embodiment of the present invention, as shown in FIG. 18C, the feedback coils 57 are disposed in parallel with the longitudinal direction of the elements 1-1, 1-2, 2-1, and 2-2 in the two regions (first region 11 and second region 12). Furthermore, the two bias coils 3 are disposed and connected by leads and disposed to apply the magnetic fields to achieve 180° rotational symmetry between the two regions. Like the bias coil 3, in parts of the feedback coil 57 located above the elements 1-1, 1-2, 2-1, and 2-2, a line width is made narrow and constant to increase the generation efficiency of the bias magnetic fields, while in other parts of the feedback coil 57, a line width is made wide to reduce the resistance of the magnetic sensor as a whole. Specifically, as shown in FIG. 18C, the feedback coil 57 is formed in a substantially rectangular spiral shape by repeatedly bending a line extended in one direction. Each line path has a region 51 that has a constant line width and a region 52 other than the region 51 that has a line width gradually increased. The region 52 where the line width of each line path is gradually increased is positioned inside the corresponding element 1-1, 1-2, 2-1, or 2-2, whereby the chip size can be reduced. The pads 19 are also disposed inside the elements 1-1 and 1-2 and the elements 2-1 and 2-2, whereby the chip size can be reduced in the same way.

FIGS. 19A to 19C are layered views of the magnetic sensors in the first to seventh embodiments. The magnetic sensor shown in FIG. 19A has the element 10 disposed on the substrate 2 and also includes two feedback coils and one bias coil 3. The magnetic sensors shown in FIGS. 19B and 19C each have the element 10 disposed on the substrate 2 and also include two bias coils 3 and one feedback coil. The magnetic sensor shown in FIG. 19B includes a soft-magnetic yoke film, while the magnetic sensor shown in FIG. 19C does not include a soft-magnetic yoke film. The element 10 and each coil are insulated from each other by an insulating film. Note that each of FIGS. 19A, 19B, and 19C shows one example of the order of lamination of the films in the magnetic sensor. However, the order of lamination of the films may be modified. Alternatively, one or some of the films may be omitted from, or another film may be added to the structure shown in FIGS. 19A to 19C.

[Current Detector]

Now, a description will be given on a current detector using the above-mentioned magnetic sensor 1. The magnetic sensor 1 used in the current detector according to each of the eighth to seventeenth embodiments is the same as the magnetic sensor 1 in any of the first to seventh embodiments, and thus a detailed description of the magnetic sensor 1 will be omitted.

FIGS. 20 to 30 associated with the eighth to seventeenth embodiments show the X, Y, and Z axes. It should be noted that these X, Y, and Z axes are not identical to the X, Y, and Z axes shown in FIGS. 1 to 19, respectively.

Eighth Embodiment

A current detector according to an eighth embodiment will be described in detail below.

Figure 20A:
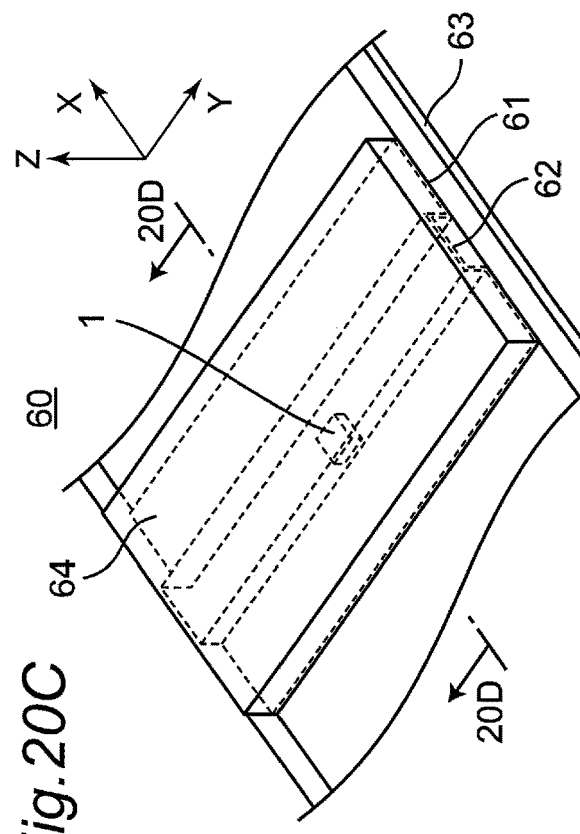
FIG. 20A is a schematic perspective view of a current detector according to an eighth embodiment.
Figure 20C:
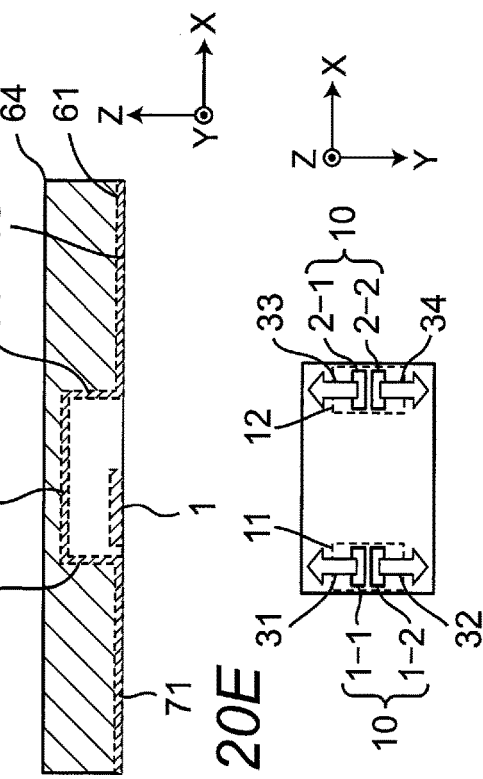
FIG. 20C is a schematic perspective view of the current detector with a current line covered with a resin molded body.
Figure 20D:
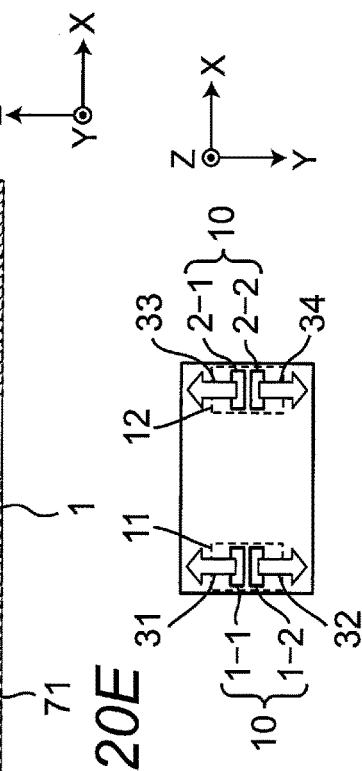
FIG. 20D is a cross-sectional view taken along the line 20D-20D of FIG. 20C.
Figure 20B:
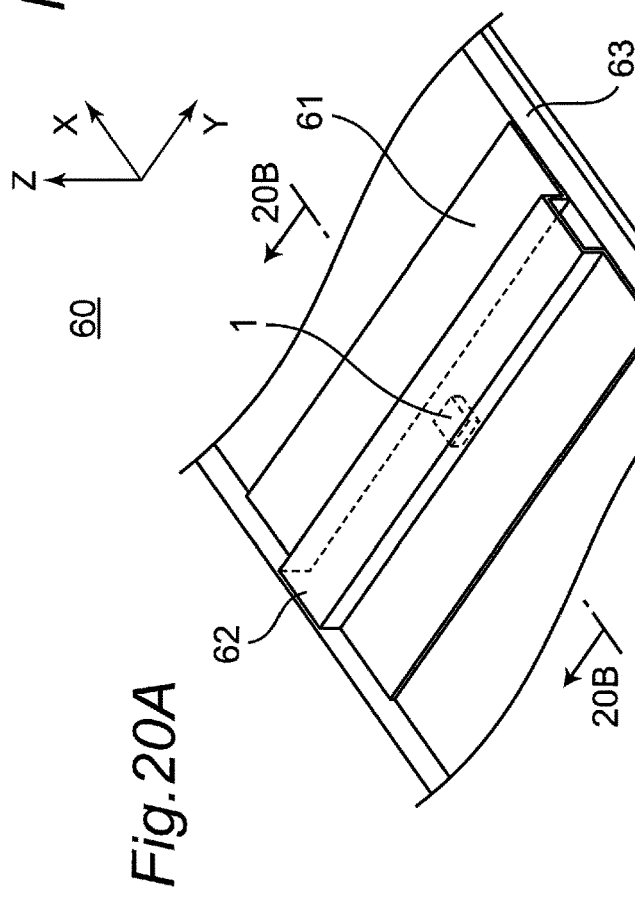
FIG. 20B is a cross-sectional view taken along the line 20B-20B of FIG. 20A.
Figure 20E:
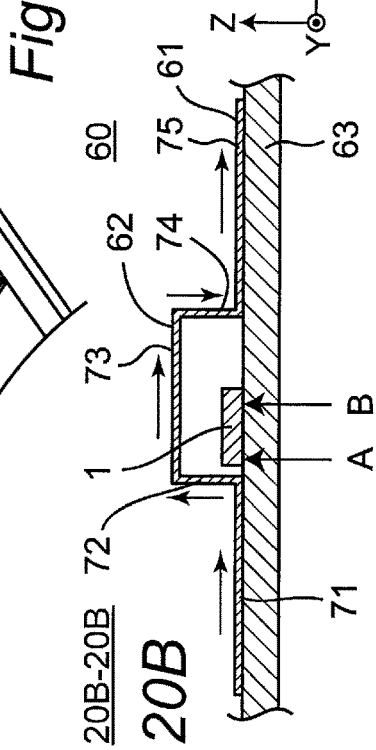
FIG. 20E is a schematic top view of the magnetic sensor used in the current detector shown in FIGS. 20A to 20D.

FIG. 20A is a schematic perspective view of a current detector 60 in the eighth embodiment. FIG. 20B is a cross-sectional view taken along the line 20B-20B of FIG. 20A. FIG. 20C is a schematic perspective view of the current detector 60 with a current line 61 covered with a resin molded body 64. FIG. 20D is a cross-sectional view taken along the line 20D-20D of FIG. 20C. FIG. 20E is a schematic top view of the magnetic sensor 1 used in the current detector 60 shown in FIGS. 20A to 20D. In FIGS. 20A to 20E, the X direction is defined as the direction of the current flowing through the current line 61. Each of the magneto-sensitive directions 31, 32, 33, and 34 of the elements 10 included in the magnetic sensor 1 is the Y direction or −Y direction, and the bias magnetic field direction is the X direction. As shown in FIG. 20B, the current detector 60 according to the eighth embodiment includes the magnetic sensor 1 according to any of the first to seventh embodiments and the current line 61. The current line 61 is formed to enclose three peripheral surfaces of the magnetic sensor 1 on a cross section (XZ plane) along the direction (X direction) of the current flowing through the current line 61. In other words, the magnetic sensor 1 is disposed within a bypass part 62 provided in the current line 61. That is, suppose that the magnetic sensor 1 is projected toward a first vertical part 72 and a second vertical part 74 in the bypass part 62. The magnetic sensor 1 is disposed in a position where the projected position thereof is overlapped with the first vertical part 72 and the second vertical part 74. Furthermore, suppose that the magnetic sensor 1 is projected toward a second parallel part 73 of the bypass part 62. The magnetic sensor 1 is also disposed in a position where the projected position thereof is overlapped with the second parallel part 73.

As shown in FIG. 20B, the current detector 60 according to the eighth embodiment has the bypass part 62 formed in a U shape (inverted U shape with edges) on a cross section (XZ plane) along the direction (X direction) of the current flowing through the current line 61. That is, the cross section has a first parallel part 71, the first vertical part 72, the second parallel part 73, a second vertical part 74, and a third parallel part 75. The first parallel part 71 is in parallel with the X direction. The first vertical part 72 is provided on the downstream side of the first parallel part 71 and vertically relative to the first parallel part 71. The second parallel part 73 is provided on the downstream side of the first vertical part 72, vertically to the first vertical part 72, and in parallel with the first parallel part 71. The second vertical part 74 is provided on the downstream side of the second parallel part 73 and vertically relative to the second parallel part 73. The third parallel part 75 is provided on the downstream side of the second vertical part 74, vertically to the second vertical part 74, and in parallel with the first and second parallel parts 71 and 73.

In the current detector 60 according to the eighth embodiment, as shown in FIG. 20E, the elements 1-1, 1-2, 2-1, and 2-2 included in the magnetic sensor 1 are provided such that the magnetization directions 31, 32, 33, and 34 of the respective fixed layers are perpendicular to the direction of the current flowing through the current line 61 (X direction in FIGS. 20A, 20B, 20C, and 20D). Furthermore, the elements 1-1, 1-2, 2-1, and 2-2 are provided to be in parallel with the X direction.

The current line 61 through which current to be measured flows is made of metal or an alloy having a small specific resistance, such as copper. The current line 61 is configured of a plate-shaped structure, such as a copper foil or a pressed plate that is integrally formed on a circuit board 63.

In the current detector 60 according to the eighth embodiment, the magnetization direction of the fixed layer in the magnetic sensor 1 is perpendicular to the current flow direction. The magnetic sensor 1 and the current line 61 are fixed to the circuit board 63 or a casing.

As shown in FIG. 20B, one (for example, first region 11) of the two regions included in the magnetic sensor 1 is disposed at a U-shaped side surface, i.e., in a position A relatively close to the first vertical part 72 of the current line 61. The other (for example, second region 12) of the two regions is disposed near a center position B of the second parallel part 73 of the current line 61. In this case, the two regions (i.e., first region and second region) have the magnetic field gradient. Thus, by arranging the magnetic sensor 1 in the first to seventh embodiments as mentioned above, an output in proportion to the current to be measured can be obtained, and the disturbance magnetic field can be canceled. An induction noise, such as a switching noise, can be suppressed as the magnetic sensor is enclosed by the current line 61.

As shown in FIGS. 20C and 20D, parts or all of the magnetic sensor 1 and the current line 61 may be integrated with the resin molded body 64 and the like. In this way, parts or all of the magnetic sensor 1 and the current line 61 are integrated together by the resin molded body 64, which improves the workability of attachment, while making it possible to reduce a difference in the positional accuracy.

Note that referring to FIG. 20D, a gap between the magnetic sensor 1 and the bypass part may be filled with the resin molded body 64.

Ninth Embodiment

A current detector 60 according to a ninth embodiment will be described in detail below. Likewise, only parts different from those in the eighth embodiment will be described below, and a description of the same parts as those in the eighth embodiment will be omitted below.

In the eighth embodiment, the current line is curved in the U shape without being branched or divided, while in the ninth embodiment, the current line is branched and divided. The ninth embodiment differs from the eighth embodiment in this point.

FIG. 21A is a schematic perspective view of a current detector 60 in the ninth embodiment. FIG. 21B is a cross-sectional view taken along the line 21B-21B of FIG. 21A. FIG. 21C is a partially enlarged cross-sectional view of FIG. 21B. FIG. 21D is a schematic perspective view of the current detector 60 with a current line 61 covered with a resin molded body 64. FIG. 21E is a cross-sectional view taken along the line 21E-21E, showing a cross section taken in the direction of current (X direction) flowing through the current line 61. FIG. 21F is a schematic top view of the magnetic sensor 1 used in the current detector 60 shown in FIGS. 21A to 21C. In FIGS. 21A to 21F, the X direction is defined as the direction of the current flowing through the current line 61. Each of the magnetosensitive directions 31, 32, 33, and 34 of the elements 10 included in the magnetic sensor 1 is the Y direction or −Y direction, and the bias magnetic field direction is the X direction.

As shown in FIG. 21B, the current detector 60 according to the ninth embodiment includes, on its cross section (XZ plane) along the direction of current flowing through the current line 61: a void 83 between a branch position 81 and a merging position 82; the current line 61 having a first current path 84 and a second current path 85 separated by the void 83; and the magnetic sensor 1 according to any of the first to seventh embodiments.

In the current detector 60 of the ninth embodiment, as shown in FIG. 21B, the current line 61 contains the first current path 84 and the second current path 85. The first current path 84 has the bypass part 62 formed in a U shape (i.e., an inverted U shape with edges) on a cross section (XZ plane) along the direction (X direction) of the current flowing through the current line 61. A starting point and an end point of the first current path 84 are connected to the second current path 85. As shown in FIG. 21B, the first current path 84 has a first parallel part 71, the first vertical part 72, the second parallel part 73, a second vertical part 74, and a third parallel part 75. The first parallel part 71 is in parallel with the X direction. The first vertical part 72 is provided on the downstream side of the first parallel part 71 and vertically relative to the first parallel part 71. The second parallel part 73 is provided on the downstream side of the first vertical part 72, vertically to the first vertical part 72, and in parallel with the first parallel part 71. The second vertical part 74 is provided on the downstream side of the second parallel part 73 and vertically relative to the second parallel part 73. The third parallel part 75 is provided on the downstream side of the second vertical part 74, vertically to the second vertical part 74, and in parallel with the first and second parallel parts 71 and 73.

The second current path 85 has a linear part 76, a branch part 77 branched from the linear part 76, and a merging part 78 merged with the linear part 76.

The first parallel part 71 of the first current path 84 is electrically connected to the branch part 77 of the second current path 85. The third parallel part 75 of the first current path 84 is electrically connected to the merging part 78 of the second current path 85. Thus, the first current path 84 and the second current path 85 are connected together to form the current line 61. Here, a position where the second current path 85 is divided into the linear part 76 and the branch part 77 corresponds to the "branch position" 81. A position where the liner part 76 and the merging part 78 in the second current path 85 are merged with each other corresponds a "merging position" 82. A part enclosed by the first current path 84 and the second current path 85 corresponds to the "void" 83.

In the current detector 60 according to the ninth embodiment, the first current line 84 through which current to be measured flows is made of metal or an alloy having a small specific resistance, such as copper. The first current line 84 is configured of a plate-shaped structure, such as a copper foil or a pressed plate, that is integrally formed on the circuit board 63.

The current to be measured that flows through the current line 61 (part other than the bypass part 62) flows vertically relative to the first vertical part 72.

The magnetic sensor 1 is disposed within the above-mentioned void 83. The second current path 85 is disposed to flow the current in parallel with the current direction in the first current path 84. The second current path 85 is arranged such that both current paths are overlapped in the top view. The current line 61 including the first and second current paths 84 and 85 has the branch position 81 and the merging position 82. The current flowing through the second current path 85 is in parallel with the current flowing through the first parallel part 71, second parallel part 73, and third parallel part 75 of the flat first current path 84. The magnetization directions 31, 32, 33, and 34 of the fixed layers in the magnetic sensor 1 are perpendicular to the current direction of the current flowing through the first vertical part 72 (Z direction in FIGS. 21B, 21C, and 21E).

The magnetic sensor 1 is disposed in the void 83 located between the first current path 84 and the second current path 85. Thus, even when measuring a large current, the induced magnetic field can be attenuated, thereby improving the measurement accuracy without saturating the elements.

The magnetic sensor 1 and the current line 61 are fixed to the circuit board 63 or a casing.

As shown in FIG. 21B, one (for example, first region 11) of the two regions included in the magnetic sensor 1 is disposed at a U-shaped side surface, i.e., in a position A relatively close to the first vertical part 72 of the first current path 84. The other (for example, second region 12) of the two regions is disposed near a center position B of the second parallel part 73 of the first current path 84. The magnetic sensor 1 is disposed in this way, whereby as shown in FIG. 21C, the magnetic field near the position A becomes higher backward in the vertical direction relative to the paper surface, and the magnetic field near the position B becomes higher forward in the vertical direction relative to the paper surface.

The two regions (i.e., first region 11 and second region 12) have the gradient of the induced magnetic field formed by the current to be measured. Thus, by arranging the magnetic sensor 1 in any of the first to seventh embodiments as mentioned above, an output in proportion to the current to be measured can be obtained, while the disturbance magnetic field can be canceled at the same time. An induction noise, such as a switching noise, can be suppressed as the magnetic sensor is enclosed by the current line 61.

As shown in FIGS. 21D and 21E, parts or all of the magnetic sensor 1 and the current line 61 may be integrated with the resin molded body 64 and the like. In this way, parts or all of the magnetic sensor 1 and the current line 61 are integrated together by the resin molded body 64, which improves the workability of attachment, while making it possible to reduce a difference in the positional accuracy. Note that referring to FIG. 21E, a gap between the magnetic sensor 1 and the bypass part may be filled with the resin molded body 64.

Tenth Embodiment

A current detector 60 according to a tenth embodiment will be described in detail below. Likewise, only parts different from those in the ninth embodiment will be described below, and a description of the same parts as those in the ninth embodiment will be omitted below.

FIG. 22A is a schematic perspective view of the current detector 60 in the tenth embodiment. FIG. 22B is a cross-sectional view taken along the line 22B-22B of FIG. 22A. FIG. 22C is a schematic top view of the current detector 60 in the tenth embodiment. FIG. 22D is a schematic top view of the magnetic sensor 1 used in the current detector 60 shown in FIGS. 22A to 22C in FIGS. 22A to 22D, the X direction is defined as the direction of the current flowing through the current line 61. Each of the magnetosensitive directions 31, 32, 33, and 34 of the elements 10 included in the magnetic sensor 1 is the X direction or −X direction, and the bias magnetic field direction is the Y direction.

In the ninth embodiment, the second current path 85 of the current line 61 does not include a second branch merging part (second void), whereas in the tenth embodiment, the second current path 85 of the current line 61 has the second branch merging part (second void 95). In the ninth embodiment, the current line 61 has only the void 83, whereas in the tenth embodiment, the current line 61 has not only the void 83, but also second void 95. The tenth embodiment differs from the ninth embodiment in this point.

In the current detector 60 of the tenth embodiment, as shown in FIG. 22A to 22C, the current line 61 has the first current path 84 with the bypass part 62 bent in the U shape and the second current path 85 to which the starting and end points of the first current path 84 are connected and which has a second void 95 formed therein. The magnetic sensor 1 has at least three surfaces thereof covered by the current paths (for example, first current path 84) between the first current path 84 and the second current path 85.

The first current path 84 and the second current path 85 through which current to be measured flows is made of metal or an alloy having a small specific resistance, such as copper. These current paths are configured of a plate-shaped structure, such as a copper foil or a pressed plate, that is integrally formed on the circuit board 63.

The current to be measured that flows through the current line 61 (part other than the branch part 62) flows vertically relative to the first vertical part 72.

The magnetic sensor 1 is disposed within the above-mentioned void 83. The second current path 85 is disposed to flow the current in parallel with the current direction in the first current path 84. The second current path 85 is arranged such that both current paths are overlapped in the top view. The current line 61 including the first and second current paths 84 and 85 has the branch position 81 and the merging position 82. The current flowing through the second current path 85 is in parallel with the current flowing through the first parallel part 71, second parallel part 73, and third parallel part 75 of the flat first current path 84.

The second current path 85 has the second void 95. The second void 95 includes sides 100 and 101 vertical to the direction (X direction) of the current flowing through the second current path 85. The vertical side 100 is a side located on the downstream side in the current direction, while the vertical side 101 is a side located on the upstream side in the current direction. In the tenth embodiment, the second void 95 has the sides 100 and 101 oriented vertically to the current direction and located on both the downstream and upstream sides thereof in the current direction (X direction). Alternatively, the second void 95 needs only to be provided with either of the sides. The second current path 85 has the second void 95. The second void 95 has the sides 100 and 101 vertical to the direction of the current flowing through the second current path 85. Thus, the second current path 85 as shown in FIG. 22C experiences two current directions (directions denoted by the reference numerals 96 and 97) that are 180° rotational symmetry with the center axis of the second void 95 set at the center. The induced magnetic fields formed by the two current directions 96 and 97 are perpendicular to the respective currents and are in antiparallel with each other.

The magnetic sensor 1 is positioned such that the center in the direction (Y direction) perpendicular to the magnetization directions 31, 32, 33, and 34 of the fixed layers is aligned with the center in a branch position range (i.e., the center of the side of the second void 95). Thus, the magnetization directions 31, 32, 33, and 34 of the fixed layers in the magnetic sensor 1 are perpendicular to the direction 96 or 97 (Y direction or –Y direction) of the current, so that the induced magnetic directions are respectively in parallel/antiparallel with the magnetization directions of the fixed layers in the two regions of the magnetic As shown in FIGS. 22A, 22C, and 22D, a length G of the second void 95 in the direction (Y direction) perpendicular to a main current 110 is equal to or more than a length H between the magnetoresistive effect elements in the direction perpendicular to the magnetization directions of the fixed layers in the magnetic sensor 1. Because of this, the respective induced magnetic fields received by the two regions 11 and 12 in the magnetic sensor 1 have the uniform direction and strength.

The magnetic sensor 1 is disposed between the first current path 84 and the second current path 85. With this arrangement, even when measuring a large current, the magnetic fields formed by the main currents flowing through the first and second current paths 84 and 85 can be attenuated, thereby improving the measurement accuracy without saturating the elements.

The magnetic sensor 1 and the current line 61 are fixed to the circuit board 63 or a casing.

As shown in FIG. 22C, one of the two regions (for example, first region 11) included in the magnetic sensor 1 is disposed on a left-side position C with respect to the direction (X direction) of the current, while the other region (for example, second region 12) is disposed on a right-side position D. In this case, each of the two regions (i.e., first region 11 and second region 12) has the gradient of the induced magnetic field formed by the current to be measured. Thus, by arranging the elements 1-1, 1-2, 2-1, and 2-2 in any of the first to seventh embodiments as mentioned above, an output in proportion to the current to be measured can be obtained, while the disturbance magnetic field can be canceled at the same time. An induction noise, such as a switching noise, can be suppressed as the magnetic sensor is enclosed by the current line 61.

Parts or all of the magnetic sensor 1 and the current line 61 may be integrated with the resin molded body and the like. In this way, parts or all of the magnetic sensor 1 and the current line 61 are integrated together by the resin molded body 64, which improves the workability of attachment, while making it possible to reduce a difference in the positional accuracy. Here, without the first current path 84, the disturbance magnetic field can be canceled.

Eleventh Embodiment

A current detector 60 according to an eleventh embodiment will be described in detail below. Likewise, only parts different from those in the tenth embodiment will be described below, and a description of the same parts as those in the tenth embodiment will be omitted below.

In the ninth embodiment, the second current path 85 does not include a branch part 86, whereas in the eleventh embodiment, the second current path 85 has a branch part 86. The eleventh embodiment differs from the ninth embodiment in this point.

FIG. 23A is a schematic perspective view of the current detector 60 in the eleventh embodiment. FIG. 23B is a cross-sectional view taken along the line 23B-23B of FIG. 23A. FIG. 23C is a top view of the current detector 60 in the eleventh embodiment. FIG. 23D is a schematic top view of the magnetic sensor 1 used in the current detector 60 shown in FIGS. 23A to 23C. In FIGS. 23A to 23D, the X direction is defined as the direction of the current flowing through the current line 61. Each of the magnetosensitive directions 31, 32, 33, and 34 of the elements 10 included in the magnetic sensor 1 is the Y direction or –Y direction, and the bias magnetic field direction is the X direction.

As shown in FIGS. 23A and 23B, in the current detector 60 of the eleventh embodiment, the current line 61 includes: a first current path 84 having a bypass part 62 bent in the U shape; and a second current path 85 that has a linear part 76 and a merging part 79. The merging part 79 is disposed on the upstream side of the linear part 76 and connected to the bypass part 62 of the first current path 84 with the second current path 85 being connected to the first current path 84.

The current flowing through the first current path 84 is perpendicular to the magnetization directions 31, 32, 33, and 34 of the elements 1-1, 1-2, 2-1, and 2-2. The second current path 85 has a branch part 86, whereby the branched currents are in antiparallel with each other on the plane that is horizontal relative to the magnetization directions 31, 32, 33, and 34 of the elements 1-1, 1-2, 2-1, and 2-2, and they are positioned vertically relative to the magnetization directions in the top view of the magnetic sensor 1.

The second current path 85 is connected such that the currents branched in the second current path 85 flow through the input and output sides of the first current path 84. The first current path 84 and the second current path 85 are overlapped with each other in the top view, and the magnetic sensor 1 is disposed within an overlapped part.

The magnetic sensor 1 and the current line 61 are fixed to the circuit board 63 or a casing.

As shown in FIG. 23B, one (for example, first region 11) of the two regions included in the magnetic sensor 1 is disposed at a U-shaped side surface, i.e., in a position A relatively close to the first vertical part 72 of the first current path 84. The other (for example, second region 12) of the two regions is disposed near a center position B of the second parallel part 73 of the first current path 84. The two regions, i.e., the first region 11 and the second region 12, have the gradient of the induced magnetic field formed by the current to be measured. Thus, by arranging the magnetic sensor 1 in any of the first to seventh embodiments as mentioned above, an output in proportion to the current to be measured can be obtained, while the disturbance magnetic field can be canceled at the same time.

Thus, even when measuring a large current, the induced magnetic field can be attenuated, thereby improving the measurement accuracy without saturating the elements.

An induction noise, such as a switching noise, can be suppressed as the magnetic sensor is enclosed by the current line.

Parts or all of the magnetic sensor 1 and the current line 61 may be integrated with the resin molded body 64 and the like. In this way, parts or all of the magnetic sensor 1 and the current line 61 are integrated together by the resin molded body, which improves the workability of attachment, while making it possible to reduce a difference in the positional accuracy.

Here, without the second current path 85, the disturbance magnetic field can be canceled. However, the provision of the second current path 85 can improve the attenuation effect.

Twelfth Embodiment

A current detector 60 according to a twelfth embodiment will be described in detail below. Likewise, only parts different from those in the eleventh embodiment will be described below, and a description of the same parts as those in the eleventh embodiment will be omitted below.

In the eleventh embodiment, the second current path 85 is branched, whereas in the twelfth embodiment, the first current path 84 is branched. The twelfth embodiment differs from the eleventh embodiment in this point.

Figure 24A:
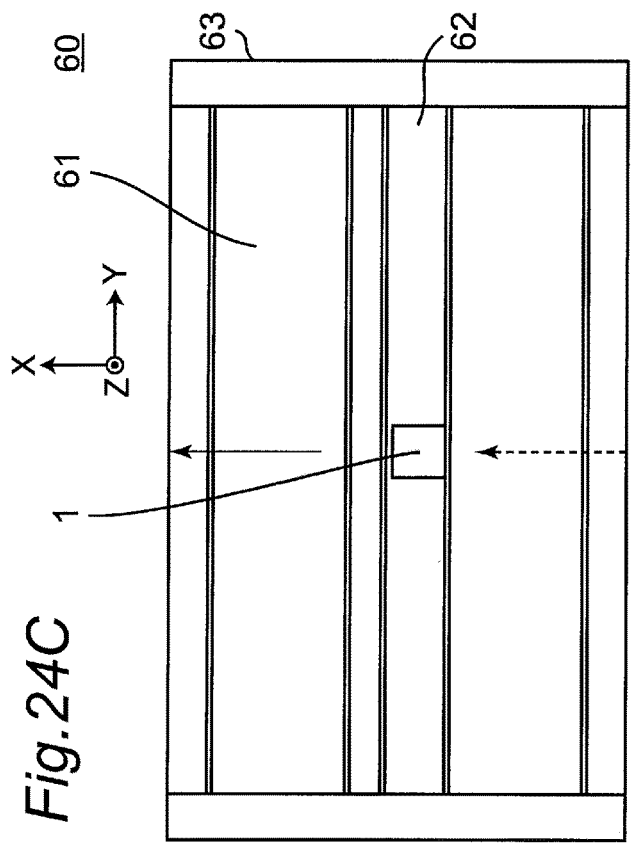
FIG. 24A is a schematic perspective view of a current detector according to a twelfth embodiment.
Figure 24B:
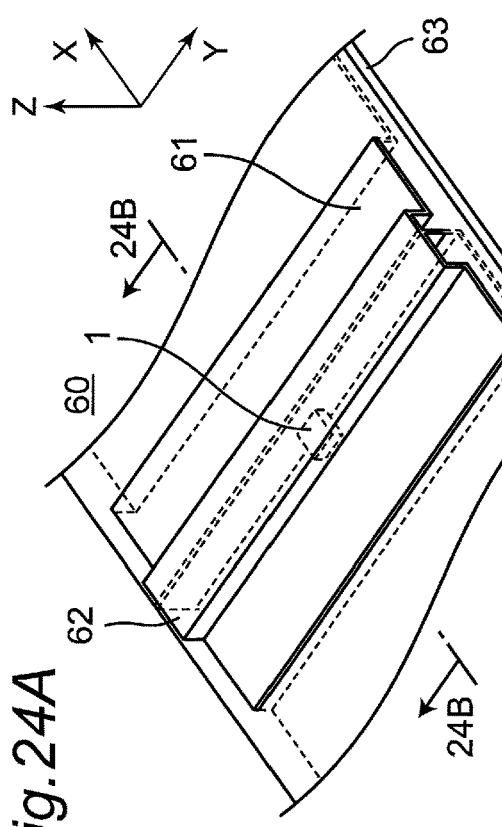
FIG. 24B is a cross-sectional view taken along the line 24B-24B shown in FIG. 24A.
Figure 24C:
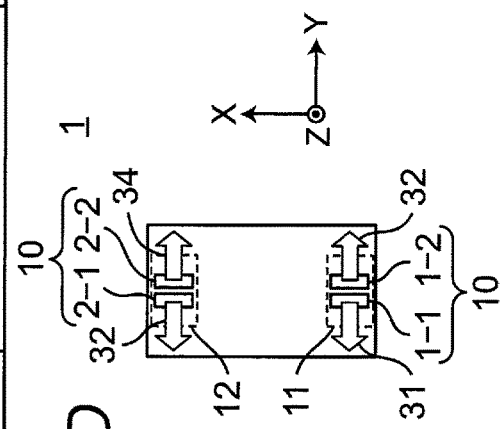
FIG. 24C is a top view of the current detector in the twelfth embodiment.
Figure 24D:
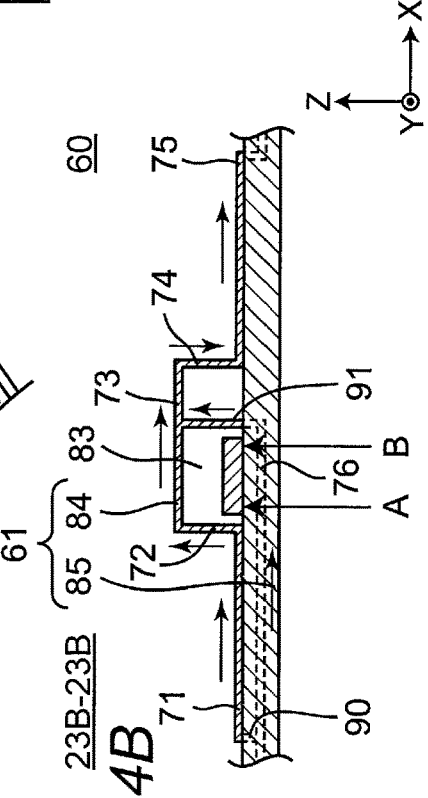
FIG. 24D is a schematic top view of a magnetic sensor used in the current detector shown in FIGS. 24A to 24C.

FIG. 24A is a schematic perspective view of the current detector 60 in the twelfth embodiment. FIG. 24B is a cross-sectional view taken along the line 24B-24B of FIG. 24A. FIG. 24C is a top view of the current detector 60 in the twelfth embodiment. FIG. 24D is a schematic top view of the magnetic sensor 1 used in the current detector 60 shown in FIGS. 24A to 24C. In FIGS. 24A to 24D, the X direction is defined as the direction of the current flowing through the current line 61. Each of the magnetosensitive directions 31, 32, 33, and 34 in the magnetic sensor 1 is the Y direction or −Y direction, and the bias magnetic field direction is the X direction.

As shown in FIG. 24B, in the current detector 60 of the twelfth embodiment, the current line 61 includes a first current path 84 that has a bypass part 62 formed in an U shape (inverted U shape with edges) on the cross section (XZ plane) along the direction (X direction) of the current flowing through the current line 61.

As shown in FIG. 24B, the second current path 85 has a linear part 76, a branch part 90 (on the upstream side) branched from the linear part 76, and a vertical part 91 (on the downstream side) bent from the linear part 76. The branch part 90 is connected to the first parallel part 71 of the first current path 84. The vertical part 91 is connected to the second parallel part 73 of the first current path 84.

The magnetic sensor 1 is disposed within a "void" 83 that is enclosed by parts of the first parallel part 71, first vertical part 72, and second parallel part 73 of the first current path 84, and the second current path 85.

Furthermore, the second current path 85 is disposed to flow the current in parallel with the current direction in the first current path 84. The second current path 85 is arranged such that both current paths are overlapped in the top view.

The magnetic sensor 1 is disposed between the first current path 84 and the second current path 85.

The first current path 84 and the second current path 85 have a branch merging part (void 83), which has flat parts formed by both paths and side surface parts. The currents flowing through the flat parts are in parallel with each other, and the currents flowing through the side surface parts are also in parallel with each other.

The magnetization direction in the fixed layer of the magnetic sensor 1 is perpendicular to the direction of the current flowing through the side surface part. In the two regions of the magnetic sensor 1, the induced magnetic fields with opposite polarities are applied.

The magnetic sensor 1 and the current line 61 are fixed to the circuit board 63 or a casing.

As shown in FIG. 24B, one (for example, first region 11) of the two regions included in the magnetic sensor 1 is disposed at a U-shaped side surface, i.e., in a position A relatively close to the first vertical part 72 of the first current path 84. The other (for example, second region 12) of the two regions is disposed near a center position B of the second parallel part 73 of the first current path 84. The two regions, i.e., the first region 11 and the second region 12, have the gradient of the induced magnetic field formed by the current to be measured. Thus, by arranging the magnetic sensor 1 in any of the first to seventh embodiments as mentioned above, an output in proportion to the current to be measured can be obtained, while the disturbance magnetic field can be canceled at the same time.

Thus, even when measuring a large current, the induced magnetic field can be attenuated, thereby improving the measurement accuracy without saturating the elements.

An induction noise, such as a switching noise, can be suppressed more efficiently as the magnetic sensor is enclosed by the current line 61.

Parts or all of the magnetic sensor 1 and the current line 61 may be integrated by the resin molded body 64 and the like. In this way, parts or all of the magnetic sensor 1 and the current line 61 are integrated together by the resin molded body, which improves the workability of attachment, while making it possible to reduce a difference in the positional accuracy.

Thirteenth Embodiment

A current detector 60 according to a thirteenth embodiment will be described in detail below. Likewise, only parts different from those in the ninth embodiment will be described below, and a description of the same parts as those in the ninth embodiment will be omitted below.

In the ninth embodiment, the magnetic sensor 1 is provided in parallel with the second current path 85, whereas in the thirteenth embodiment, the magnetic sensor 1 is provided perpendicular to the second current path 85. The thirteenth embodiment differs from the ninth embodiment in this point.

Figure 25A:
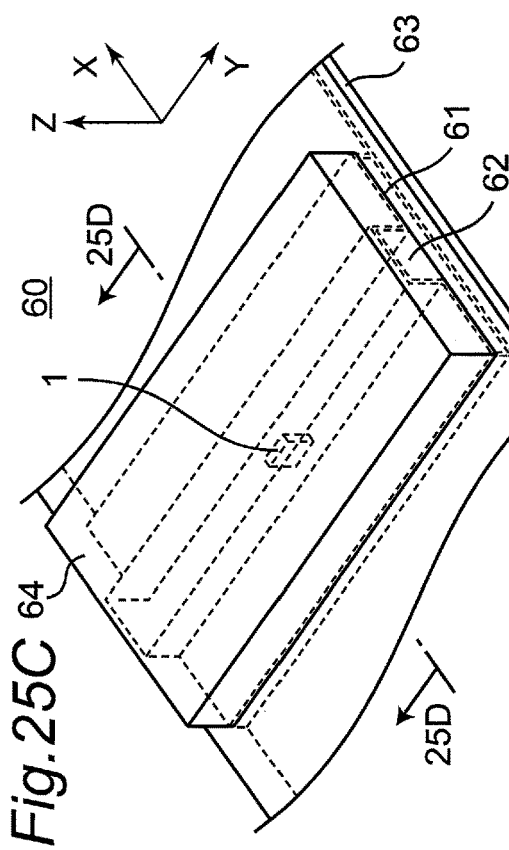
FIG. 25A is a schematic perspective view of a current detector according to a thirteenth embodiment.
Figure 25B:
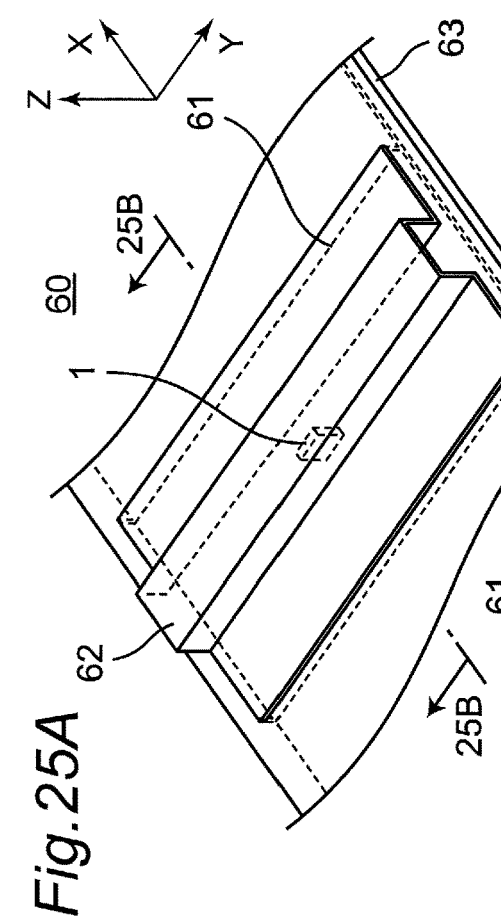
FIG. 25B is a cross-sectional view taken along the line 25B-25B of FIG. 25A.
Figure 25C:
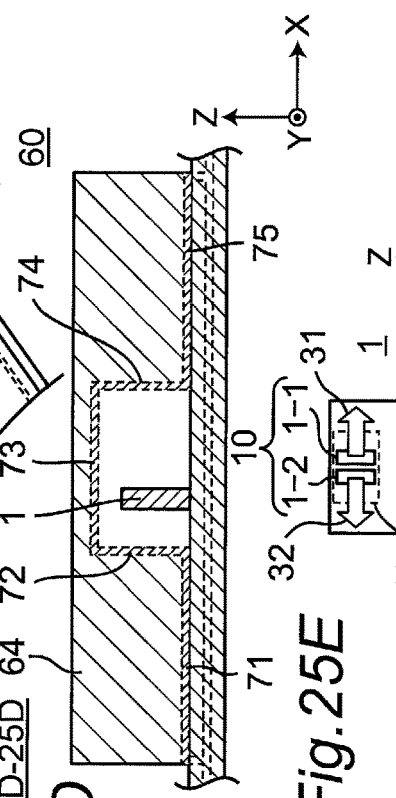
FIG. 25C is a schematic perspective view of the current detector with a current line covered with a resin molded body.
Figure 25D:
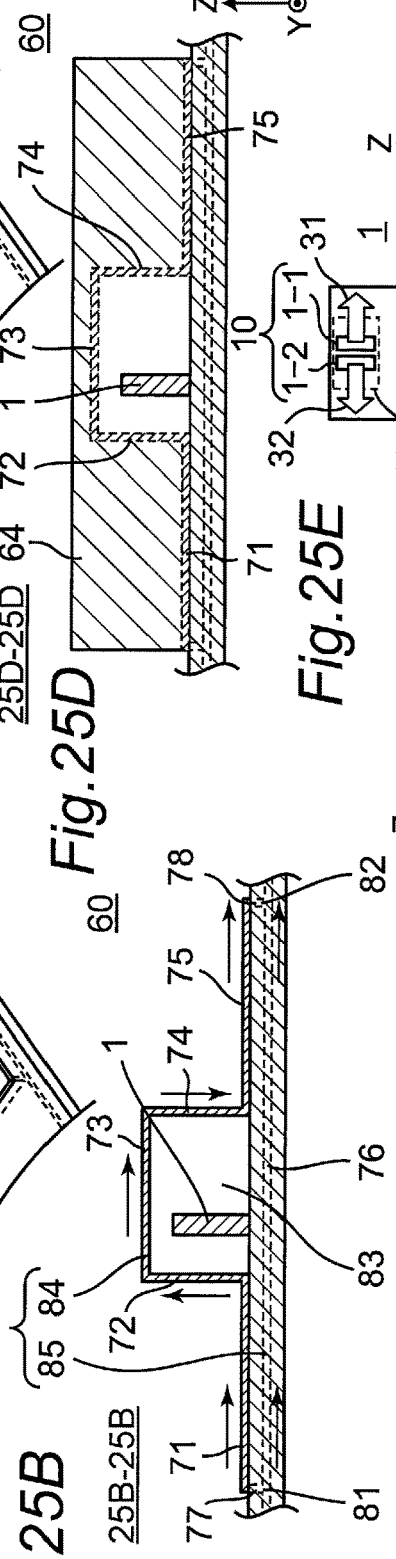
FIG. 25D is a cross-sectional view taken along the line 25D-25D of FIG. 25C.
Figure 25E:
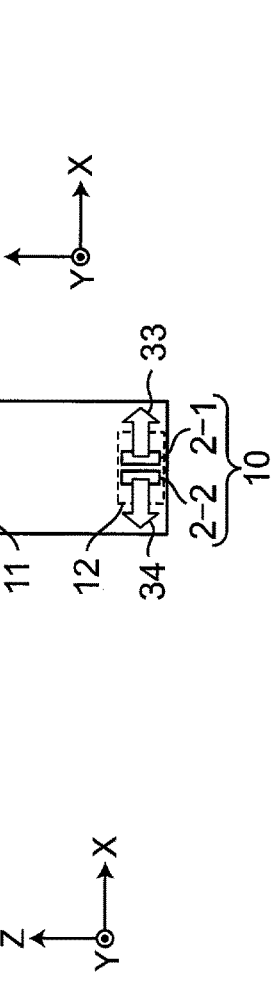
FIG. 25E is a schematic top view of the magnetic sensor 1 used in the current detector shown in FIGS. 25A to 25D.

FIG. 25A is a schematic perspective view of the current detector 60 in the thirteenth embodiment. FIG. 25B is a cross-sectional view taken along the line 25B-25B of FIG. 25A. FIG. 25C is a schematic perspective view of the current detector 60 with a current line 61 covered with a resin molded body 64. FIG. 25D is a cross-sectional view taken along the line 25D-25D of FIG. 25C. FIG. 25E is a schematic top view of the magnetic sensor 1 used in the current detector 60 shown in FIGS. 25A to 25D. In FIGS. 25A to 25E, the X direction is defined as the direction of the current flowing through the current line 61. Each of the magnetosensitive directions 31, 32, 33, and 34 of the elements 10 included in the magnetic sensor 1 is the Y direction or −Y direction, and the bias magnetic field direction is the X direction.

As shown in FIG. 25B, in the current detector 60 of the thirteenth embodiment, the current line 61 includes a first current path 84 that has a bypass part 62 formed in a U shape (inverted U shape with edges) and a linear second current path 85.

In the magnetic sensor 1 as shown in FIG. 25B, one (for example, first region 11) of the two regions included in the magnetic sensor 1 is disposed vertically relative to the second current path 85 and relatively near a second horizontal part 73 of the first current path 84, while the other (for example, second region 12) of the two regions is disposed farther away from the second horizontal part 73. The two regions (i.e., first region 11 and second region 12) have the gradient of the induced magnetic field formed by the current to be measured. Thus, by arranging the magnetic sensor 1 in any of the first to seventh embodiments as mentioned above, an output in proportion to the current to be measured can be obtained, while the disturbance magnetic field can be canceled at the same time.

Thus, even when measuring a large current, the induced magnetic field can be attenuated, thereby improving the measurement accuracy without saturating the elements 1-1, 1-2, 2-1, and 2-2.

An induction noise, such as a switching noise, can be suppressed as the magnetic sensor is enclosed by the current line 61.

As shown in FIGS. 25C and 25D, parts or all of the magnetic sensor 1 and the current line 61 may be integrated with the resin molded body and the like. In this way, parts or all of the magnetic sensor 1 and the current line 61 are integrated together by the resin molded body 64, thereby making it possible to attach the magnetic sensor 1 and current line 61 onto the current line 76 at the same time. Thus, a difference of the position accuracy can be reduced, and the workability of the attachment is improved. Note that referring to FIG. 25D, a gap between the magnetic sensor 1 and the bypass part may be filled with the resin molded body 64.

Fourteenth Embodiment

A current detector 60 according to a fourteenth embodiment will be described in detail below. Likewise, only parts different from those in the eighth to thirteenth embodiments will be described below, and a description of the same parts as those in the eighth to thirteenth embodiments will be omitted below.

In the current detectors 60 of the eighth to thirteenth embodiments, the first current path 84 and the second current path 85 are branched and merged in the side view, whereas in the current detector 60 of the fourteenth embodiment, the first current path 84 and the second current path 85 are branched and merged in the top view. The fourteenth embodiment differs from the eighth to thirteenth embodiments in this point.

FIG. 26A is a perspective view of the current detector 60 in the fourteenth embodiment. FIG. 26B is a side view of the current detector 60 in the fourteenth embodiment. FIG. 26C is a top view of the current detector 60 in the fourteenth embodiment. In FIGS. 26A to 26C, the X direction is defined as the direction of the current flowing through the current line 61. Each of the magnetosensitive directions 31, 32, 33, and 34 of the elements 10 included in the magnetic sensor 1 is the Z direction or −Z direction, and the bias magnetic field direction is the Y direction. As shown in FIGS. 26A to 26C, a void 83 for accommodating therein the magnetic sensor 1 is provided at the center of the current line 61 and between the branch position and the merging position. The longitudinal direction (X direction) of the void 83 is preferably aligned with the direction (X direction) of the current flowing through the current line 61 in the cross-sectional view of the XZ plane.

As shown in FIGS. 26A to 26C, the magnetic sensor 1 is disposed such that in the void 83, a normal line to the main surface of the magnetic sensor 1 is aligned with the direction (X direction) of the current flowing through the current line 61. Therefore, as shown in FIG. 26D, the magnetic sensor 1 is disposed within the void 83 in the ways mentioned below. Specifically, the magnetization directions 31, 32, 33, and 34 of the fixed layers in the elements 1-1, 1-2, 2-1, and 2-2 included in the magnetic sensor 1 are perpendicular to the direction of the current (X direction as shown in FIGS. 26A, 26B, and 26C) flowing through the current line 61. Furthermore, each of the magnetization directions 31 and 33 of the fixed layers of the elements 1-1 and 2-1 is the −Z direction, and each of the magnetization directions 32 and 34 of the fixed layers of the elements 1-2 and 2-2 is the Z direction.

In the current detector 61 according to the fourteenth embodiment in the present invention, the longitudinal direction (X direction) of the void 83 on the XZ cross-sectional view is substantially aligned with the direction (X direction) of the current flowing through the current line 61. Thus, the first current path 84 and the second current path 85 branched by the void 83 have substantially the same cross-sectional area. The first current path 84 and the second current path 85 preferably have substantially the same shape. In this way, the shape of the first current path 84 is substantially the same as that of the second current path 85, thereby improving the frequency characteristics at the measurement magnetic field received by the element. The magnetic fields received by the elements 11 and 12 have substantially the same strength in the opposite directions to each other, which can maximize the output from the magnetic sensor placed in between these elements.

The current detector 60 of the fourteenth embodiment in the present invention preferably have the current paths while the shape of the void 83 has any shape with parallel sides, specifically, a rectangle or a rectangle with rounded corners, a trapezoid, a diamond, a parallelogram, etc., in the top view. Preferably, the void 83 has the rectangular shape with rounded corners. When the shape in the top view of the void 83 is a rectangle with rounded corners, the resistance of current flowing through the current line 61 can be reduced.

Fifteenth Embodiment

A current detector 60 according to a fifteenth embodiment will be described in detail below. Likewise, only parts different from those in the fourteenth embodiment will be described below, and a description of the same parts as those in the fourteenth embodiment will be omitted below.

In the fourteenth embodiment, the void 83 is disposed at the center of the current line 61. On the other hand, in the fifteenth embodiment, the void 83 is disposed to be shifted from the center of the current line 61, and the fixed layers of the elements 1-1, 1-2, 2-1, and 2-2 have different magnetization directions. The fifteenth embodiment differs from the fourteenth embodiment in these points.

FIG. 27A is a top view of a current line 62 used in the current detector according to the fifteenth embodiment. FIG. 27B is a side view of the current line 61, and FIG. 27C is a perspective view of the current line 61. FIG. 27D is a schematic top view of the magnetic sensor 1 used with the current detector 61 shown in FIGS. 27A to 27C. FIG. 27E is a partial enlarged view of a void 83 of the current line 61 in which the magnetic sensor 1 is disposed in the current detector according to the fifteenth embodiment. In FIGS. 27A to 27E, the X direction is defined as the width direction of the current line 61, and the Y direction is defined as the longitudinal direction (direction in which the current flows). Each of the magnetosensitive directions 31, 32, 33, and 34 of the elements 10 is the X direction or –X direction, and the bias magnetic field direction is the Y direction.

As shown in FIGS. 27A and 27C, in the current detector 60 of the fifteenth embodiment, the current line 61 has a rectangular shape in the cross-sectional view and has a void 83 between a branch position 81 and a merging position 82 in the top view. The current line 61 is branched and divided into a first current path 84 and a second current path 85 by the void 83. As shown in FIG. 27E, the magnetic sensor 1 is disposed within the void 83 in the top view.

As mentioned above, the void 83 is disposed to be shifted from the center in the width direction of the current line 61. In this way, the void 83 is disposed to be shifted from the center in the width direction of the current line 61, whereby a magnetic field gradient occurs in the X direction within the void 83 in the top view, i.e., in the width direction of the current line 61.

As shown in FIG. 27D, the magnetic sensor 1 is disposed such that in the void 83, the direction of a normal line to the main surface of the magnetic sensor 1 is aligned with the direction of a normal line to the upper surface of the current line 61. Therefore, as shown in FIG. 27D, the magnetic sensor 1 is disposed within the void 83 in the ways described below. Specifically, the magnetization directions 31, 32, 33, and 34 of the fixed layers in the elements 1-1, 1-2, 2-1, and 2-2 included in the magnetic sensor 1 are in parallel with the transverse direction (X direction in FIGS. 27A and 27C) of the current line 61. In other words, each of the magnetization directions 31 and 33 of the fixed layers of the elements 1-1 and 2-1 is the X direction, and each of the magnetization directions 32 and 34 of the fixed layers of the elements 1-2 and 2-2 is the –X direction.

As shown in FIG. 27E, the magnetic sensor 1 is disposed to be shifted from the center line 1 of the void 83. When the width in the transverse direction of the current line 61 is 31 mm, and the width of the void 83 is 3 mm to 6 mm, the ratio of a deviation J to the width of the void 83 is preferably 0% to 100%, where J is a deviation between the center line m of the magnetic sensor 1 and the center line 1 of the void 83. This means the deviation is within the void. Furthermore, the ratio of the deviation J to the width of the void 83 is 50% or more to easily detect a difference in output, and further preferably 85% or less which decreases the error due to the frequency. The above-mentioned ratio can be represented by (distance from the center line of the void to the center part of the magnetic sensor)/(distance from the center line of the void to the end of the void (½ width of the void)).

When the width of the void 83 is 6 mm (i.e., the distance from the center line 1 to the end is 3 mm), and the distance between the first region 11 and the second region 12 of the magnetic sensor is 1 mm, the simulation shows that the deviation J between the center line m of the magnetic sensor 1 and the center line 1 of the void 83 is preferably in a range of 1.5 to 2.5 mm.

Thus, the magnetic sensor 1 in any of the first to seventh embodiments is arranged such that the magnetization direction of the corresponding fixed layer thereof is in parallel with the X direction. Consequently, an output in proportion to the current to be measured can be obtained, and the disturbance magnetic field can be canceled.

The magnetic field gradient is attenuated through the current flowing through a first branch part and a second branch part, which can improve the measurement accuracy without saturating the elements.

Figure 28:
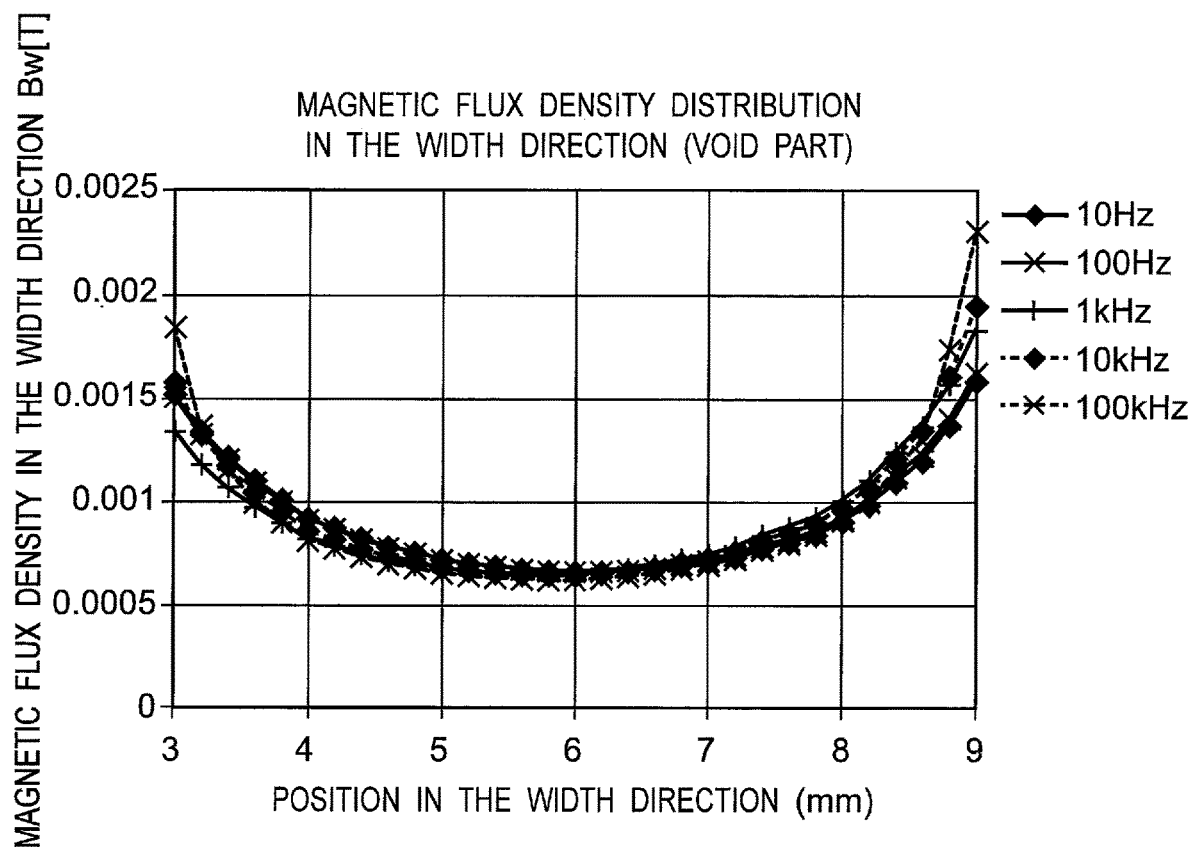
FIG. 28 is a graph showing the relationship between the position in a width direction of the void in the current line used in the fifteenth embodiment and the magnetic flux density therefrom.

FIG. 28 is a graph showing the relationship between the position in the void 83 shown in FIG. 27E described above and a magnetic flux density in the X direction. The measurement of the magnetic flux density is performed along a visual line extending in the X direction (solid line extending in the X direction illustrated in FIG. 28C) through an intermediate point of the dimension in the v direction of the void 83 (length of the void 83) and the center of the dimension in the Z direction of the current line 61 (thickness of the current line 61). In the graph of FIG. 28, the horizontal axis (position in the width direction) indicates a distance (mm) from the center axis (an alternate long and short dash line illustrated in FIG. 27A) extending in the longitudinal direction (Y direction) of the current line 61 to a measurement position. Note that the void 83 is formed in a range of 3 to 9 mm from the center axis in the longitudinal direction (Y direction) of the current line 61. That is, when a dimension in the X direction of the void 83 (width of the void 83) is 6 mm (9 mm–3 mm), the center axis in the longitudinal direction (Y direction) of the void 83 passes through the position ((3 mm+9 mm)/2) of 6 mm from the center axis in the longitudinal direction of the current line 61. The current line is energized with AC of 120 A at 10 Hz to 500 kHz.

As shown in FIG. 28, the magnetic field density is the lowest in a position of 6 mm in the width direction (i.e., the center axis extending in the Y direction of the void 83). When the position in the width direction deviates from 6 mm, the magnetic flux density is found to become high. That is, when the position in the width direction is in a range of less than 6 mm (a range of 3 mm to 6 mm), a magnetic field gradient occurs between different two points. Likewise, even when the position in the width direction is in a range of more than 6 mm (a range of 6 mm to 9 mm), a magnetic field gradient occurs between different two points. Even at different frequencies of the AC, the obtained graphs are substantially the same. That is, the magnetic field density within the void 83 varies a little depending on a change in the frequency of the AC. Thus, one amplification at the frequency needs only to be performed, thereby decreasing the number of amplifiers to be provided, which can have the effect of reducing errors.

Sixteenth Embodiment

A current detector 60 according to a sixteenth embodiment will be described in detail below. Likewise, only parts different from those in the tenth embodiment will be described below, and a description of the same parts as those in the tenth embodiment will be omitted below.

FIG. 29A is a schematic perspective view of the current detector 60 in the sixteenth embodiment. FIG. 29B is a cross-sectional view taken along the line 29B-29B in FIG. 29A. FIG. 29C is a schematic top view of the current detector 60 in the sixteenth embodiment. FIG. 29D is a schematic top view of the magnetic sensor 1 used in the current detector 60 shown in FIGS. 29A to 29C. FIG. 29E is a partially enlarged top view of the surroundings of a second void 95. Note that FIG. 29E does not show the magnetic sensor 1. In FIGS. 29A to 29C, the X direction is defined as the direction of the current flowing through the current line 61. Each of the magnetosensitive directions 31, 32, 33, and 34 of the elements 10 included in the magnetic sensor 1 is the X direction or −X direction, and the bias magnetic field direction is the Y direction.

In the sixteenth embodiment, the second current path 85 has a second branch merging part (second void 95). The second void 95 has sides 100 and 101 perpendicular to the direction of main current flowing through the second current path 85. Thus, part of the current flowing in the X direction is branched from the center (center axis r) of the vertical side 101 into two directions, namely, the −Y direction and Y direction. On the other hand, the currents are merged from the Y direction and −Y direction into the center of the side 100, and then the merged current flows again in the X direction. At this time, as shown in FIG. 29E, the respective two sets of current directions 96 and 97, and 98 and 99 are 180° rotational symmetry with the center axis r of the second void 95 centered. The induced magnetic fields generated by the two branched current directions are perpendicular to the respective currents and are in antiparallel with each other.

As shown in FIG. 29, the magnetic sensor 1 is disposed in a position other than the center in the Y direction of the second void 95 to straddle the second void 95 in the X direction. The first region 11 and the second region 12 of the magnetic sensor 1 are overlapped with currents 98 and 99 that flow while being symmetric with respect to the second void 95.

The magnetization directions 31, 32, 33, and 34 of the fixed layers are perpendicular to the current direction 98 or 99 (Y direction or −Y direction).

The magnetic sensor 1 is arranged in this way, so that an output in proportion to the current to be measured can be obtained, and the disturbance magnetic field can be canceled at the same time. The measurement accuracy can be improved without saturating the elements 1-1, 1-2, 2-1, and 2-2.

Here, without the first current path 84, the disturbance magnetic field can be canceled. However, the provision of the first current path 84 can improve the attenuation effect.

Seventeenth Embodiment

A current detector 60 according to a seventeenth embodiment will be described in detail below. Likewise, only parts different from those in the tenth embodiment will be described below, and a description of the same parts as those in the tenth embodiment will be omitted below.

FIG. 30A is a schematic perspective view of the current detector 60 according to the seventeenth embodiment. FIG. 30B is a cross-sectional view taken along the line 30B-30B of FIG. 30A. FIG. 30C is a schematic top view of the current detector 60 in the seventeenth embodiment. FIG. 30D is a schematic top view of the magnetic sensor 1 used in the current detector 60 shown in FIGS. 30A to 30C. FIG. 30E is a schematic top view of the magnetic sensor 1 mold-packaged with resin; FIG. 30F is a schematic cross-sectional view taken along the line 30F-30F of FIG. 30E; and in FIGS. 30A to 30F, the X direction is defined as the direction of the current flowing through the current line 61. Each of the magnetosensitive directions 31, 32, 33, and 34 of the elements 10 included in the magnetic sensor 1 is the X direction or −X direction, and the bias magnetic field direction is the Y direction.

In the seventeenth embodiment, the second current path 85 has a cutout part 120. The cutout part 120 has two sides 100 and 101 perpendicular to the direction of the main current flowing through the second current path 85. These sides are in parallel with each other and have two current directions 96 and 97 that are 180° rotational symmetry with the respective two sides 100 and 101 in the top view. The induced magnetic fields generated by the two current directions are perpendicular to the respective currents and are in antiparallel with each other.

As shown in FIG. 30, the magnetic sensor 1 is disposed in parallel with the two sides 100 and 101 perpendicular to the direction of the main current flowing through the second current path 85 such that the center of a gap between the two sides 100 and 101 is aligned with the center of the sensor.

The magnetization directions 31, 32, 33, and 34 of the fixed layers are perpendicular to the two current directions 96 and 97 (Y direction or −Y direction).

As shown in FIG. 30C, one of the two regions (for example, first region 11) included in the magnetic sensor 1 is disposed such that the cutout part 120 is disposed in a position A close to one of the two sides 100 and 101 perpendicular to the direction of the main current flowing through the second current path 85. Furthermore, the other region (for example, second region 12) is disposed in a position B close to the other of the two sides 100 and 101. The two regions (i.e., first region 11 and second region 12) included in the magnetic sensor 1 have the gradient of the induced magnetic field formed by the current to be measured. Thus, by arranging the magnetic sensor 1 in any of the first to seventh embodiments as mentioned above, an output in proportion to the current to be measured can be obtained, while the disturbance magnetic field can be canceled at the same time.

An induction noise, such as a switching noise, can be suppressed as the magnetic sensor is enclosed by the current line 61.

Parts or all of the magnetic sensor 1 and the current line 61 may be integrated with the resin molded body 64 and the like. In this way, parts or all of the magnetic sensor 1 and the current line 61 are integrated together by the resin molded body, which improves the workability of attachment, while making it possible to reduce a difference in the positional accuracy.

Here, without the first current path 84, the disturbance magnetic field can be canceled. However, the provision of the first current path 84 can improve the attenuation effect.

In the magnetic sensor 1 of the seventeenth embodiment, as shown in FIGS. 30E and 30F, the two regions, namely, the first region and the second region are divided into two chips, but these regions may configure one chip described above. Note that the elements and coils in the two chips are deposited simultaneously. The two chips are packaged into one by resin molding and the like. However, the two chips may not be packaged into one as long as they are fixed. The sensor uses the two chips to operate the bridge circuit, whereby the magnetic field gradient can be highly sensed by spacing the two chips apart from each other, thereby increasing a differential output from the bridge circuit without increasing the size of the chip.

Example 1

<Difference in Output Offset>

Figure 31:
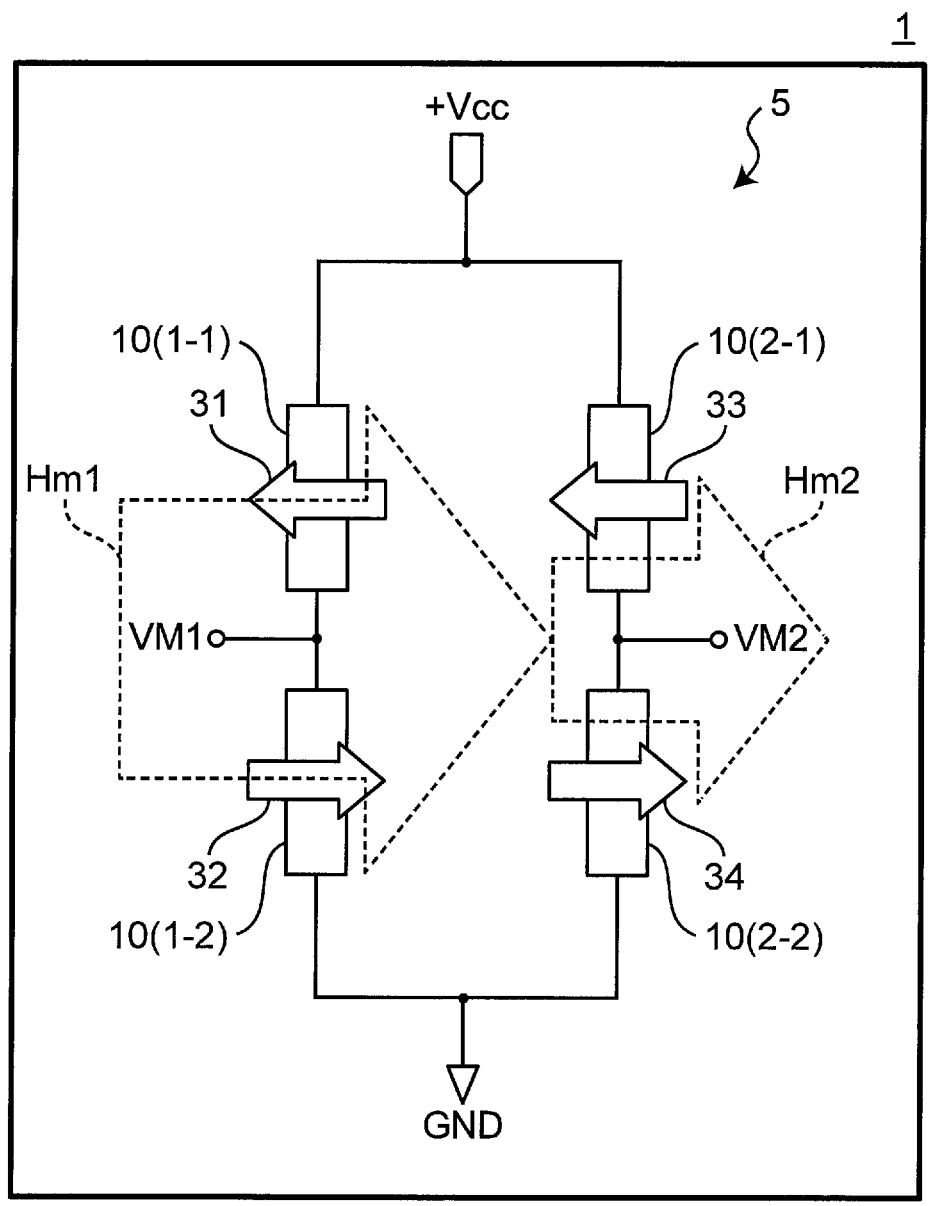
FIG. 31 is a schematic circuit diagram of a magnetic sensor according to Example.

A magnetic sensor 1 according to the present invention was fabricated, and its characteristics were evaluated as follows. FIG. 31 is a schematic diagram of the magnetic sensor 1 according to Example. The magnetic sensor 1 had the bridge circuit 5 including four elements 1-1, 1-2, 2-1, and 2-2. FIG. 31 shows the relationship between the application directions of the measurement magnetic fields Hm1 and Hm2 and the magnetosensitive directions of the elements 1-1, 1-2, 2-1, and 2-2.

A magnetic sensor in Comparative Example included a bridge circuit 5 similar to the magnetic sensor 1 in Example, but differs from Example in the magnetosensitive direction of the element. Specifically, the elements 1-1 and 2-1 connected to the power terminal (Vcc) of the bridge circuit 5 had their magnetosensitive directions oriented in antiparallel with each other, while the elements 1-2 and 2-2 connected to the ground terminal (GND) had their magnetosensitive directions oriented in antiparallel with each other. Furthermore, the magnetosensitive direction of the element 1-1 was the same as that of the element 2-2, while the magnetosensitive direction of the element 2-1 was the same as that of the element 1-2.

In the magnetic sensors 1 of Example and the comparative example, the substrate 1, the elements 1-1, 1-2, 2-1, and 2-2, and the bias coil 3 were arranged as shown in FIG. 17C. The specific laminated structure within the magnetic sensor 1 were set as shown in FIG. 19.

Figure 32A:
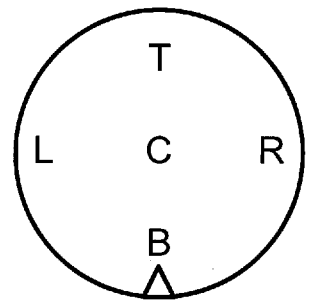
FIG. 32A is a top view of a silicon wafer for explaining measurement points for measuring outputs from a magnetic sensor in Example 1.
Figure 32B:
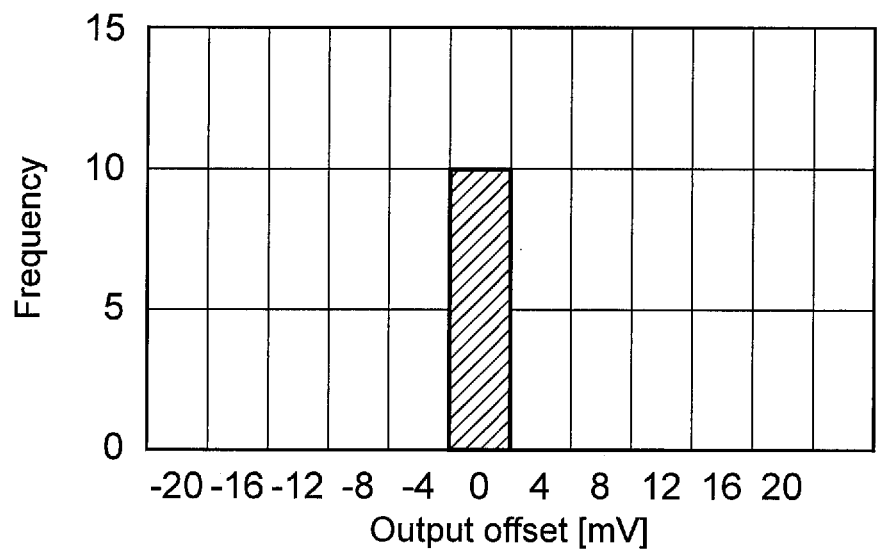
FIG. 32B is a bar graph showing the result of measurement of the output from the magnetic sensor in Example.
Figure 32C:
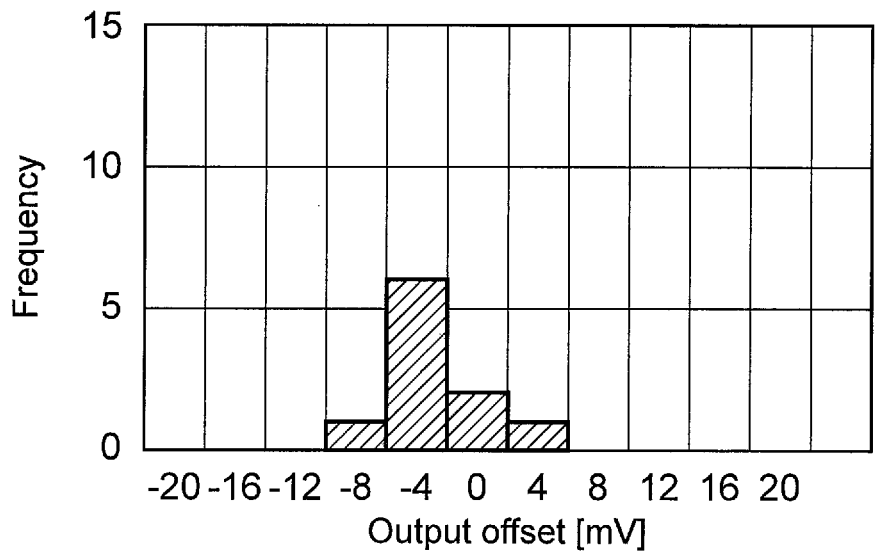
FIG. 32C is a bar graph showing the result of measurement of the output from a magnetic sensor in Comparative Example.

In the magnetic sensor 1 shown in FIG. 31, a voltage of 5V was applied between the power terminal (Vcc) and the ground terminal (GND) in the bridge circuit 5, and current was allowed to flow such that a bias magnetic field of the bias coil was 10 mT. A differential output (VM1-VM2 as shown in FIG. 31), measured with no measurement magnetic field applied (measurement magnetic field set at 0 mT), was measured as an "output offset". Two disk-shaped silicon wafers were prepared as the substrate 2, and the magnetic sensor 1 was formed on each silicon wafer. As illustrated in FIG. 32A, the measurement was conducted at 5 sites of the silicon wafer (point T, point C, point B, point L, and point R). The measurement results of the magnetic sensor in Example are shown in FIG. 32B. The measurement results of the magnetic sensor in the comparative example are shown in FIG. 32C. In the magnetic sensor of Example as shown in FIG. 32B, a difference in the offset of the output was small. Thus, the output from the magnetic sensor does not need correction, or simple correction is necessary only. In other words, a complicated device for correction of the output is not needed, thereby making it possible to reduce the manufacturing cost of the magnetic sensor.

Example 2

<Offset Drift of Output Depending on Environmental Temperature>

Figure 33A:
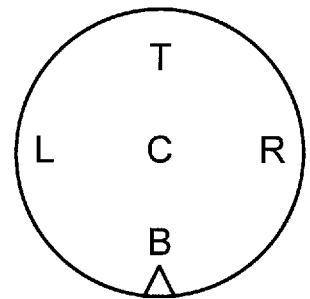
FIG. 33A is a top view of a silicon wafer for explaining measurement points for measuring outputs from a magnetic sensor in Example 2.
Figure 33B:
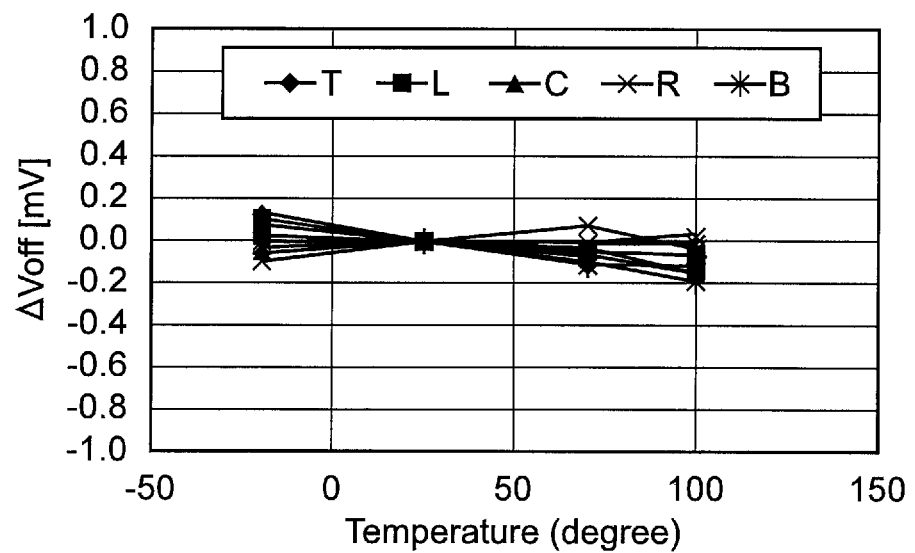
FIG. 33B is a graph showing an offset drift of the output from the magnetic sensor in Example.
Figure 33C:
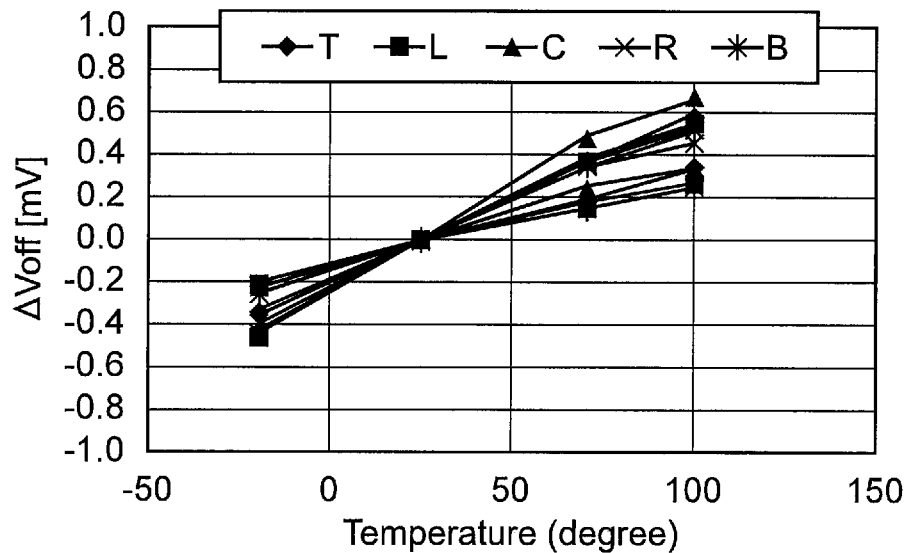
FIG. 33C is a graph showing an offset drift of the output from the magnetic sensor in Comparative Example.

The magnetic sensor 1 as an inventive example fabricated in Example 1 and the magnetic sensor as the comparative example were used to measure offset drifts of outputs from these magnetic sensors by changing the environmental temperature from −20° C. to 100° C. As illustrated in FIG. 33A, the measurement was conducted at 5 sites of the silicone wafer (point T, point C, point B, point L, and point R). The measurement results are shown in FIGS. 33B and 33C. As shown in FIGS. 33B and 33C, the magnetic sensor 1 in Example had a small offset drift (ΔVoff) of its output (which was within ±0.25 mV). Thus, the output from the magnetic sensor does not need correction, or simple correction is necessary only. In other words, a complicated device for correction of the output is not needed, thereby making it possible to reduce the manufacturing cost of the magnetic sensor.

Example 3

<Changes in Output Characteristics Depending on Environmental Temperature>

Figure 34A:
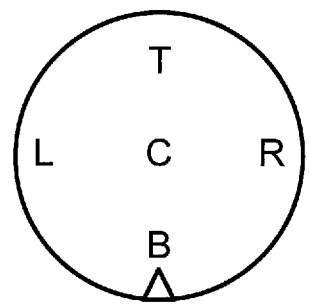
FIG. 34A is a top view of a silicon wafer for explaining measurement points for measuring outputs from a magnetic sensor in Example 3.
Figure 34B:
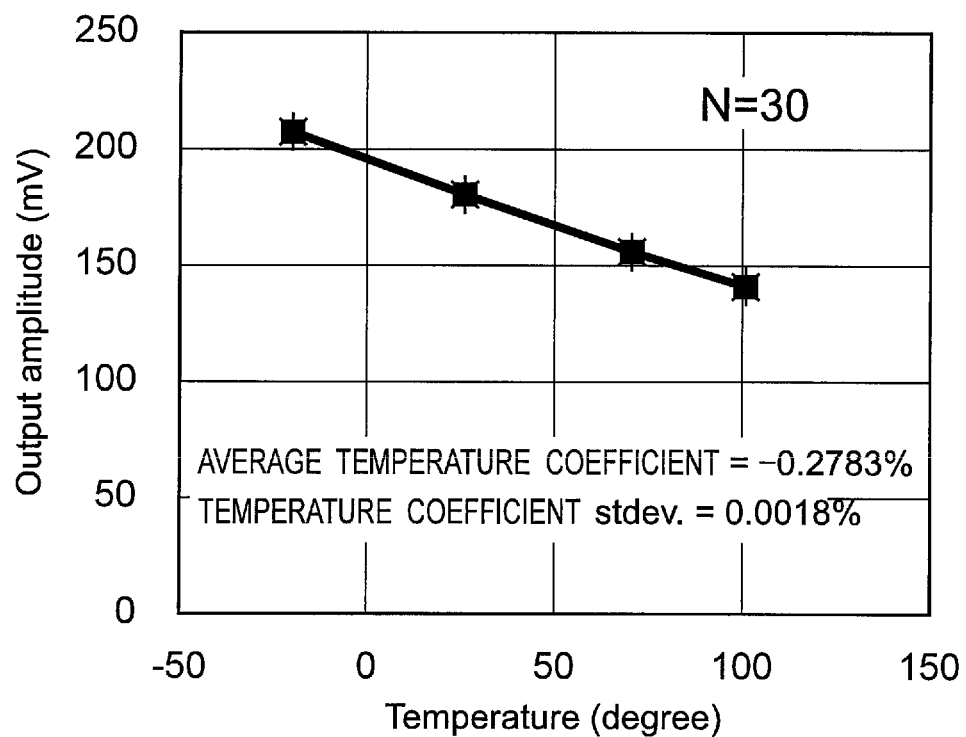
FIG. 34B is a graph showing the result of measurement of the output from the magnetic sensor in Example.

In the magnetic sensor 1 shown in FIG. 31, a voltage of 5V was applied between the power terminal (Vcc) and the ground terminal (GND) in the bridge circuit 5, and current was allowed to flow such that a bias magnetic field of the bias coil was 10 mT. A differential output at a measurement magnetic field of 3 mT (a difference between an output potential from a first output terminal VM1 and an output potential from a second output terminal VM2 as shown in FIG. 31) was measured as an "output". Six circular silicon wafers were prepared as the substrate 2, and the magnetic sensor 1 was formed on each silicon wafer. As illustrated in FIG. 34A, the measurement was conducted at 5 sites of the silicon wafer (point T, point C, point B, point L, and point R) by causing 10 mA of bias current to pass through the bias coil. The measurement results of the magnetic sensor are shown in FIG. 34B. As shown in FIG. 34B, in the magnetic sensor, a difference in the output therefrom was small. Thus, the output from the magnetic sensor does not need correction, or simple correction is necessary only. In other words, a complicated device for correction of the output is not needed, thereby making it possible to reduce the manufacturing cost of the magnetic sensor.

Example 4

<Correction Items Due to Environmental Temperature>

FIG. 35 collectively shows the correction items for various sensors (for example, a current sensor, a magnetic field strength sensor, and the like) fabricated using the magnetic sensor 1 shown in FIG. 31. Here, the term "various sensors" means a module that employs the magnetic sensor as one component.

In an example shown in FIG. 35, any of an output amplitude and an output offset need correction at normal temperature. However, regarding either the output amplitude or output offset, correction at a high temperature and a low temperature are not necessary. Thus, a correction value determined in the correction at the normal temperature can be applied under a high temperature and a low temperature, and thereby no correction is further necessary for the high and low temperatures.

FIG. 36A is a flow diagram for explaining output correction for a magnetic sensor which belongs to various sensors (for example, a current sensor, a magnetic field strength sensor, and the like) using the magnetic sensor in the comparative example. FIG. 36B is a flow diagram for explaining output correction for a magnetic sensor which belongs to various sensors using the magnetic sensor 1 in Example.

As shown in the flow diagram of FIG. 36A, in various sensors using the magnetic sensor in the comparative example, the output correction for the magnetic sensor at a high temperature and a low temperature is performed in step S11, followed by execution of a process in step S12. Then, in step S13, the output correction for the magnetic sensor at normal temperature is performed.

In contrast, as shown in the flow diagram of FIG. 36B, in various sensors using the magnetic sensor in the comparative example, the output correction for the magnetic sensor is not performed in step S21, followed by execution of a process in step S22. Then, in step S23, the output correction for the magnetic sensor at normal temperature is performed. In this way, various sensors using the magnetic sensor in Example can decrease the number of repetition of the output correction for the magnetic sensor. Therefore, an increase in the manufacturing cost accompanied by the output correction can be suppressed.

DESCRIPTION OF REFERENCE NUMERALS

1: Magnetic sensor
2: Substrate
3: Bias coil
5: Bridge circuit
1-1, 1-2, 2-1, 2-2: Magnetoresistive effect element (element)

The invention claimed is:

1. A magnetic sensor comprising:
a substrate with a main surface;
at least two magnetoresistive effect elements formed on the main surface and connected to a power terminal of a bridge circuit;
at least two magnetoresistive effect elements formed on the main surface and connected to a ground terminal of the bridge circuit;
a first region in which one of the at least two magnetoresistive effect elements connected to the power terminal and one of the at least two magnetoresistive effect elements connected to the ground terminal are disposed;
a second region in which another of the at least two magnetoresistive effect elements connected to the power terminal and another of the at least two magnetoresistive effect elements connected to the ground terminal are disposed; and
a bias coil including a first bias application part for applying a bias magnetic field to the first region and a second bias application part for applying a bias magnetic field to the second region, wherein
magnetosensitive directions of the two magnetoresistive effect elements connected to the power terminal are the same,
magnetosensitive directions of the two magnetoresistive effect elements connected to the ground terminal are the same,
a difference between a cross-sectional area of the first bias application part and a cross-sectional area of the second bias application part is 35.4% or less,
the two magnetoresistive effect elements disposed in the first region are connected in series,
the two magnetoresistive effect elements disposed in the second region are connected in series,
magnetosensitive directions of the two magnetoresistive effect elements formed in the first region are opposite to each other, and
magnetosensitive directions of the two magnetoresistive effect elements formed in the second region are opposite to each other.

2. The magnetic sensor according to claim 1, wherein a difference between a thickness of the first bias application part and a thickness of the second bias application part is 17.7% or less.

3. The magnetic sensor according to claim 1, wherein a difference between a distance from the magnetoresistive effect element in the first region to the first bias application part and a distance from the magnetoresistive effect element in the second region to the second bias application part is 5.78% or less.

4. The magnetic sensor according to claim 1, wherein a difference in thickness between at least two magnetoresistive effect elements connected to the power terminal is 3.0% or less, and
a difference in thickness between at least two magnetoresistive effect elements connected to the ground terminal is 3.0% or less.

5. The magnetic sensor according to claim 4, wherein a difference between a thickness of the at least two magnetoresistive effect elements connected to the power terminal and a thickness of the at least two magnetoresistive effect elements connected to the ground terminal is 3.0% or less.

6. The magnetic sensor according to claim 1, wherein a difference between a thickness of the first bias application part and a thickness of the second bias application part is 3.0% or less.

7. The magnetic sensor according to claim 1, wherein the bias coil further includes a bias coil bypass part, and
a cross-sectional area of the bias coil bypass part is larger than each of cross-sectional areas of the first and second bias application parts.

8. The magnetic sensor according to claim 1, wherein the magnetic sensor further includes a feedback circuit, and
the feedback circuit is configured to generate a feedback magnetic field based on a magnetic field strength detected by the magnetoresistive effect element, the feedback magnetic field being adapted to offset the detected magnetic field strength.

9. A current detector comprising:
a current line including a void between a branch position and a merging position, and a first current path and a second current path separated from each other by the void; and
the magnetic sensor according to claim 1, provided in the void.

10. The current detector according to claim 9, wherein the magnetic sensor is disposed within the void such that the magnetosensitive direction of a fixed layer of the magnetoresistive effect element in the magnetic sensor is perpendicular to current directions in the first current path and the second current path.

11. The current detector according to claim 9, further comprising a current line including a bypass part formed to bypass the magnetic sensor.

12. The current detector according to claim 9, wherein a substrate of the magnetic sensor includes a first substrate having a first region and a second substrate having a second region, wherein the first substrate is separated from the second substrate.

13. A method for manufacturing a magnetic sensor, comprising:
preparing a substrate with a main surface;
forming a bridge circuit including, on the main surface, a power terminal, a ground terminal, at least two magnetoresistive effect elements connected to the power terminal, and at least two magnetoresistive effect elements connected to the ground terminal; and
forming a bias coil including a first bias application part for applying a bias to a first region and a second bias application part for applying a bias magnetic field to a second region, the first region being provided with one of the at least two magnetoresistive effect elements connected to the power terminal and one of the at least two magnetoresistive effect elements connected to the ground terminal, the second region having been provided with another of the at least two magnetoresistive effect elements connected to the power terminal and another of the at least two magnetoresistive effect elements connected to the ground terminal, wherein the step of forming the bridge circuit includes:

simultaneously forming the at least two magnetoresistive effect elements connected to the power terminal; and simultaneously forming the at least two magnetoresistive effect elements connected to the ground terminal; and wherein the two magnetoresistive effect elements disposed in the first region are connected in series, the two magnetoresistive effect elements disposed in the second region are connected in series, magnetosensitive directions of the two magnetoresistive effect elements formed in the first region are opposite to each other, and magnetosensitive directions of the two magnetoresistive effect elements formed in the second region are opposite to each other.

14. The manufacturing method according to claim 13, wherein the step of forming the bridge circuit includes:

simultaneously forming the at least two magnetoresistive effect elements connected to the power terminal and the at least two magnetoresistive effect elements connected to the ground terminal.

15. The manufacturing method according to claim 13, wherein the first bias application part and the second bias application part are simultaneously formed.

16. A magnetic sensor comprising:

a substrate with a main surface;

at least two magnetoresistive effect elements formed on the main surface and connected to a power terminal of a bridge circuit;

at least two magnetoresistive effect elements formed on the main surface and connected to a ground terminal of the bridge circuit;

a first region in which one of the at least two magnetoresistive effect elements connected to the power terminal and one of the at least two magnetoresistive effect elements connected to the ground terminal are disposed;

a second region in which another of the at least two magnetoresistive effect elements connected to the power terminal and another of the at least two magnetoresistive effect elements connected to the ground terminal are disposed; and a bias coil including a first bias application part for applying a bias magnetic field to the first region and a second bias application part for applying a bias magnetic field to the second region, wherein magnetosensitive directions of the two magnetoresistive effect elements connected to the power terminal are the same, magnetosensitive directions of the two magnetoresistive effect elements connected to the ground terminal are the same, a difference between a cross-sectional area of the first bias application part and a cross-sectional area of the second bias application part is 35.4% or less, the bias coil further includes a bias coil bypass part, and a cross-sectional area of the bias coil bypass part is larger than each of cross-sectional areas of the first and second bias application parts.

17. A current detector comprising:

a current line including a void between a branch position and a merging position, and a first current path and a second current path separated from each other by the void; and the magnetic sensor according to claim 16, provided in the void.

18. A method for manufacturing a magnetic sensor, comprising:

preparing a substrate with a main surface;

forming a bridge circuit including, on the main surface, a power terminal, a ground terminal, at least two magnetoresistive effect elements connected to the power terminal, and at least two magnetoresistive effect elements connected to the ground terminal; and forming a bias coil including a first bias application part for applying a bias to a first region and a second bias application part for applying a bias magnetic field to a second region, the first region being provided with one of the at least two magnetoresistive effect elements connected to the power terminal and one of the at least two magnetoresistive effect elements connected to the ground terminal, the second region having been provided with another of the at least two magnetoresistive effect elements connected to the power terminal and another of the at least two magnetoresistive effect elements connected to the ground terminal, wherein the step of forming the bridge circuit includes:

simultaneously forming the at least two magnetoresistive effect elements connected to the power terminal; and simultaneously forming the at least two magnetoresistive effect elements connected to the ground terminal;

wherein the bias coil further includes a bias coil bypass part, and a cross-sectional area of the bias coil bypass part is larger than each of cross-sectional areas of the first and second bias application parts.

\* \* \* \* \*